(12) United States Patent
Heuft et al.

(10) Patent No.: US 8,389,060 B2
(45) Date of Patent: *Mar. 5, 2013

(54) PROCESS FOR PREPARING STRUCTURED ORGANIC FILMS (SOFS) VIA A PRE-SOF

(75) Inventors: Matthew A. Heuft, Oakville (CA); Adrien Pierre Cote, Clarkson (CA); Gregory M. McGuire, Oakville (CA); Yvan Gagnon, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 423 days.

This patent is subject to a terminal disclaimer.

(21) Appl. No.: 12/716,686

(22) Filed: Mar. 3, 2010

(65) Prior Publication Data
US 2010/0227071 A1  Sep. 9, 2010

Related U.S. Application Data

(60) Provisional application No. 61/157,411, filed on Mar. 4, 2009.

(51) Int. Cl.
*B05D 3/02* (2006.01)
(52) U.S. Cl. .......................... 427/384; 427/508; 427/521
(58) Field of Classification Search .................. 427/384, 427/508, 521
See application file for complete search history.

(56) References Cited

U.S. PATENT DOCUMENTS

| | | | |
|---|---|---|---|
| 2,324,550 A | 7/1943 | Wolfe | |
| 3,430,418 A | 3/1969 | Wagner | |
| 3,801,315 A | 4/1974 | Gundlach et al. | |
| 4,078,927 A | 3/1978 | Amidon et al. | |
| 4,081,274 A | 3/1978 | Horgan | |
| 4,115,116 A | 9/1978 | Stolka et al. | |
| 4,233,384 A | 11/1980 | Turner et al. | |
| 4,257,699 A | 3/1981 | Lentz | |
| 4,265,990 A | 5/1981 | Stolka et al. | |
| 4,286,033 A | 8/1981 | Neyhart et al. | |
| 4,291,110 A | 9/1981 | Lee | |
| 4,299,897 A | 11/1981 | Stolka et al. | |
| 4,304,829 A | 12/1981 | Limburg et al. | |
| 4,306,008 A | 12/1981 | Pai et al. | |
| 4,338,387 A | 7/1982 | Hewitt | |
| 4,387,980 A | 6/1983 | Ueno et al. | |
| 4,457,994 A | 7/1984 | Pai et al. | |
| 4,464,450 A | 8/1984 | Teuscher | |
| 4,489,593 A | 12/1984 | Pieters et al. | |
| 4,493,550 A | 1/1985 | Takekida | |
| 4,664,995 A | 5/1987 | Horgan et al. | |
| 4,855,203 A | 8/1989 | Badesha et al. | |
| 4,871,634 A | 10/1989 | Limburg et al. | |
| 4,917,711 A | 4/1990 | Xie et al. | |

(Continued)

FOREIGN PATENT DOCUMENTS

| DE | 10 2008 011 840 A1 | 9/2009 |
|---|---|---|
| EP | 0312376 A2 | 4/1989 |

(Continued)

OTHER PUBLICATIONS

Shun Wan et al., "A Belt-Shaped, Blue Luminescent, and Semiconducting Covalent Organic Framework," Angew. Chem. Int. Ed., vol. 47, pp. 8826-8830 (published on web Jan. 10, 2008).

(Continued)

*Primary Examiner* — Robert S Walters, Jr.
(74) *Attorney, Agent, or Firm* — Oliff & Berridge, PLC

(57) ABSTRACT

A processes for preparing structured organic film (SOF) comprising a plurality of segments and a plurality of linkers arranged as a covalent organic framework, wherein the structured organic film may be a multi-segment thick structured organic film by reaction of a pre-SOF.

24 Claims, 22 Drawing Sheets

U.S. PATENT DOCUMENTS

| | | |
|---|---|---|
| 4,921,769 A | 5/1990 | Yuh et al. |
| 4,921,773 A | 5/1990 | Melnyk et al. |
| 5,017,432 A | 5/1991 | Eddy et al. |
| 5,061,965 A | 10/1991 | Ferguson et al. |
| 5,110,693 A | 5/1992 | Friend et al. |
| 5,139,910 A | 8/1992 | Law et al. |
| 5,165,909 A | 11/1992 | Tennent et al. |
| 5,166,031 A | 11/1992 | Badesha et al. |
| 5,281,506 A | 1/1994 | Badesha et al. |
| 5,300,271 A | 4/1994 | Golden et al. |
| 5,366,772 A | 11/1994 | Badesha et al. |
| 5,368,913 A | 11/1994 | Ortega |
| 5,368,967 A | 11/1994 | Schank et al. |
| 5,370,931 A | 12/1994 | Fratangelo et al. |
| 5,432,539 A | 7/1995 | Anderson |
| 5,455,136 A | 10/1995 | Yu et al. |
| 5,456,897 A | 10/1995 | Moy et al. |
| 5,500,200 A | 3/1996 | Mandeville et al. |
| 5,569,635 A | 10/1996 | Moy et al. |
| 5,658,702 A | 8/1997 | Nukada |
| 5,702,854 A | 12/1997 | Schank et al. |
| 5,707,916 A | 1/1998 | Snyder et al. |
| 5,853,906 A | 12/1998 | Hsieh |
| 5,877,110 A | 3/1999 | Snyder et al. |
| 5,976,744 A | 11/1999 | Fuller et al. |
| 6,002,907 A | 12/1999 | Berkes |
| 6,020,426 A | 2/2000 | Yamaguchi et al. |
| 6,107,117 A | 8/2000 | Bao et al. |
| 6,107,439 A | 8/2000 | Yanus et al. |
| 6,248,686 B1 | 6/2001 | Inagaki et al. |
| 6,340,382 B1 | 1/2002 | Baksh et al. |
| 6,464,756 B1 | 10/2002 | Plee |
| 6,505,921 B2 | 1/2003 | Chwalek et al. |
| 6,819,224 B2 | 11/2004 | Brierley |
| 6,819,244 B2 | 11/2004 | Dukler et al. |
| 7,067,687 B2 | 6/2006 | Pinnavaia et al. |
| 7,177,572 B2 | 2/2007 | DiRubio et al. |
| 7,196,210 B2 | 3/2007 | Yaghi et al. |
| 7,202,002 B2 | 4/2007 | Tokarski et al. |
| 7,384,717 B2 | 6/2008 | Dinh et al. |
| 7,416,824 B2 | 8/2008 | Kondoh et al. |
| 7,582,798 B2 | 9/2009 | Yaghi et al. |
| 8,065,904 B1 | 11/2011 | Allendorf et al. |
| 8,093,347 B2 | 1/2012 | Heuft et al. |
| 8,119,314 B1 | 2/2012 | Heuft et al. |
| 8,119,315 B1 | 2/2012 | Heuft et al. |
| 2002/0098346 A1 | 7/2002 | Yitzchaik |
| 2003/0099845 A1 | 5/2003 | Ogawa et al. |
| 2003/0126989 A1 | 7/2003 | Bancon et al. |
| 2003/0172808 A1 | 9/2003 | Le Bec |
| 2004/0171482 A1 | 9/2004 | Pinnavaia et al. |
| 2004/0244865 A1 | 12/2004 | Jung et al. |
| 2005/0017633 A1 | 1/2005 | Miyadera |
| 2005/0257685 A1 | 11/2005 | Baksh et al. |
| 2005/0260443 A1 | 11/2005 | Marks et al. |
| 2006/0046169 A1 | 3/2006 | Shoshi |
| 2006/0097393 A1 | 5/2006 | Uchimaru et al. |
| 2006/0154807 A1 | 7/2006 | Yaghi et al. |
| 2006/0182993 A1 | 8/2006 | Ogata et al. |
| 2006/0204742 A1 | 9/2006 | Gronbeck et al. |
| 2006/0236862 A1 | 10/2006 | Golden et al. |
| 2007/0123606 A1 | 5/2007 | Toma et al. |
| 2007/0287220 A1 | 12/2007 | Jeong et al. |
| 2008/0107980 A1 | 5/2008 | De Jong et al. |
| 2008/0132669 A1 | 6/2008 | Eriguchi et al. |
| 2008/0233343 A1 | 9/2008 | Cheng et al. |
| 2008/0268135 A1 | 10/2008 | Yokoyama et al. |
| 2008/0316247 A1 | 12/2008 | Cellura et al. |
| 2009/0025555 A1 | 1/2009 | Lively et al. |
| 2009/0046125 A1 | 2/2009 | Nystrom et al. |
| 2009/0053417 A1 | 2/2009 | Mino |
| 2009/0117476 A1 | 5/2009 | Heuft et al. |
| 2009/0149565 A1 | 6/2009 | Liu et al. |
| 2010/0015540 A1 | 1/2010 | Dinh et al. |
| 2010/0143693 A1 | 6/2010 | Yaghi et al. |
| 2010/0227071 A1 | 9/2010 | Heuft et al. |
| 2010/0227998 A1 | 9/2010 | Heuft et al. |
| 2010/0240781 A1 | 9/2010 | Cooper et al. |
| 2011/0011128 A1 | 1/2011 | Grover |
| 2011/0030555 A1 | 2/2011 | Jonschker et al. |
| 2011/0076605 A1 | 3/2011 | Doi et al. |
| 2011/0236301 A1 | 9/2011 | Kang et al. |
| 2012/0029236 A1 | 2/2012 | Cote et al. |
| 2012/0031268 A1 | 2/2012 | Yaghi et al. |
| 2012/0152117 A1 | 6/2012 | Lively et al. |

FOREIGN PATENT DOCUMENTS

| | | |
|---|---|---|
| JP | 9 087849 A | 3/1997 |
| KR | 10-0832309 B1 | 5/2008 |
| WO | WO 91/15813 | 10/1991 |
| WO | WO 2006/064892 A1 | 6/2006 |
| WO | WO 2007/090864 A1 | 8/2007 |
| WO | WO 2007/098263 A2 | 8/2007 |
| WO | WO2008/091976 A1 | 7/2008 |
| WO | WO 2009/022187 A1 | 2/2009 |
| WO | WO 2009/127896 A1 | 10/2009 |
| WO | WO 2010/102018 A1 | 9/2010 |
| WO | WO 2010/102025 A1 | 9/2010 |
| WO | WO 2010/102027 A1 | 9/2010 |
| WO | WO 2010/102036 A1 | 9/2010 |
| WO | WO 2010/102038 A1 | 9/2010 |
| WO | WO 2010/102043 A1 | 9/2010 |

OTHER PUBLICATIONS

Nikolas A. A. Zwaneveld et al., "Organized Formation of 2D Extended Covalent Organic Frameworks at Surfaces," *J. Am. Chem. Soc.*, vol. 130, pp. 6678-6679 (published on web Apr. 30, 2008).

Adrien P. Cote et al., "Porous, Crystalline, Covalent Organic Frameworks," *Science*, vol. 310, pp. 1166-1170 (Nov. 18, 2005).

Hani El-Kaderi et al., "Designed Synthesis of 3D Covalent Organic Frameworks," *Science*, vol. 316, pp. 268-272 (Apr. 13, 2007).

Adrien P. Cote et al., "Reticular Synthesis of Microporous and Mesoporous Covalent Organic Frameworks" *J. Am. Chem. Soc.*, vol. 129, 12914-12915 (published on web Oct. 6, 2007).

Omar M. Yaghi et al., "Reticular synthesis and the design of new materials," *Nature*, vol. 423, pp. 705-714 (Jun. 12, 2003).

Nathan W. Ockwig et al., "Reticular Chemistry: Occurrence and Taxonomy of Nets and Grammar for the Design of Frameworks," *Acc. Chem. Res.*, vol. 38, No. 3, pp. 176-182 (published on web Jan. 19, 2005).

Pierre Kuhn et al., Porous, Covalent Triazine-Based Frameworks Prepared by Ionothermal Synthesis, *Angew. Chem. Int. Ed.*, vol. 47, pp. 3450-3453. (Published on web Mar. 10, 2008).

Jia-Xing Jiang et al., "Conjugated Microporous Poly(aryleneethylnylene) Networks," *Angew. Chem. Int. Ed.*, vol. 46, (2008) pp, 1-5 (Published on web Sep. 26, 2008).

Hunt, J.R. et al. "Reticular Synthesis of Covalent-Organic Borosilicate Frameworks" *J. Am. Chem. Soc.*, vol. 130, (2008), 11872-11873. (published on web Aug. 16, 2008).

Apr. 28, 2010 International Search Report issued in PCT/US 10/26082.

Apr. 28, 2010 Written Opinion issued in PCT/US 10/26082.

Apr. 27, 2010 International Search Report issued in PCT/US 10/26071.

Apr. 27, 2010 Written Opinion issued in PCT/US 10/26071.

Apr. 28, 2010 International Search Report issued in PCT/US 10/26091.

Apr. 28, 2010 Written Opinion issued in PCT/US 10/26091.

Apr. 28, 2010 International Search Report issued in PCT/US 10/26100.

Apr. 28, 2010 Written Opinion issued in PCT/US 10/26100.

Apr. 16, 2010 International Search Report issued in PCT/US 10/26079.

Apr. 16, 2010 Written Opinion issued in PCT/US 10/26079.

Apr. 20, 2010 International Search Report issued in PCT/US 10/26094.

Apr. 20, 2010 Written Opinion issued in PCT/US 10/26094.

U.S. Appl. No. 12/716,706, filed Mar. 3, 2010 Adrien Pierre Cote et al.

U.S. Appl. No. 12/716,571, filed Mar. 3, 2010 Matthew A. Heuft et al.

U.S. Appl. No. 12/716,524, filed Mar. 3, 2010 Matthew A. Heuft et al.

U.S. Appl. No. 12/716,324, filed Mar. 3, 2010 Matthew A. Heuft et al.

U.S. Appl. No. 12/716,449, filed Mar. 3, 2010 Adrien Pierre Cote et al.
Peter M. Budd; Putting Order into Polymer Networks; Science, 2007, 316, 210-211.
Wan, S., Guo, J., Kim, J., Ihee, H. and Jiang, D.; A Photoconductive Covalent Organic Framework: Self-Condensed Arene Cubes Composed of Eclipsed 2D Polypyrene Sheets for Photocurrent Generation; Angewandte Chemie International Edition, 2009, 48, 5439-5442.
U.S. Appl. No. 13/351,561, filed Jan. 17, 2012 Matthew A. Heuft et al.
U.S. Appl. No. 13/246,109, filed Sep. 27, 2011 Matthew A. Heuft et al.
U.S. Appl. No. 13/246,268, filed Sep. 27, 2011 Matthew A. Heuft et al.
U.S. Appl. No. 13/351,589, filed Jan. 17, 2012 Matthew A. Heuft et al.
Nov. 14, 2011 Notice of Allowance issued in U.S. Appl. No. 12/854,957.
Nov. 14, 2011 Notice of Allowance issued in U.S. Appl. No. 12/854,962.
Sep. 26, 2011 Office Action issued in U.S. Appl. No. 12/854,962.
Sep. 27, 2011 Office Action issued in U.S. Appl. No. 12/854,957.
Nov. 21, 2011 Office Action issued in U.S. Appl. No. 12/815,688.
Feb. 7, 2012 Office Action issued in U.S. Appl. No. 13/173,948.
Sep. 19, 2011 Notice of Allowance issued in U.S. Appl. No. 12/716,524.
Mar. 29, 2012 Office Action issued in U.S. Appl. No. 12/845,235.
Apr. 6, 2012 Office Action issued in U.S. Appl. No. 13/315,452.
Cassie, A.B.D. et al., "Wettability of Porous Surfaces," Trans. Faraday Soc., vol. 40, pp. 546-551, Jun. 1944.
U.S. Appl. No. 12/845,052, filed Jul. 28, 2010 Adrien P. Cote et al.
U.S. Appl. No. 12/854,962, filed Aug. 12, 2010 Matthew A. Heuft et al.
U.S. Appl. No. 12/815,688, filed Jun. 15, 2010 Adrien P. Cote et al.
U.S. Appl. No. 12/854,957, filed Aug. 12, 2010 Matthew A. Heuft et al.
U.S. Appl. No. 12/845,053, filed Jul. 28, 2010 Adrien P. Cote et al.
U.S. Appl. No. 12/845,235, filed Jul. 28, 2010 Adrien P. Cote et al.
U.S. Appl. No. 12/566,568, filed Sep. 24, 2009 Eugene M. Chow et al.
U.S. Appl. No. 12/566,518, filed Sep. 24, 2009 Eugene M. Chow et al.
Colson et al. "Oriented 2D Covalent Organic Framework Thin Films on Single-Layer Graphene", *Science*, 332, 228-231 (2011).
K.S. Novoselov et al., "Electric Field Effect in Atomically Thin Carbon Films", *Science*, Oct. 22, 2004, pp. 666-669, vol. 306.
Stankovich et al., "Graphene-Based Composite Materials", *Nature*, Jul. 20, 2006, pp. 282-286, vol. 442.
U.S. Appl. No. 13/173,948, filed Jun. 30, 2011 Adrien Pierre Cote et al.
U.S. Appl. No. 13/042,950, filed Mar. 8, 2011 Adrien Pierre Cote et al.
U.S. Appl. No. 13/181,761, filed Jul. 13, 2011 Adrien Pierre Cote et al.
U.S. Appl. No. 13/181,912, filed Jul. 13, 2011 Adrien Pierre Cote et al.
U.S. Appl. No. 13/174,046, filed Jun. 30, 2011 Matthew A. Heuft et al.
U.S. Appl. No. 13/182,047, filed Jul. 13, 2011 Adrien Pierre Cote et al.
Jun. 1, 2011 Office Action issued in U.S. Appl. No. 12/716,524.
Jun. 19, 2012 German Search Report issued in Application No. 10 2011 079 277.5 (with translation).
Aug. 10, 2012 Notice of Allowance issued in U.S. Appl. No. 13/181,912.
Aug. 3, 2012 Notice of Allowance issued in U.S. Appl. No. 12/845,053.
Aug. 10, 2012 Office Action issued in U.S. Appl. No. 12/716,449.
Jul. 6, 2012 Office Action issued in U.S. Appl. No. 12/716,706.
Aug. 3, 2012 Office Action issued in U.S. Appl. No. 12/815,688.
Aug. 8, 2012 Office Action issued in U.S. Appl. No. 13/181,761.
Jun. 25, 2012 Office Action issued in U.S. Appl. No. 12/845,052.
U.S. Appl. No. 13/572,095, filed Aug. 10, 2012, Sara J. Vella et al.
U.S. Appl. No. 13/571,933, filed Aug. 10, 2012, Sara J. Vella et al.
Extended European Search Report for European Patent Application No. 10749278.7 dated Aug. 8, 2012.
European Search Report for European Patent Application No. 10749283.7 dated Aug. 10, 2012.
European Search Report for European Patent Application No. 10749285.2 dated Aug. 6, 2012.
European Search Report for European Patent Application No. 10749276.1 dated Aug. 6, 2012.
European Search Report for European Patent Application No. 10749274.6 dated Aug. 6, 2012.
European Search Report for European Patent Application No. 10749289.4 dated Aug. 10, 2012.
Notice of Allowance for U.S. Appl. No. 13/315,452 mailed Aug. 15, 2012.
Sep. 6, 2012 Office Action issued in U.S. Appl. No. 13/182,047.
Sep. 6, 2012 Office Action issued in U.S. Appl. No. 12/716,324.

IDEAL ROD BUILDING BLOCK

IDEAL ROD BUILDING BLOCK

DISTORTED ROD BUILDING BLOCK

DISTORTED ROD BUILDING BLOCK

IDEAL TRIANGULAR BUILDING BLOCK

IDEAL TRIANGULAR BUILDING BLOCK

DISTORTED TRIANGULAR BUILDING BLOCK

DISTORTED TRIANGULAR BUILDING BLOCK

IDEAL TETRAHEDRAL BUILDING BLOCK

IDEAL TETRAHEDRAL BUILDING BLOCK

DISTORTED TETRAHEDRAL BUILDING BLOCK

DISTORTED TETRAHEDRAL BUILDING BLOCK

IDEAL SQUARE BUILDING BLOCK

DISTORTED SQUARE/TETRAHEDRAL BUILDING BLOCK

DISTORTED SQUARE/TETRAHEDRAL BUILDING BLOCK

US 8,389,060 B2

PROCESS FOR PREPARING STRUCTURED ORGANIC FILMS (SOFS) VIA A PRE-SOF

This nonprovisional application claims the benefit of U.S. Provisional Application No. 61/157,411, entitled "Structured Organic Films" filed Mar. 4, 2009, which is hereby incorporated by reference in its entirety.

CROSS-REFERENCE TO RELATED APPLICATIONS

Commonly assigned U.S. patent application Ser. Nos. 12/716,524 (now U.S. Pat. No. 8,093,347), 12/716,706, 12/716,324, and 12/716,449, entitled "Structured Organic Films," "Mixed Solvent Process for Preparing Structured Organic Films," "Composite Structured Organic Films," and "Structured Organic Films Having an Added Functionality," respectively, concurrently filed herewith, the disclosures of which are totally incorporated herein by reference in their entireties, describe structured organic films, methods for preparing structured organic films and applications of structured organic films.

BACKGROUND OF THE INVENTION

Materials whose chemical structures are comprised of molecules linked by covalent bonds into extended structures may be placed into two classes: (1) polymers and cross-linked polymers, and (2) covalent organic frameworks (also known as covalently linked organic networks).

The first class, polymers and cross-linked polymers, is typically embodied by polymerization of molecular monomers to form long linear chains of covalently-bonded molecules. Polymer chemistry processes can allow for polymerized chains to, in turn, or concomitantly, become 'cross-linked.' The nature of polymer chemistry offers poor control over the molecular-level structure of the formed material, i.e. the organization of polymer chains and the patterning of molecular monomers between chains is mostly random. Nearly all polymers are amorphous, save for some linear polymers that efficiently pack as ordered rods. Some polymer materials, notably block co-polymers, can possess regions of order within their bulk. In the two preceding cases the patterning of polymer chains is not by design, any ordering at the molecular-level is a consequence of the natural intermolecular packing tendencies.

The second class, covalent organic frameworks (COFs), differ from the first class (polymers/cross-linked polymers) in that COFs are intended to be highly patterned. In COF chemistry molecular components are called molecular building blocks rather than monomers. During COF synthesis molecular building blocks react to form two- or three-dimensional networks. Consequently, molecular building blocks are patterned throughout COF materials and molecular building blocks are linked to each other through strong covalent bonds.

COFs developed thus far are typically powders with high porosity and are materials with exceptionally low density. COFs can store near-record amounts of argon and nitrogen. While these conventional COFs are useful, there is a need, addressed by embodiments of the present invention, for new materials that offer advantages over conventional COFs in terms of enhanced characteristics.

The properties and characteristics of conventional COFs are described in the following documents:
Yaghi et al., U.S. Pat. No. 7,582,798;
Yaghi et al., U.S. Pat. No. 7,196,210;
Shun Wan et al., "A Belt-Shaped, Blue Luminescent, and Semiconducting Covalent Organic Framework," Angew. Chem. Int. Ed., Vol. 47, pp. 8826-8830 (published on web Jan. 10, 2008);
Nikolas A. A. Zwaneveld et al., "Organized Formation of 2D Extended Covalent Organic Frameworks at Surfaces," J. Am. Chem. Soc., Vol. 130, pp. 6678-6679 (published on web Apr. 30, 2008);
Adrien P. Cote et al., "Porous, Crystalline, Covalent Organic Frameworks," Science, Vol. 310, pp. 1166-1170 (Nov. 18, 2005);
Hani El-Kaderi et al., "Designed Synthesis of 3D Covalent Organic Frameworks," Science, Vol. 316, pp. 268-272 (Apr. 13, 2007);
Adrien P. Cote et al., "Reticular Synthesis of Microporous and Mesoporous Covalent Organic Frameworks" Am. Chem. Soc., Vol. 129, 12914-12915 (published on web Oct. 6, 2007);
Omar M. Yaghi et al., "Reticular synthesis and the design of new materials," Nature, Vol. 423, pp. 705-714 (Jun. 12, 2003);
Nathan W. Ockwig et al., "Reticular Chemistry: Occurrence and Taxonomy of Nets and Grammar for the Design of Frameworks," Acc. Chem. Res., Vol. 38, No. 3, pp. 176-182 (published on web Jan. 19, 2005);
Pierre Kuhn et al., 'Porous, Covalent Triazine-Based Frameworks Prepared by Ionothermal Synthesis," Angew. Chem. Int. Ed., Vol. 47, pp. 3450-3453. (Published on web Mar. 10, 2008);
Jia-Xing Jiang et al., "Conjugated Microporous Poly(aryleneethylnylene) Networks," Angew. Chem. Int. Ed., Vol. 46, (2008) pp, 1-5 (Published on web Sep. 26, 2008); and
Hunt, J. R. et al. "Reticular Synthesis of Covalent-Organic Borosilicate Frameworks" J. Am. Chem. Soc., Vol. 130, (2008), 11872-11873. (published on web Aug. 16, 2008).

SUMMARY OF THE DISCLOSURE

There is provided in embodiments a structured organic film comprising a plurality of segments and a plurality of linkers arranged as a covalent organic framework, wherein at a macroscopic level the covalent organic framework is a film.

BRIEF DESCRIPTION OF THE DRAWINGS

Other aspects of the present disclosure will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
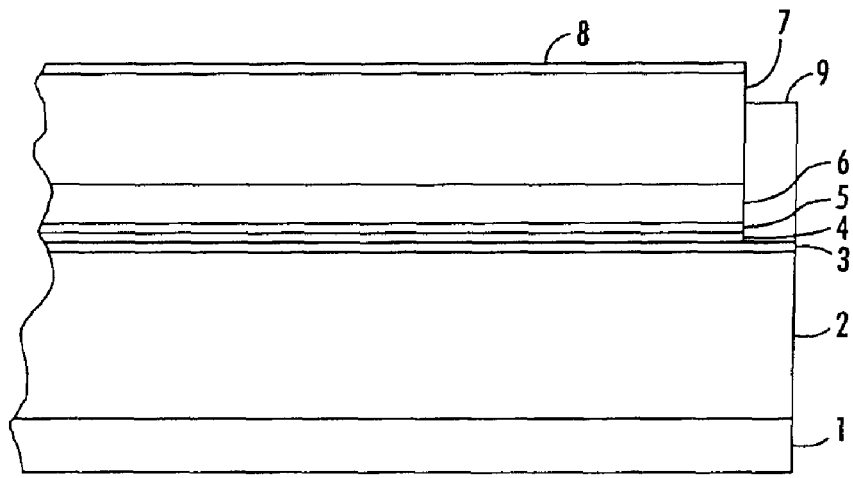
FIG. 1 represents a simplified side view of an exemplary photoreceptor that incorporates a SOF of the present disclosure.

"Structured organic film" (SOF) is a new term introduced by the present disclosure to refer to a COF that is a film at a macroscopic level. The term "SOF" refers to a covalent organic framework (COF) that is a film at a macroscopic level. The phrase "macroscopic level" refers, for example, to the naked eye view of the present SOFs. Although COFs are a network at the "microscopic level" or "molecular level" (requiring use of powerful magnifying equipment or as assessed using scattering methods), the present SOF is fundamentally different at the "macroscopic level" because the film is for instance orders of magnitude larger in coverage than a microscopic level COF network. SOFs described herein have macroscopic morphologies much different than typical COFs previously synthesized. COFs previously synthesized were typically obtained as polycrystalline or particulate powders wherein the powder is a collection of at least thousands of particles (crystals) where each particle (crystal) can have dimensions ranging from nanometers to millimeters. The shape of the particles can range from plates, spheres, cubes, blocks, prisms, etc. The composition of each particle (crystal) is the same throughout the entire particle while at the edges, or surfaces of the particle, is where the segments of the covalently-linked framework terminate. The SOFs described herein are not collections of particles. Instead, the SOFs of the present disclosure are at the macroscopic level substantially defect-free SOFs or defect-free SOFs having continuous covalent organic frameworks that can extend over larger length scales such as for instance much greater than a millimeter to lengths such as a meter and, in theory, as much as hundreds of meters. It will also be appreciated that SOFs tend to have large aspect ratios where typically two dimensions of a SOF will be much larger than the third. SOFs have markedly fewer macroscopic edges and disconnected external surfaces than a collection of COF particles.

In embodiments, a "substantially defect-free SOF" or "defect-free SOF" may be formed from a reaction mixture deposited on the surface of an underlying substrate. The term "substantially defect-free SOF" refers, for example, to an SOF that may or may not be removed from the underlying substrate on which it was formed and contains substantially no pinholes, pores or gaps greater than the distance between the cores of two adjacent segments per square cm; such as, for example, less than 10 pinholes, pores or gaps greater than about 250 nanometers in diameter per $cm^2$, or less than 5 pinholes, pores or gaps greater than about 100 nanometers in diameter per $cm^2$. The term "defect-free SOF" refers, for example, to an SOF that may or may not be removed from the underlying substrate on which it was formed and contains no pinholes, pores or gaps greater than the distance between the cores of two adjacent segments per $micron^2$, such as no pinholes, pores or gaps greater than about 100 Angstroms in diameter per $micron^2$, or no pinholes, pores or gaps greater than about 50 Angstroms in diameter per $micron^2$, or no pinholes, pores or gaps greater than about 20 Angstroms in diameter per $micron^2$.

In embodiments, the SOF comprises at least one atom of an element that is not carbon, such at least one atom selected from the group consisting of hydrogen, oxygen, nitrogen, silicon, phosphorous, selenium, fluorine, boron, and sulfur. In further embodiments, the SOF is a boroxine-, borazine-, borosilicate-, and boronate ester-free SOF.

Molecular Building Block

The SOFs of the present disclosure comprise molecular building blocks having a segment (S) and functional groups (Fg). Molecular building blocks require at least two functional groups ($x \geq 2$) and may comprise a single type or two or more types of functional groups. Functional groups are the reactive chemical moieties of molecular building blocks that participate in a chemical reaction to link together segments during the SOF forming process. A segment is the portion of the molecular building block that supports functional groups and comprises all atoms that are not associated with functional groups. Further, the composition of a molecular building block segment remains unchanged after SOF formation.

Functional Group

Functional groups are the reactive chemical moieties of molecular building blocks that participate in a chemical reaction to link together segments during the SOF forming process. Functional groups may be composed of a single atom, or functional groups may be composed of more than one atom. The atomic compositions of functional groups are those compositions normally associated with reactive moieties in chemical compounds. Non-limiting examples of functional groups include halogens, alcohols, ethers, ketones, carboxylic acids, esters, carbonates, amines, amides, imines, ureas, aldehydes, isocyanates, tosylates, alkenes, alkynes and the like.

Molecular building blocks contain a plurality of chemical moieties, but only a subset of these chemical moieties are intended to be functional groups during the SOF forming process. Whether or not a chemical moiety is considered a functional group depends on the reaction conditions selected for the SOF forming process. Functional groups (Fg) denote a chemical moiety that is a reactive moiety, that is, a functional group during the SOF forming process.

In the SOF forming process the composition of a functional group will be altered through the loss of atoms, the gain of atoms, or both the loss and the gain of atoms; or, the functional group may be lost altogether. In the SOF, atoms previously associated with functional groups become associated with linker groups, which are the chemical moieties that join together segments. Functional groups have characteristic chemistries and those of ordinary skill in the art can generally recognize in the present molecular building blocks the atom(s) that constitute functional group(s). It should be noted that an atom or grouping of atoms that are identified as part of the molecular building block functional group may be preserved in the linker group of the SOF. Linker groups are described below.

Segment

A segment is the portion of the molecular building block that supports functional groups and comprises all atoms that are not associated with functional groups. Further, the composition of a molecular building block segment remains unchanged after SOF formation. In embodiments, the SOF may contain a first segment having a structure the same as or different from a second segment. In other embodiments, the structures of the first and/or second segments may be the same as or different from a third segment, forth segment, fifth segment, etc. A segment is also the portion of the molecular building block that can provide an inclined property. Inclined properties are described later in the embodiments.

In specific embodiments, the segment of the SOF comprises at least one atom of an element that is not carbon, such at least one atom selected from the group consisting of hydrogen, oxygen, nitrogen, silicon, phosphorous, selenium, fluorine, boron, and sulfur.

Figure 16:
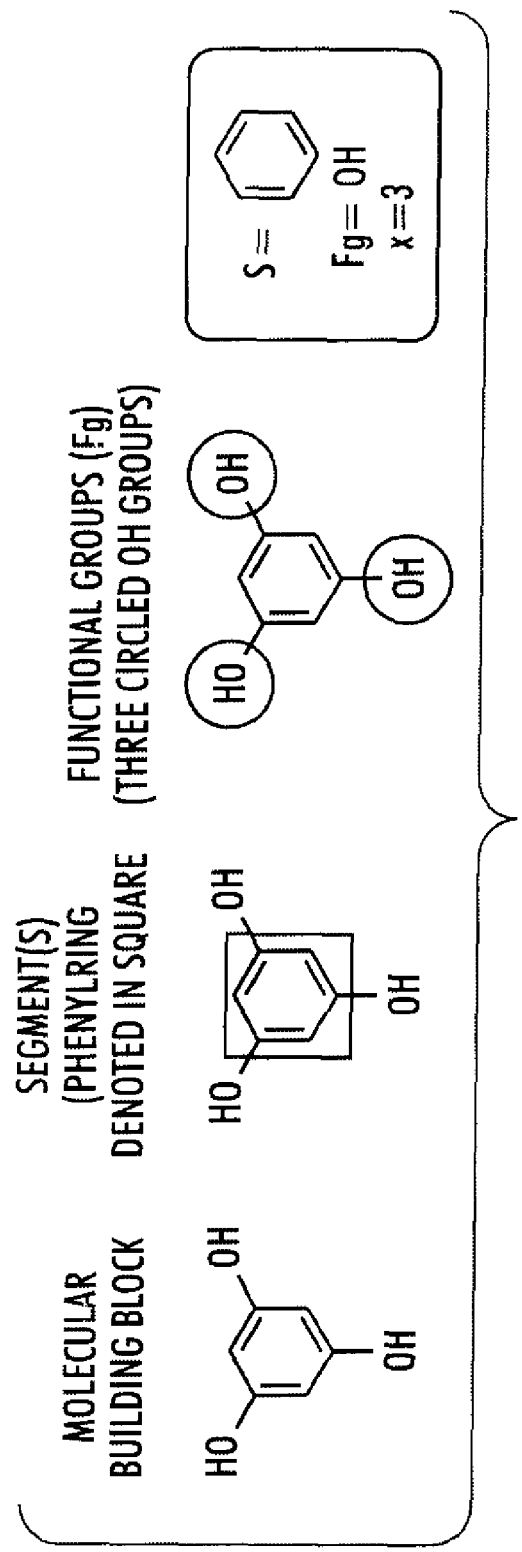
FIG. 16 is an illustration of a molecular building block with one type of functional group.
Figure 17:
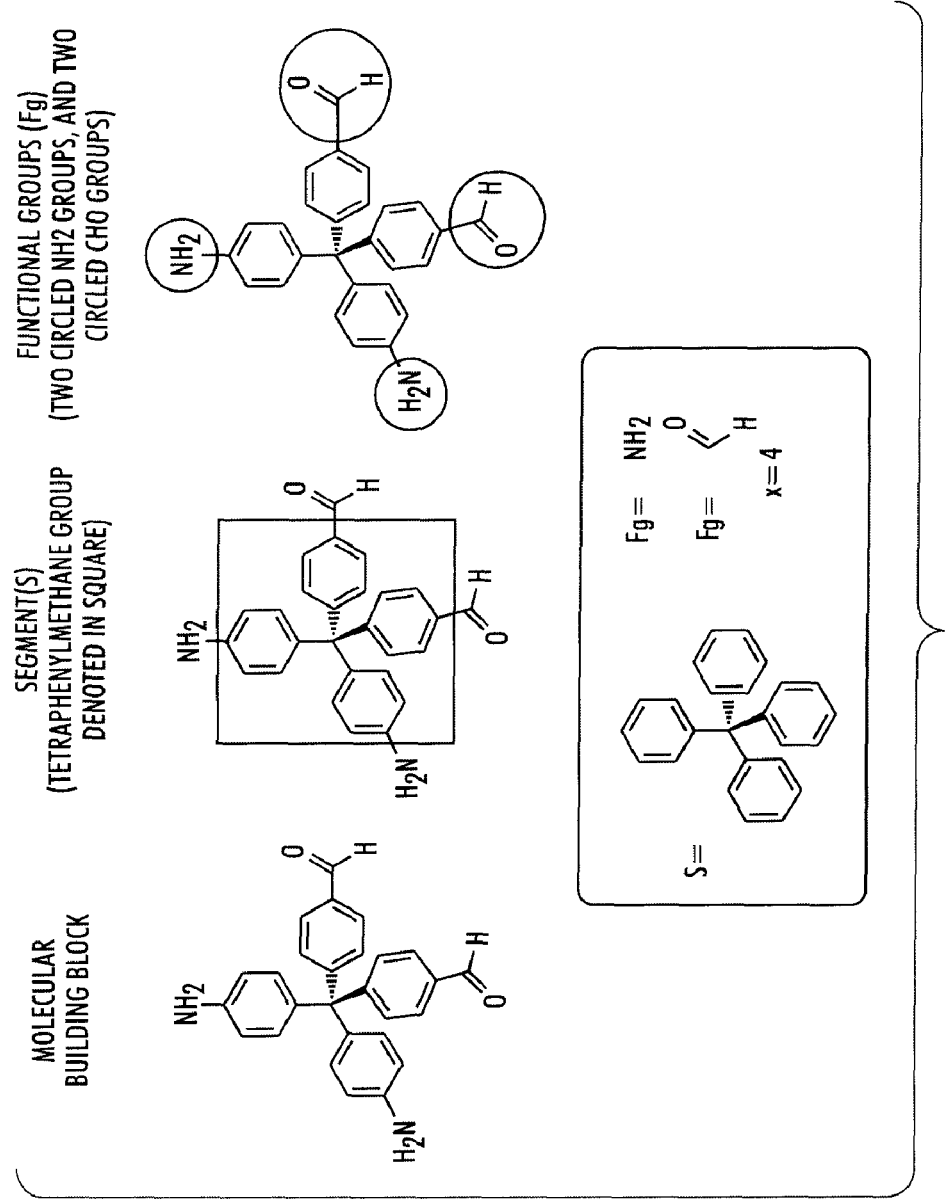
FIG. 17 is an illustration of a molecular building block with two types of functional groups.
Figure 18:
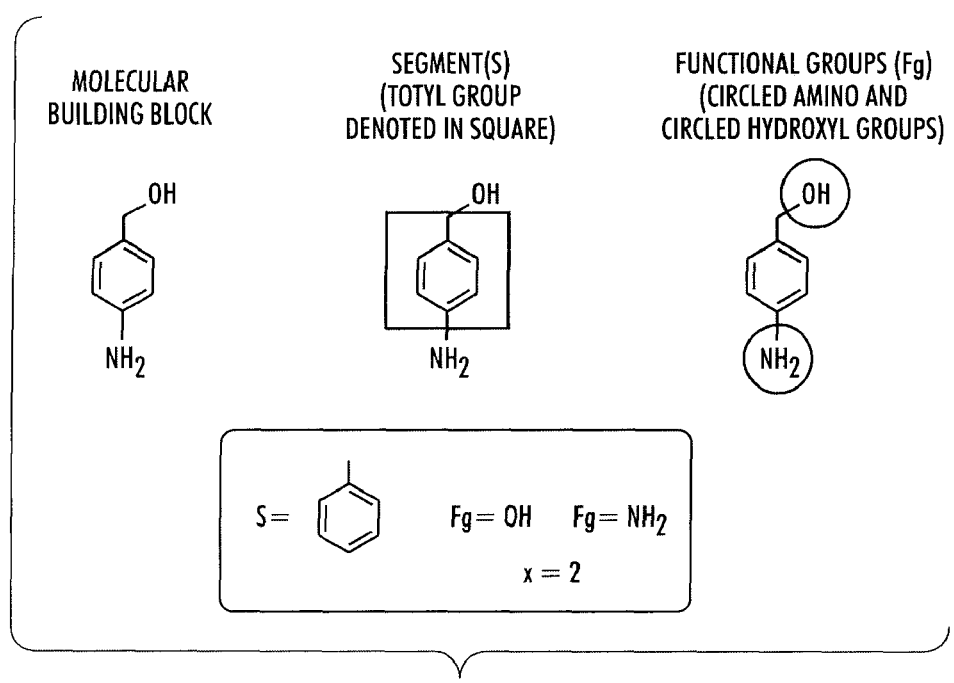
FIG. 18 is an illustration of a molecular building block with two types of functional groups.
Figure 19:
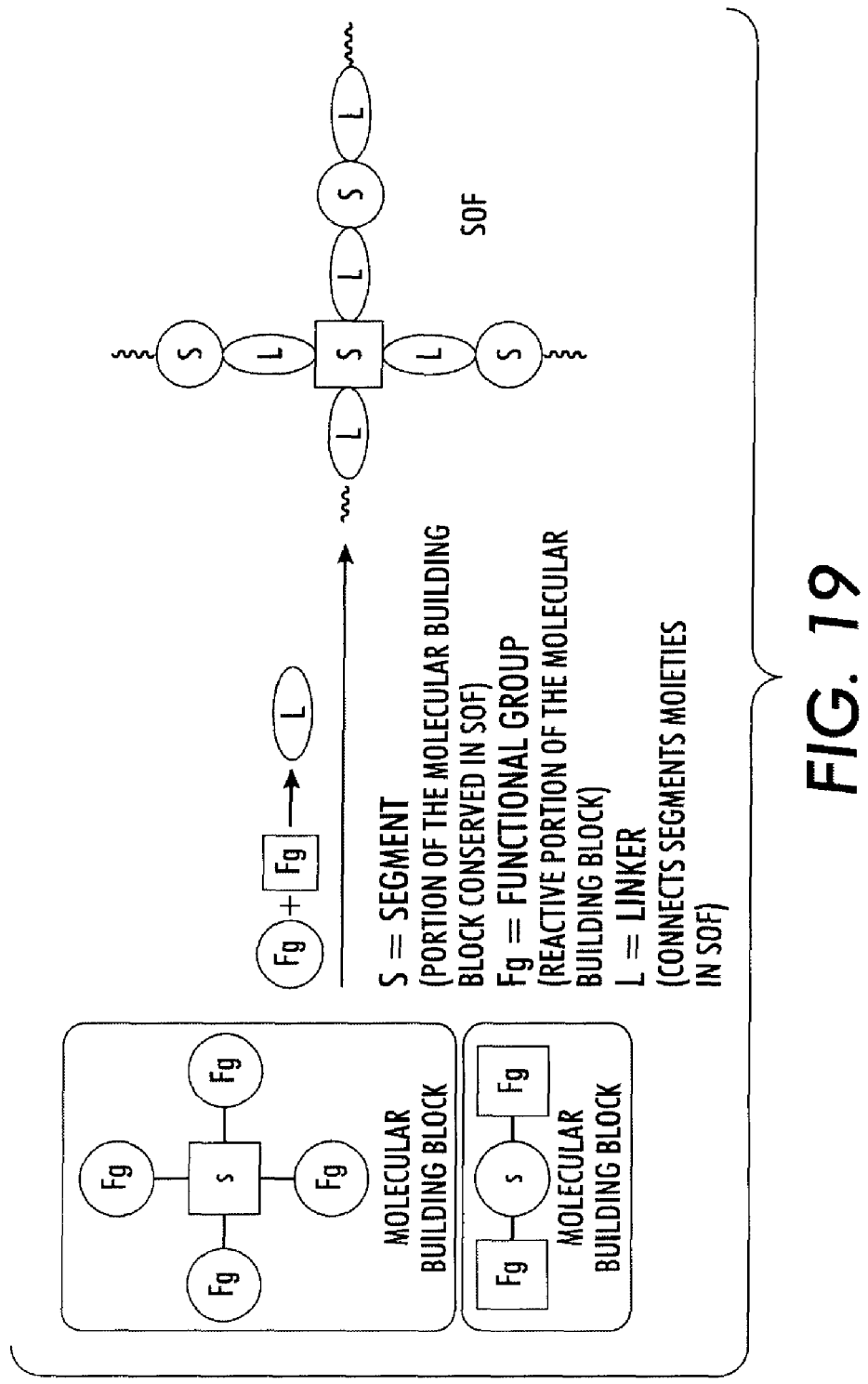
FIG. 19 is an illustration of the emergence of a linker in a SOF upon chemical reaction between functional groups present on the molecular building blocks.
Figure 20:
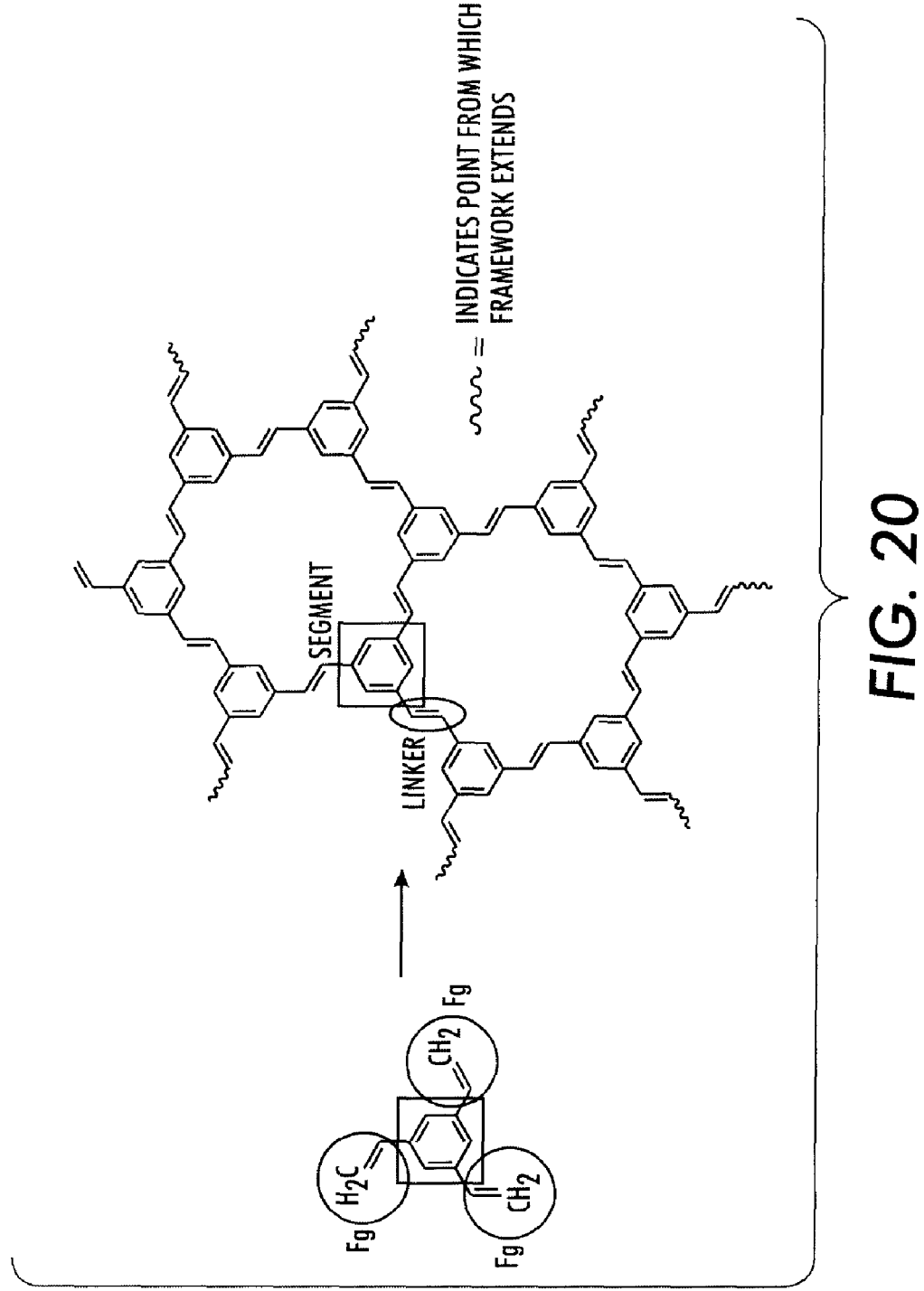
FIG. 20 is an illustration of the production of a Type 1 SOF using one type of molecular building block resulting in a SOF that contains an ethylene (two atom) linker type.
Figure 21:
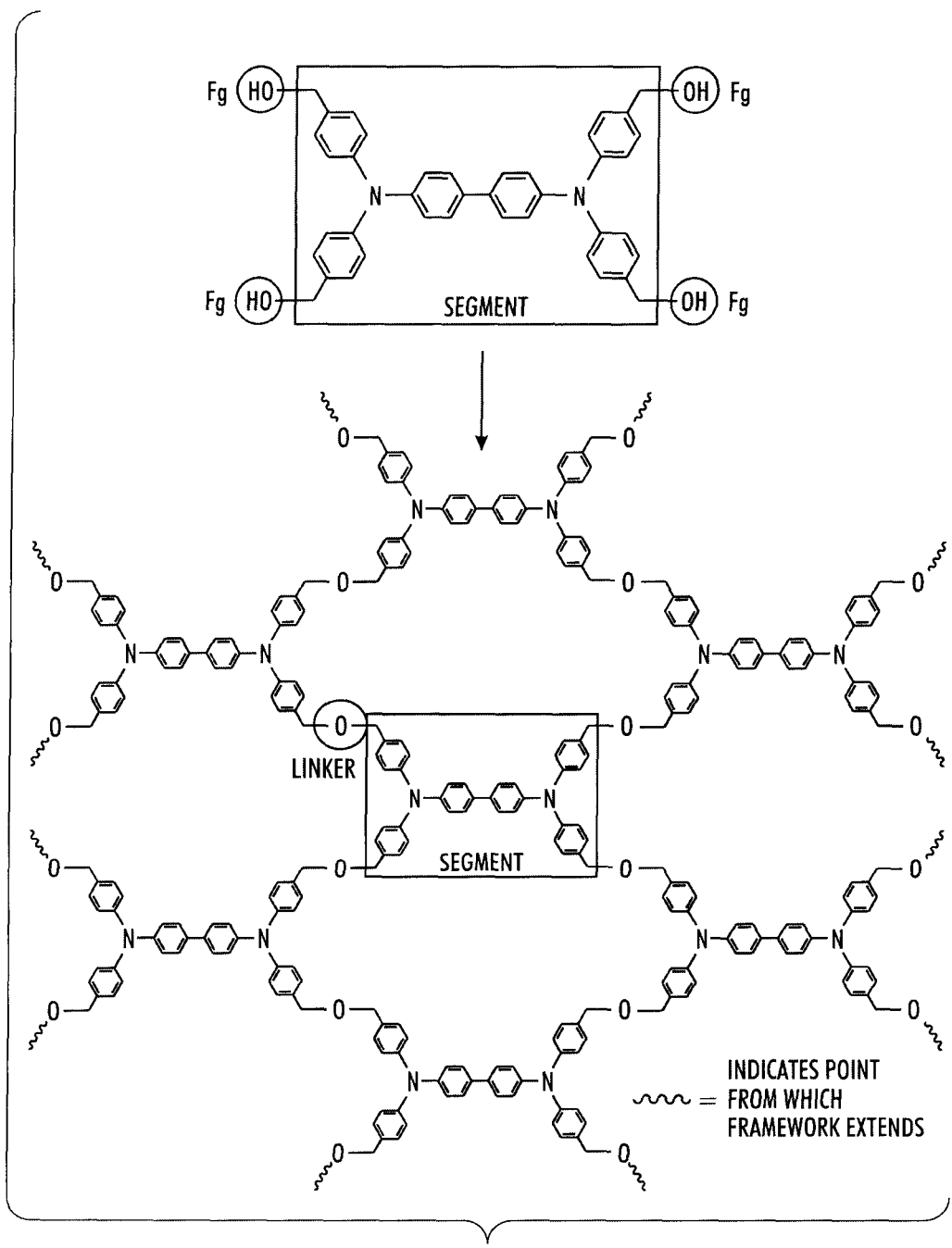
FIG. 21 is an illustration of the production of a Type 1 SOF using one type of molecular building block resulting in a SOF that contains a single atom linker type.
Figure 22:
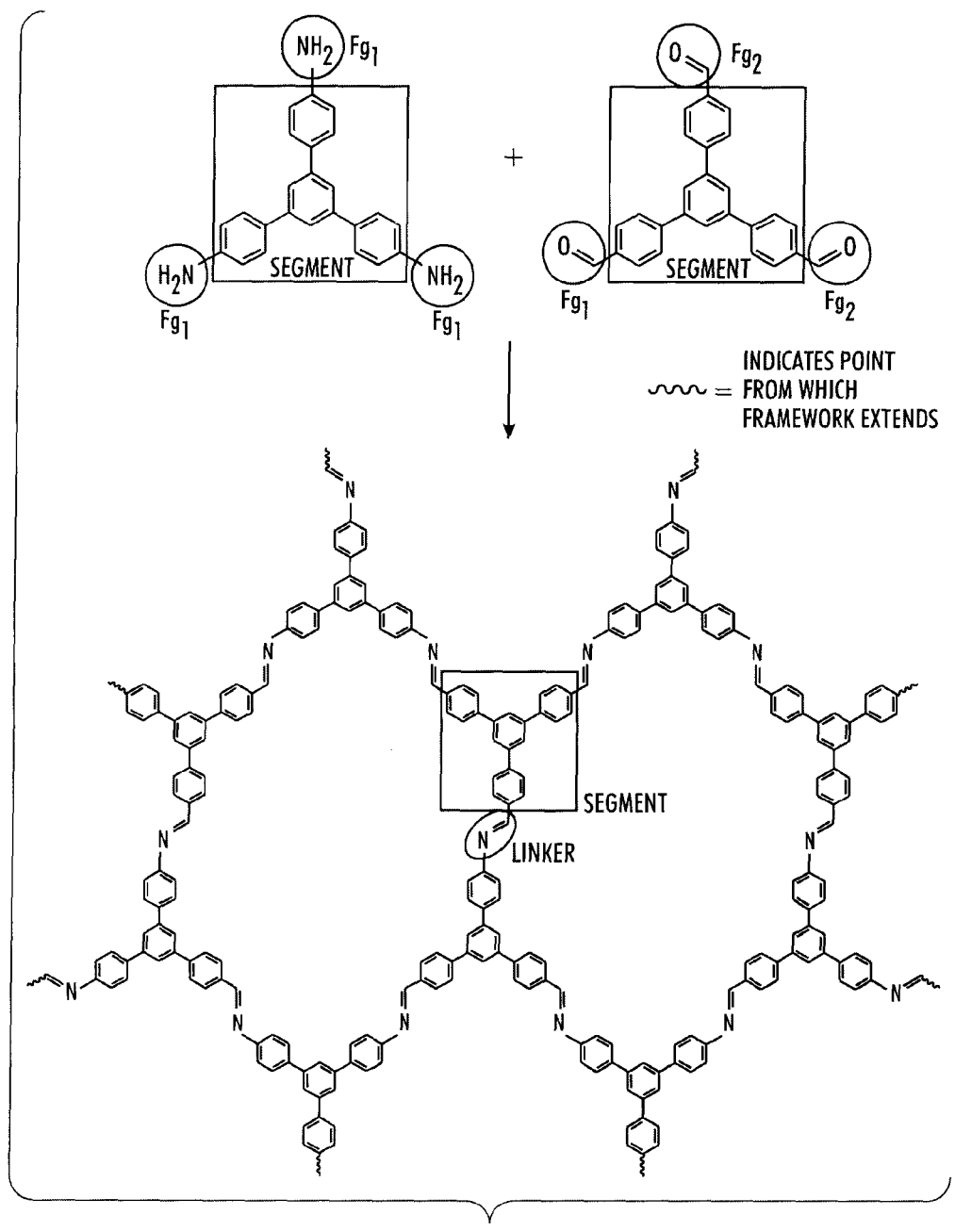
FIG. 22 is an illustration of the production of a Type 1 SOF using two types of molecular building blocks wherein the segments are the same resulting in a SOF contains an imine (two atom) linker type.
Figure 23:
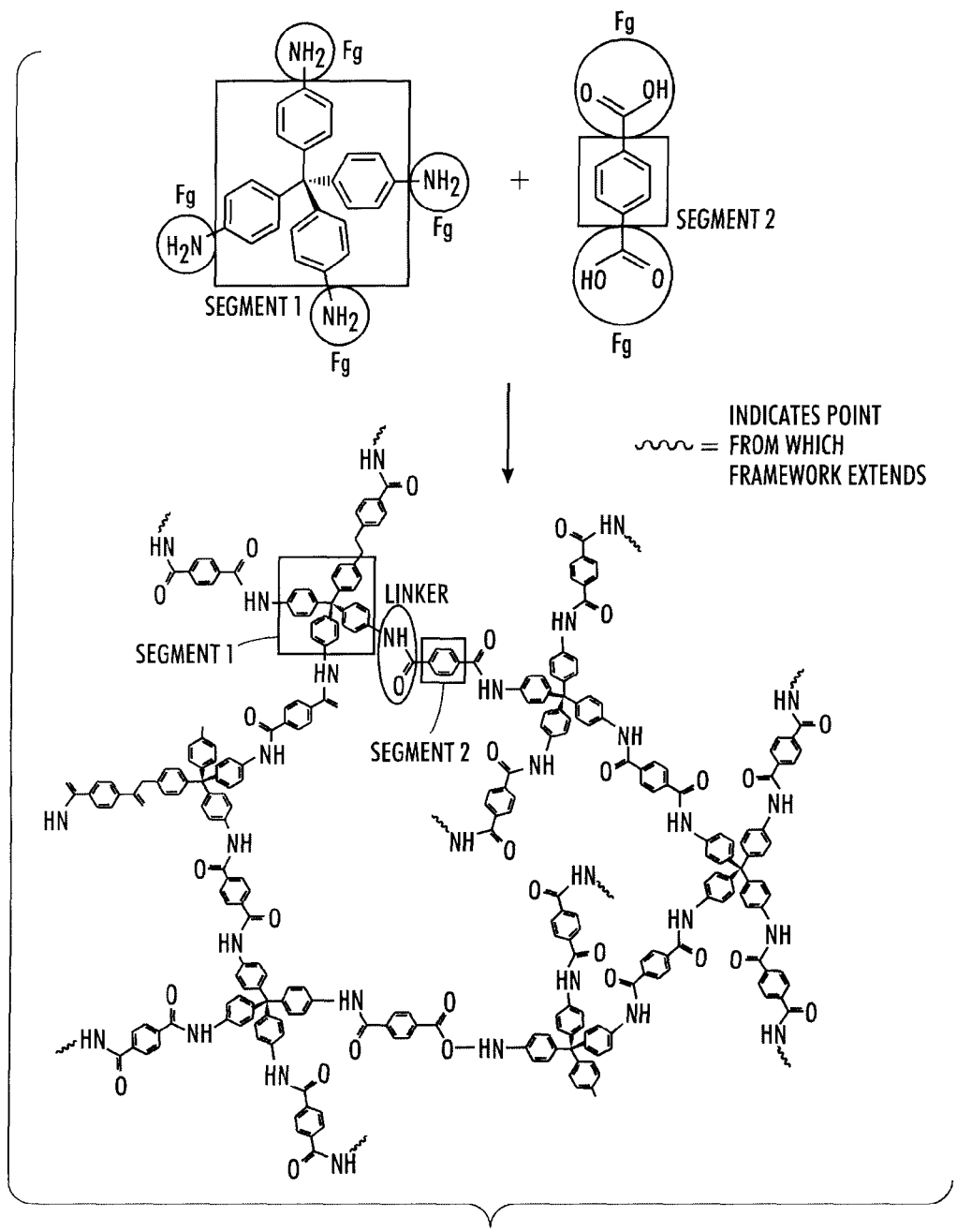
FIG. 23 is an illustration of the production of a Type 2 SOF using two types of molecular building block resulting in a SOF contains two segment types and a single linker type (amide, four atoms).
Figure 24:
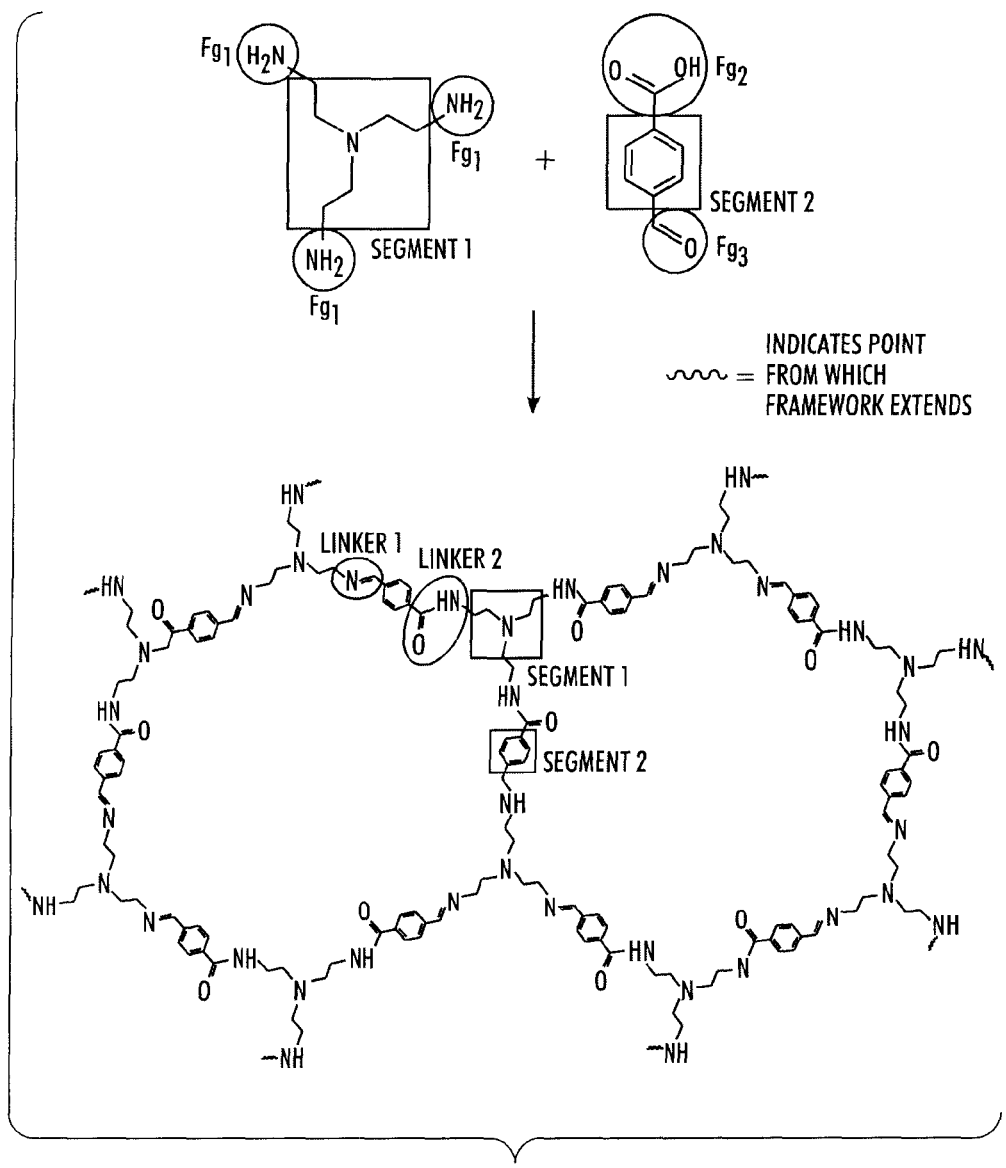
FIG. 24 is an illustration of the production of a Type 3 SOF using two types of molecular building block. In this illustration the number of segments is two and the number of linker types is two; the SOF has patterned segments linked by imine (three atoms) and amide (four atoms) linkers.

Illustrated in FIGS. 16-18 are examples of molecular building blocks. In each example the portion of molecular building block identified as the segment (S) and functional groups (Fg) is indicated.

A linker may comprise a covalent bond, a single atom, or a group of covalently bonded atoms. The former is defined as a covalent bond linker and may be, for example, a single covalent bond or a double covalent bond and emerges when functional groups on all partnered building blocks are lost entirely. The latter linker type is defined as a chemical moiety linker and may comprise one or more atoms bonded together by single covalent bonds, double covalent bonds, or combinations of the two. Atoms contained in linking groups originate from atoms present in functional groups on molecular building blocks prior to the SOF forming process. Chemical moiety linkers may be well-known chemical groups such as, for example, esters, ketones, amides, imines, ethers, urethanes, carbonates, and the like, or derivatives thereof.

For example, when two hydroxyl (—OH) functional groups are used to connect segments in a SOF via an oxygen atom, the linker would be the oxygen atom, which may also be described as an ether linker. In embodiments, the SOF may contain a first linker having a structure the same as or different from a second linker. In other embodiments, the structures of the first and/or second linkers may be the same as or different from a third linker, etc.

In specific embodiments, the linker comprises at least one atom of an element that is not carbon, such at least one atom selected from the group consisting of hydrogen, oxygen, nitrogen, silicon, phosphorous, selenium, fluorine, boron, and sulfur.

SOF Types

Three exemplary types of SOF are described below. These SOF types are expressed in terms of segment and linker combinations. The naming associated with a particular SOF type bears no meaning toward the composition of building blocks selected, or procedure used to synthesize a SOF, or the physical properties of the SOF.

Type 1 SOF: comprises one segment type and one linker type.

Type 2 SOF: comprises two segment types and one linker type.

Type 3 SOF: a plurality of segment types and/or a plurality of linker types.

In embodiments, a plurality of building block types may be employed in a single process to generate a SOF, which in turn would contain a plurality of segment types so long as the reactivity between building block functional groups remains compatible. A SOF comprising a plurality of segment types and/or a plurality of linker types is described as a Type 3 SOF.

For example, among the various possibilities for Type 3 SOFs, a Type 3 SOF may comprise a plurality of linkers including at least a first linker and a second linker (and optionally a third, forth, or fifth, etc., linker) that are different in structure, and a plurality of segments including at least a first segment and a second segment (and optionally a third, forth, or fifth, etc., segment) that are different in structure, where the first segment, when it is not at the edge of the SOF, is connected to at least three other segments (such as three of the second segments being connected via linkers to a first segment), wherein at least one of the connections is via the first linker and at least one of the connections is via the second linker; or a Type 3 SOF may comprise a plurality of linkers including at least a first linker and a second linker (and optionally a third, forth, or fifth, etc., linker) that are different in structure, and a plurality of segments consisting of segments having an identical structure, where the segments that are not at the edges of the SOF are connected by linkers to at least three other segments, where at least one of the connections is via the first linker, and at least one of the connections is via the second linker; or a Type 3 SOF may comprise a plurality of segments including at least a first segment and a second segment (and optionally a third, forth, or fifth, etc., segment) that are different in structure, where the first segment, when it is not at the edge of the SOF, is connected to at least three other segments (such as three second segments or various other segments that are present) by one or more linkers.

Illustration of SOF Types

Described below are non-limiting examples for strategies to synthesize a specific SOF type with exemplary chemical structures. From the illustrations in FIGS. 20-24, it is made clear here that it is possible that the same SOF type may be synthesized using different sets of molecular building blocks. In each of the strategies provided in FIGS. 20-24 only a fragment of the chemical structure of the SOF is displayed.

Metrical Parameters of SOFs

SOFs have any suitable aspect ratio. In embodiments, SOFs have aspect ratios for instance greater than about 30:1 or greater than about 50:1, or greater than about 70:1, or greater than about 100:1, such as about 1000:1. The aspect ratio of a SOF is defined as the ratio of its average width or diameter (that is, the dimension next largest to its thickness) to its average thickness (that is, its shortest dimension). The term 'aspect ratio,' as used here, is not bound by theory. The longest dimension of a SOF is its length and it is not considered in the calculation of SOF aspect ratio.

Generally, SOFs have widths and lengths, or diameters greater than about 500 micrometers, such as about 10 mm, or 30 mm. The SOFs have the following illustrative thicknesses: about 10 Angstroms to about 250 Angstroms, such as about 20 Angstroms to about 200 Angstroms, for a mono-segment thick layer and about 20 nm to about 5 mm, about 50 nm to about 10 mm for a multi-segment thick layer.

SOF dimensions may be measured using a variety of tools and methods. For a dimension about 1 micrometer or less, scanning electron microscopy is the preferred method. For a dimension about 1 micrometer or greater, a micrometer (or ruler) is the preferred method.

Optional Periodicity of SOFs

SOFs may be isolated in crystalline or non-crystalline forms. A crystalline film is one having sufficient periodicity at any length scale such that it can coherently scatter (diffract) electromagnetic radiation, such as, for example, X-rays, and/or subatomic particles, such as, for example neutrons. Coherent scattering will be evidenced as an observed diffraction pattern as detected in 1-, 2-, or 3-dimensions using a detection system suited to detect the radiation or particle employed. A non-crystalline film is one which does not coherently scatter (diffract) electromagnetic radiation, such as, for example, X-rays, and/or subatomic, particles, such as, for example, neutrons.

All tools in the field of diffractometry, or tools that have a secondary capability to collect scattering data, are available for measuring coherent and non-coherent scattering. Such tools include, but are not limited to, 1-, 2-, 3-, or 4-circle goniometers equipped with point, line, or area detection systems capable of detecting scattering (electromagnetic and/or subatomic) in 1-, 2-, or 3-dimensions, imaging tools such as, but are not limited to, electron microscopes equipped to detect scattered electrons from materials.

Alternatively, imaging methods capable of mapping structures at micron and submicron scales may be employed to assess the periodicity of a SOF. Such methods include, but are not limited to, scanning electron microscopy, tunneling electron microscopy, and atomic force microscopy.

Multilayer SOFs

A SOF may comprise a, single layer or a plurality of layers (that is, two, three or more layers). SOFs that are comprised of a plurality of layers may be physically joined (e.g., dipole and hydrogen bond) or chemically joined. Physically attached layers are characterized by weaker interlayer interactions or adhesion; therefore physically attached layers may be susceptible to delamination from each other. Chemically attached layers are expected to have chemical bonds (e.g., covalent or ionic bonds) or have numerous physical or intermolecular (supramolecular) entanglements that strongly link adjacent layers.

Therefore, delamination of chemically attached layers is much more difficult. Chemical attachments between layers may be detected using spectroscopic methods such as focusing infrared or Raman spectroscopy, or with other methods having spatial resolution that can detect chemical species precisely at interfaces. In cases where chemical attachments between layers are different chemical species than those within the layers themselves it is possible to detect these attachments with sensitive bulk analyses such as solid-state nuclear magnetic resonance spectroscopy or by using other bulk analytical methods.

In the embodiments, the SOF may be a single layer (mono-segment thick or multi-segment thick) or multiple layers (each layer being mono-segment thick or multi-segment thick). "Thickness" refers, for example, to the smallest dimension of the film. As discussed above, in a SOF, segments are molecular units that are covalently bonded through linkers to generate the molecular framework of the film. The thickness of the film may also be defined in terms of the number of segments that is counted along that axis of the film when viewing the cross-section of the film. A "monolayer" SOF is the simplest case and refers, for example, to where a film is one segment thick. A SOF where two or more segments exist along this axis is referred to as a "multi-segment" thick SOF.

An exemplary method for preparing physically attached multilayer SOFs includes: (1) forming a base SOF layer that may be cured by a first curing cycle, and (2) forming upon the base layer a second reactive wet layer followed by a second curing cycle and, if desired, repeating the second step to form a third layer, a forth layer and so on. The physically stacked multilayer SOFs may have thicknesses greater than about 20 Angstroms such as, for example, the following illustrative thicknesses: about 20 Angstroms to about 10 cm, such as about 1 nm to about 10 mm, or about 0.1 mm Angstroms to about 5 mm. In principle there is no limit with this process to the number of layers that may be physically stacked.

In embodiments, a multilayer SOF is formed by a method for preparing chemically attached multilayer SOFs by: (1) forming a base SOF layer having functional groups present on the surface (or dangling functional groups) from a first reactive wet layer, and (2) forming upon the base layer a second SOF layer from a second reactive wet layer that comprises molecular building blocks with functional groups capable of reacting with the dangling functional groups on the surface of the base SOF layer. If desired, the formulation used to form the second SOF layer should comprise molecular building blocks with functional groups capable of reacting with the dangling functional groups from the base layer as well as additional functional groups that will allow for a third layer to be chemically attached to the second layer. The chemically stacked multilayer SOFs may have thicknesses greater than about 20 Angstroms such as, for example, the following illustrative thicknesses: about 20 Angstroms to about 10 cm, such as about 1 nm to about 10 mm, or about 0.1 mm Angstroms to about 5 mm. In principle there is no limit with this process to the number of layers that may be chemically stacked.

In embodiments, the method for preparing chemically attached multilayer SOFs comprises promoting chemical attachment of a second SOF onto an existing SOF (base layer) by using a small excess of one molecular building block (when more than one molecular building block is present) during the process used to form the SOF (base layer) whereby the functional groups present on this molecular building block will be present on the base layer surface. The surface of base layer may be treated with an agent to enhance the reactivity of dangling functional groups or to create an increased number of dangling functional groups.

In an embodiment the dangling functional groups present on the surface of an SOF may be altered to increase the propensity for covalent attachment (or, alternatively, to disfavor covalent attachment) of particular classes of molecules or individual molecules, such as SOFs, to a base layer or any additional substrate or SOF layer. For example, the surface of a base layer, such as an SOF layer, which may contain reactive dangling functional groups, may be rendered pacified through surface treatment with a capping chemical group. For example, a SOF layer having dangling hydroxyl alcohol groups may be pacified by treatment with trimethylsilylchloride thereby capping hydroxyl groups as stable trimethylsilylethers. Alternatively, the surface of base layer may be treated with a non-chemically bonding agent, such as a wax, to block reaction with dangling functional groups from subsequent layers.

Molecular Building Block Symmetry

Molecular building block symmetry relates to the positioning of functional groups (Fgs) around the periphery of the molecular building block segments. Without being bound by chemical or mathematical theory, a symmetric molecular building block is one where positioning of Fgs may be associated with the ends of a rod, vertexes of a regular geometric shape, or the vertexes of a distorted rod or distorted geometric shape. For example, the most symmetric option for molecular building blocks containing four Fgs are those whose Fgs overlay with the corners of a square or the apexes of a tetrahedron.

Use of symmetrical building blocks is practiced in embodiments of the present disclosure for two reasons: (1) the patterning of molecular building blocks may be better anticipated because the linking of regular shapes is a better understood process in reticular chemistry, and (2) the complete reaction between molecular building blocks is facilitated because for less symmetric building blocks errant conformations/orientations may be adopted which can possibly initiate numerous linking defects within SOFs.

Figure 25A:
FIGS. 25A-O are illustrations of building blocks whose symmetrical elements are outlined.
Figure 25B:
Figure 25C:
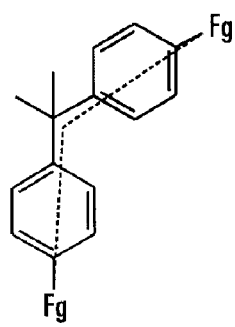
Figure 25D:
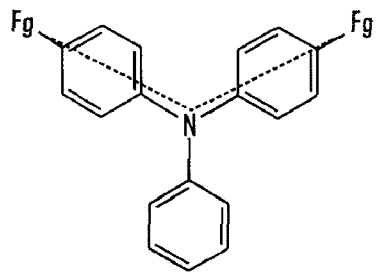
Figure 25E:
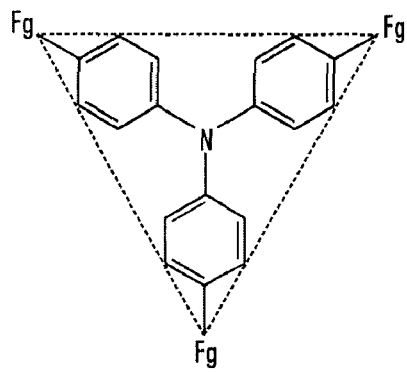
Figure 25F:
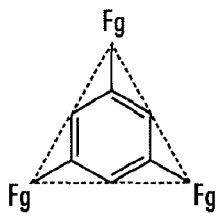
Figure 25G:
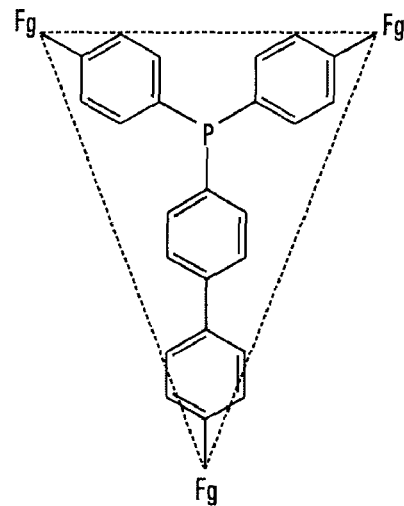
Figure 25H:
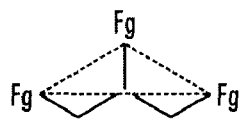
Figure 25I:
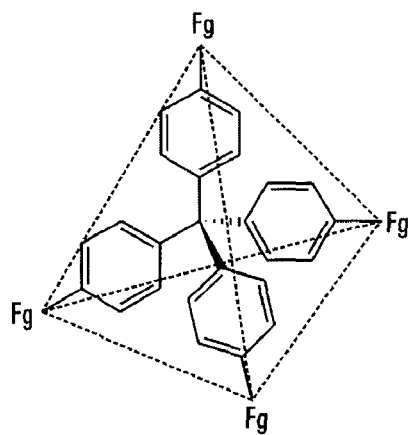
Figure 25J:
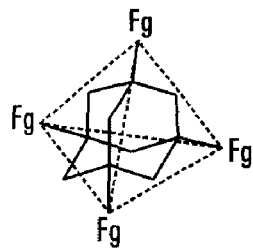
Figure 25K:
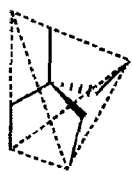
Figure 25L:
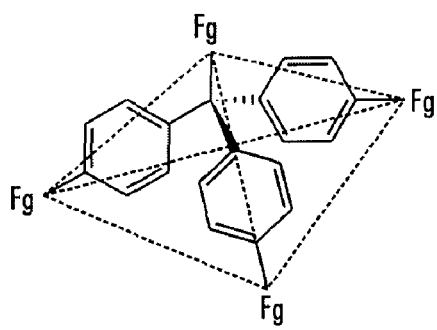
Figure 25M:
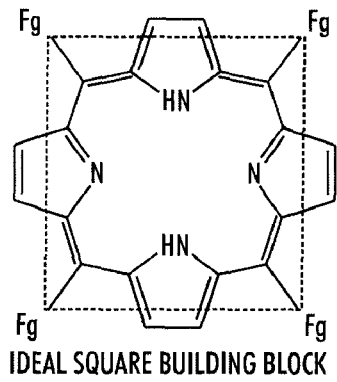
Figure 25N:
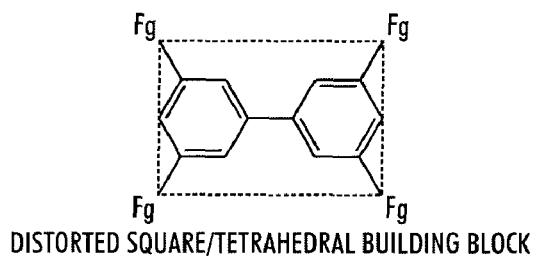
Figure 25O:
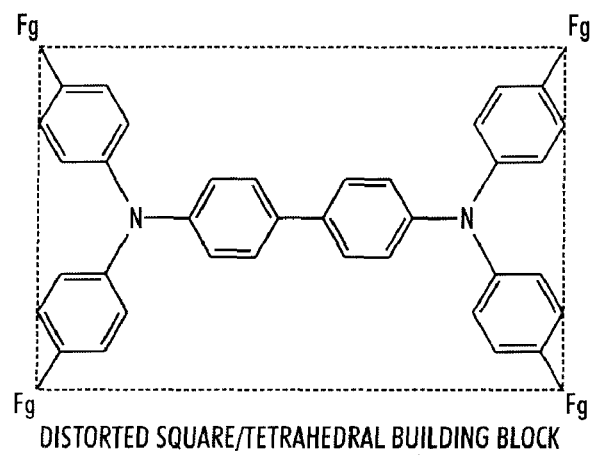

FIGS. 25A-O illustrate building blocks whose symmetrical elements are outlined. Such symmetrical elements are found in building blocks used in the present disclosure.

In embodiments, the Type 1 SOF contains segments, which are not located at the edges of the SOF, that are connected by linkers to at least three other segments. For example, in embodiments the SOF comprises at least one symmetrical building block selected from the group consisting of ideal triangular building blocks, distorted triangular building blocks, ideal tetrahedral building blocks, distorted tetrahedral building blocks, ideal square building blocks, and distorted square building blocks. In embodiments, Type 2 and 3 SOF contains at least one segment type, which are not located at the edges of the SOF, that are connected by linkers to at least three other segments. For example, in embodiments the SOF comprises at least one symmetrical building block selected from the group consisting of ideal triangular building blocks, distorted triangular building blocks, ideal tetrahedral building blocks, distorted tetrahedral building blocks, ideal square building blocks, and distorted square building blocks.

Molecular Building Block Enumeration

Illustrated below is a list of classes of exemplary molecular entities and examples of members of each class that may serve as molecular building blocks for SOFs of the present disclosure.

Building blocks containing a carbon or silicon atomic core:

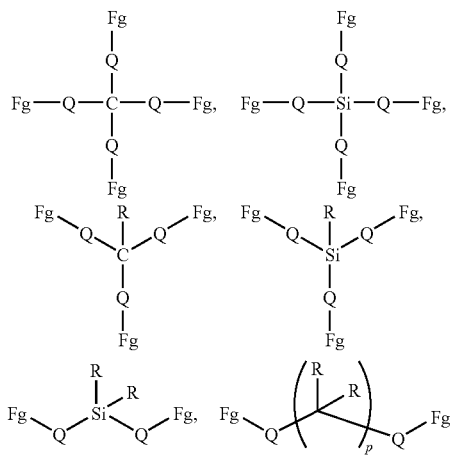

Building blocks containing alkoxy cores:

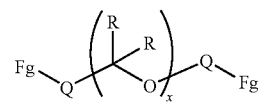

Building blocks containing a nitrogen or phosphorous atomic cores:

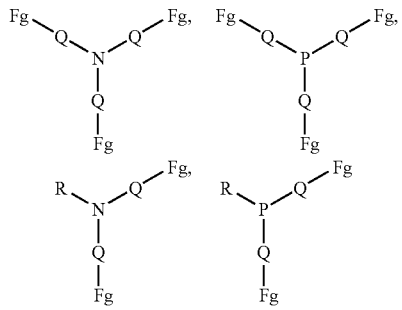

Building blocks containing aryl cores:

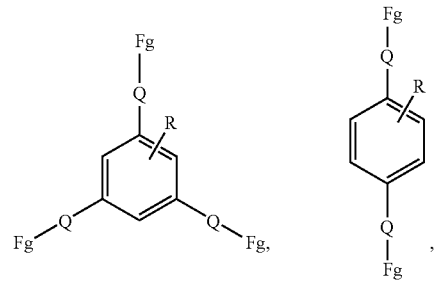

-continued

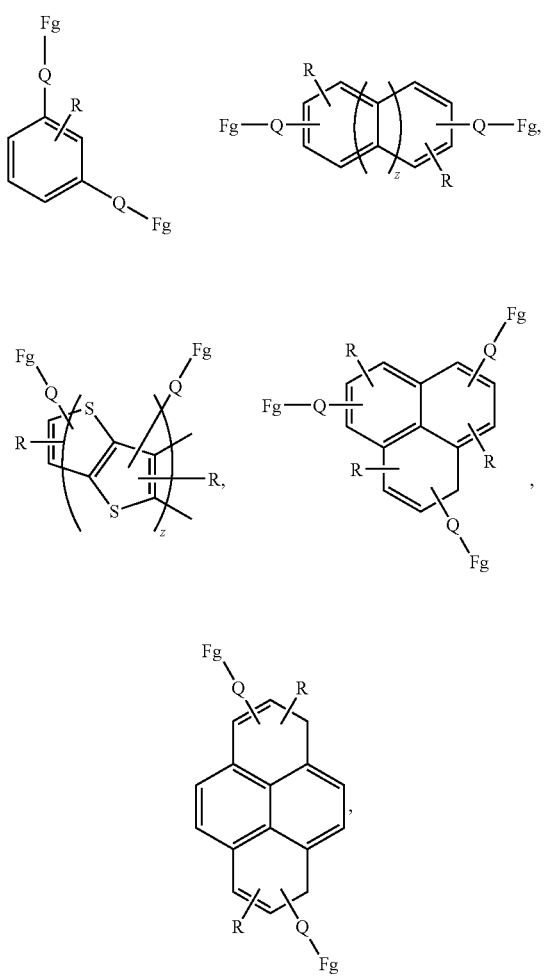

Building blocks containing carbonate cores:

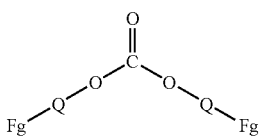

Building blocks containing carbocyclic-, carbobicyclic-, or carbotricyclic core:

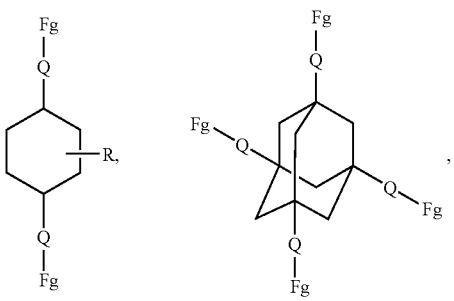

-continued

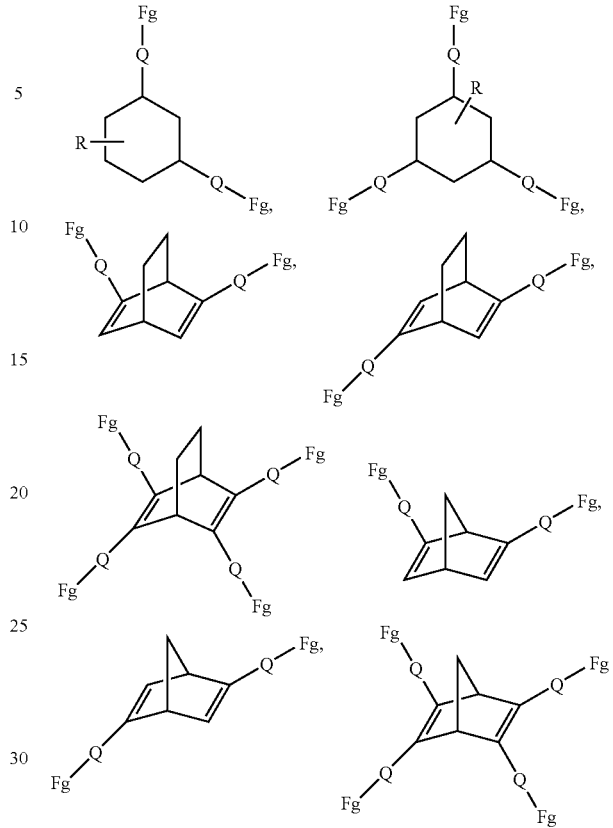

Building blocks containing an oligothiophene core

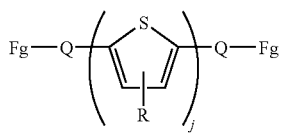

Where Q may be independently selected from:
Aryl, biaryl, triaryl, and naphthyl, optionally substituted with C1-C8 branched and unbranched alkyl, branched and unbranched C1-C8 perfluroalkyl, C1-C6 carbocylic, amino, hydroxyl, halogen, cyano, nitro, ketone, carboxylic acid, carboxylic ester, mercaptyl, thioether;
Aryl, biaryl, triaryl, naphthyl, containing 1-3 heteroatoms per ring, optionally substituted with C1-C8 branched and unbranched alkyl, branched and unbranched C1-C8 perfluroalkyl, C1-C6 carbocylic, amino, hydroxyl, halogen, cyano, nitro, carboxylic acid, carboxylic ester, mercaptyl, thioether;
branched and unbranched C1-C8 perfluroalkyl, C1-C6 carbocylic, amino, hydroxyl, halogen, cyano, nitro, carboxylic acid, ketone, carboxylic ester, mercaptyl, thioether, alkyl ether, aryl ether;
C1-C12 branched and unbranched alkyl;
C1-C12 branched an unbranched perfluroalkyl;
oligoether containing as many as 12 C—O units;
with p of the Group IV atomic core ranging from about 1 to about 24, such as from about 12 to about 24; x of the alkoxy cores ranging from about 1 to about 12, such as from about 6 to about 12; z ranging from about 1 to about 4, such as from about 2 to about 4; j ranging from about 1 to about 12, such as from about 1 to about 12.

Where Fg is a functional group, as defined earlier in the embodiments, and may be independently selected from alcohol, alkyl or aryl ether, cyano, amino, halogen, ketone, carboxylic acid, carboxylic acid ester, carboxylic acid chloride, aryl or alkyl sulfonyl, formyl, hydrogen, and isocyanate.

Where R is independently selected from:

Aryl, biaryl, triaryl, and naphthyl, optionally substituted with C1-C8 branched and unbranched alkyl, branched and unbranched C1-C8 perfluroalkyl, C1-C6 carbocylic, amino, hydroxyl, halogen, cyano, nitro, ketone, carboxylic acid, carboxylic ester, mercaptyl, thioether;

Aryl, biaryl, triaryl, naphthyl, containing 1-3 heteratoms per ring optionally substituted with C1-C8 branched and unbranched alkyl, branched and unbranched C1-C8 perfluroalkyl, C1-C6 carbocylic, amino, hydroxyl, halogen, cyano, nitro, ketone, carboxylic acid, carboxylic ester, mercaptyl, thioether;

branched and unbranched C1-C8 perfluroalkyl, C1-C6 carbocylic, amino, hydroxyl, halogen, cyano, nitro, ketone, carboxylic acid, carboxylic ester, mercaptyl, thioether, alkyl ether, aryl ether;

C1-C12 branched and unbranched alkyl;

C1-C12 branched an unbranched perfluroalkyl;

oligoether containing as many as 12 C—O units;

alcohol, alkyl or aryl ether, cyano, amino, halogen, carboxylic acid, carboxylic acid ester, ketone, carboxylic acid chloride, aryl or alkyl sulfonyl, formyl, hydrogen, isocyanate and the like.

Practice of Linking Chemistry

In embodiments linking chemistry may occur wherein the reaction between functional groups produces a volatile byproduct that may be largely evaporated or expunged from the SOF during or after the film forming process or wherein no byproduct is formed. Linking chemistry may be selected to achieve a SOF for applications where the presence of linking chemistry byproducts is not desired. Linking chemistry reactions may include, for example, condensation, addition/elimination, and addition reactions, such as, for example, those that produce esters, imines, ethers, carbonates, urethanes, amides, acetals, and silyl ethers.

In embodiments the linking chemistry via a reaction between function groups producing a non-volatile byproduct that largely remains incorporated within the SOF after the film forming process. Linking chemistry in embodiments may be selected to achieve a SOF for applications where the presence of linking chemistry byproducts does not impact the properties or for applications where the presence of linking chemistry byproducts may alter the properties of a SOF (such as, for example, the electroactive, hydrophobic or hydrophilic nature of the SOF). Linking chemistry reactions may include, for example, substitution, metathesis, and metal catalyzed coupling reactions, such as those that produce carbon-carbon bonds.

For all linking chemistry the ability to control the rate and extent of reaction between building blocks via the chemistry between building block functional groups is an important aspect of the present disclosure. Reasons for controlling the rate and extent of reaction may include adapting the film forming process for different coating methods and tuning the microscopic arrangement of building blocks to achieve a periodic SOF, as defined in earlier embodiments.

Innate Properties of COFs

COFs have innate properties such as high thermal stability (typically higher than 400° C. under atmospheric conditions); poor solubility in organic solvents (chemical stability), and porosity (capable of reversible guest uptake). In embodiments, SOFs may also possess these innate properties.

Added Functionality of SOFs

Added functionality denotes a property that is not inherent to conventional COFs and may occur by the selection of molecular building blocks wherein the molecular compositions provide the added functionality in the resultant SOF. Added functionality may arise upon assembly of molecular building blocks having an "inclined property" for that added functionality. Added functionality may also arise upon assembly of molecular building blocks having no "inclined property" for that added functionality but the resulting SOF has the added functionality as a consequence of linking segments (S) and linkers into a SOF. Furthermore, emergence of added functionality may arise from the combined effect of using molecular building blocks bearing an "inclined property" for that added functionality whose inclined property is modified or enhanced upon linking together the segments and linkers into a SOF.

An Inclined Property of a Molecular Building Block

The term "inclined property" of a molecular building block refers, for example, to a property known to exist for certain molecular compositions or a property that is reasonably identifiable by a person skilled in art upon inspection of the molecular composition of a segment. As used herein, the terms "inclined property" and "added functionality" refer to the same general property (e.g., hydrophobic, electroactive, etc.) but "inclined property" is used in the context of the molecular building block and "added functionality" is used in the context of the SOF.

The hydrophobic (superhydrophobic), hydrophilic, lipophobic (superlipophobic), lipophilic, photochromic and/or electroactive (conductor, semiconductor, charge transport material) nature of an SOF are some examples of the properties that may represent an "added functionality" of an SOF. These and other added functionalities may arise from the inclined properties of the molecular building blocks or may arise from building blocks that do not have the respective added functionality that is observed in the SOF.

The term hydrophobic (superhydrophobic) refers, for example, to the property of repelling water, or other polar species such as methanol, it also means an inability to absorb water and/or to swell as a result. Furthermore, hydrophobic implies an inability to form strong hydrogen bonds to water or other hydrogen bonding species. Hydrophobic materials are typically characterized by having water contact angles greater than 90° and superhydrophobic materials have water contact angles greater than 150° as measured using a contact angle goniometer or related device.

The term hydrophilic refers, for example, to the property of attracting, adsorbing, or absorbing water or other polar species, or a surface that is easily wetted by such species. Hydrophilic materials are typically characterized by having less than 20° water contact angle as measured using a contact angle goniometer or related device. Hydrophilicity may also be characterized by swelling of a material by water or other polar species, or a material that can diffuse or transport water, or other polar species, through itself. Hydrophilicity, is further characterized by being able to form strong or numerous hydrogen bonds to water or other hydrogen bonding species.

The term lipophobic (oleophobic) refers, for example, to the property of repelling oil or other non-polar species such as alkanes, fats, and waxes. Lipophobic materials are typically characterized by having oil contact angles greater than 90° as measured using a contact angle goniometer or related device.

The term lipophilic (oleophilic) refers, for example, to the property attracting oil or other non-polar species such as alkanes, fats, and waxes or a surface that is easily wetted by such species. Lipophilic materials are typically characterized by having a low to nil oil contact angle as measured using, for example, a contact angle goniometer. Lipophilicity can also be characterized by swelling of a material by hexane or other non-polar liquids.

The term photochromic refers, for example, to the ability to demonstrate reversible color changes when exposed to electromagnetic radiation. SOF compositions containing photochromic molecules may be prepared and demonstrate reversible color changes when exposed to electromagnetic radiation. These SOFs may have the added functionality of photochromism. The robustness of photochromic SOFs may enable their use in many applications, such as photochromic SOFs for erasable paper, and light responsive films for window tinting/shading and eye wear. SOF compositions may contain any suitable photochromic molecule, such as a difunctional photochromic molecules as SOF molecular building blocks (chemically bound into SOF structure), a monofunctional photochromic molecules as SOF capping groups (chemically bound into SOF structure, or unfunctionalized photochromic molecules in an SOF composite (not chemically bound into SOF structure). Photochromic SOFs may change color upon exposure to selected wavelengths of light and the color change may be reversible.

SOF compositions containing photochromic molecules that chemically bond to the SOF structure are exceptionally chemically and mechanically robust photochromic materials. Such photochromic SOF materials demonstrate many superior properties, such as high number of reversible color change processes, to available polymeric alternatives.

The term electroactive refers, for example, to the property to transport electrical charge (electrons and/or holes). Electroactive materials include conductors, semiconductors, and charge transport materials. Conductors are defined as materials that readily transport electrical charge in the presence of a potential difference. Semiconductors are defined as materials do not inherently conduct charge but may become conductive in the presence of a potential difference and an applied stimuli, such as, for example, an electric field, electromagnetic radiation, heat, and the like. Charge transport materials are defined as materials that can transport charge when charge is injected from another material such as, for example, a dye, pigment, or metal in the presence of a potential difference.

Conductors may be further defined as materials that give a signal using a potentiometer from about 0.1 to about $10^7$ S/cm.

Semiconductors may be further defined as materials that give a signal using a potentiometer from about $10^{-6}$ to about $10^4$ S/cm in the presence of applied stimuli such as, for example an electric field, electromagnetic radiation, heat, and the like. Alternatively, semiconductors may be defined as materials having electron and/or hole mobility measured using time-of-flight techniques in the range of $10^{-10}$ to about $10^6$ cm$^2$V$^{-1}$s$^{-1}$ when exposed to applied stimuli such as, for example an electric field, electromagnetic radiation, heat, and the like.

Charge transport materials may be further defined as materials that have electron and/or hole mobility measured using time-of-flight techniques in the range of $10^{-10}$ to about $10^6$ cm$^2$V$^{-1}$s$^{-1}$. It should be noted that under some circumstances charge transport materials may be also classified as semiconductors.

SOFs with hydrophobic added functionality may be prepared by using molecular building blocks with inclined hydrophobic properties and/or have a rough, textured, or porous surface on the sub-micron to micron scale. A paper describing materials having a rough, textured, or porous surface on the sub-micron to micron scale being hydrophobic was authored by Cassie and Baxter (Cassie, A. B. D.; Baxter, S. *Trans. Faraday Soc.*, 1944, 40, 546).

Molecular building blocks comprising or bearing highly-fluorinated segments have inclined hydrophobic properties and may lead to SOFs with hydrophobic added functionality. Highly-fluorinated segments are defined as the number of fluorine atoms present on the segment(s) divided by the number of hydrogen atoms present on the segment(s) being greater than one. Fluorinated segments, which are not highly-fluorinated segments may also lead to SOFs with hydrophobic added functionality.

The above-mentioned fluorinated segments may include, for example, tetrafluorohydroquinone, perfluoroadipic acid hydrate, 4,4'-(hexafluoroisopropylidene)diphthalic anhydride, 4,4'-(hexafluoroisopropylidene)diphenol, and the like.

SOFs having a rough, textured, or porous surface on the sub-micron to micron scale may also be hydrophobic. The rough, textured, or porous SOF surface can result from dangling functional groups present on the film surface or from the structure of the SOF. The type of pattern and degree of patterning depends on the geometry of the molecular building blocks and the linking chemistry efficiency. The feature size that leads to surface roughness or texture is from about 100 nm to about 10 µm, such as from about 500 nm to about 5 µm.

SOFs with hydrophilic added functionality may be prepared by using molecular building blocks with inclined hydrophilic properties and/or comprising polar linking groups.

Molecular building blocks comprising segments bearing polar substituents have inclined hydrophilic properties and may lead to SOFs with hydrophilic added functionality. The term polar substituents refers, for example, to substituents that can form hydrogen bonds with water and include, for example, hydroxyl, amino, ammonium, and carbonyl (such as ketone, carboxylic acid, ester, amide, carbonate, urea).

SOFs with electroactive added functionality may be prepared by using molecular building blocks with inclined electroactive properties and/or be electroactive resulting from the assembly of conjugated segments and linkers. The following sections describe molecular building blocks with inclined hole transport properties, inclined electron transport properties, and inclined semiconductor properties.

SOFs with hole transport added functionality may be obtained by selecting segment cores such as, for example, triarylamines, hydrazones (U.S. Pat. No. 7,202,002 B2 to Tokarski et al.), and enamines (U.S. Pat. No. 7,416,824 B2 to Kondoh et al.) with the following general structures:

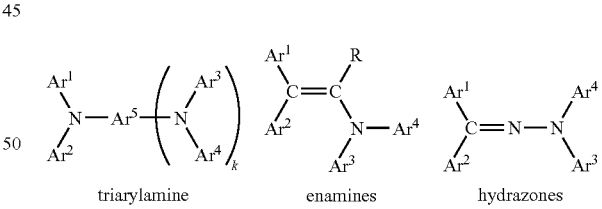

triarylamine      enamines      hydrazones

The segment core comprising a triarylamine being represented by the following general formula:

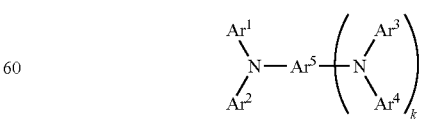

wherein Ar$^1$, Ar$^2$, Ar$^3$, Ar$^4$ and Ar$^5$ each independently represents a substituted or unsubstituted aryl group, or Ar$^5$ independently represents a substituted or unsubstituted arylene group, and k represents 0 or 1, wherein at least two of Ar$^1$, Ar$^2$, Ar³, Ar⁴ and Ar⁵ comprises a Fg (previously defined). Ar⁵ may be further defined as, for example, a substituted phenyl ring, substituted/unsubstituted phenylene, substituted/unsubstituted monovalently linked aromatic rings such as biphenyl, terphenyl, and the like, or substituted/unsubstituted fused aromatic rings such as naphthyl, anthranyl, phenanthryl, and the like.

Segment cores comprising arylamines with hole transport added functionality include, for example, aryl amines such as triphenylamine, N,N,N'N'-tetraphenyl-(1,1'-biphenyl)-4,4'-diamine, N,N'-diphenyl-N,N'-bis(3-methylphenyl)-(1,1'-biphenyl)-4,4'-diamine, N,N'-bis(4-butylphenyl)-N,N'-diphenyl-[p-terphenyl]-4,4''-diamine; hydrazones such as N-phenyl-N-methyl-3-(9-ethyl)carbazyl hydrazone and 4-diethyl amino benzaldehyde-1,2-diphenyl hydrazone; and oxadiazoles such as 2,5-bis(4-N,N'-diethylaminophenyl)-1,2,4-oxadiazole, stilbenes, and the like.

Molecular building blocks comprising triarylamine core segments with inclined hole transport properties may be derived from the list of chemical structures including, for example, those listed below:

triarylamine cores

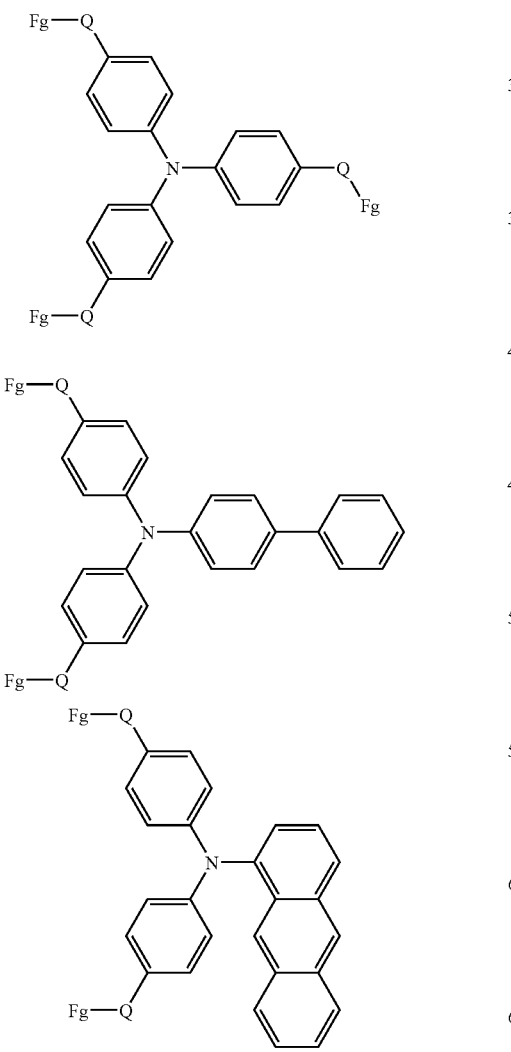

-continued

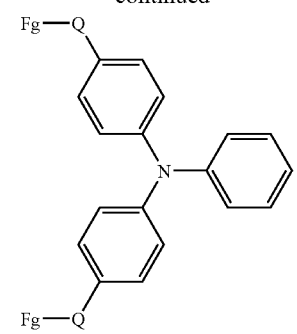

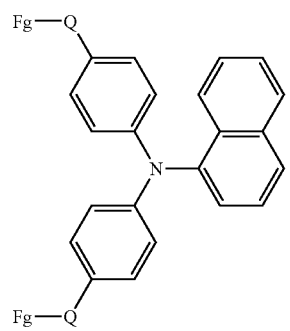

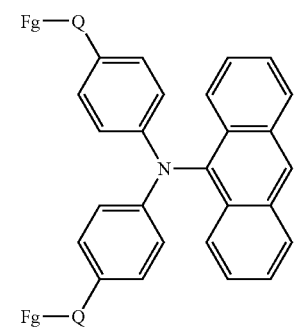

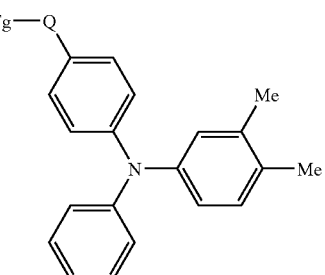

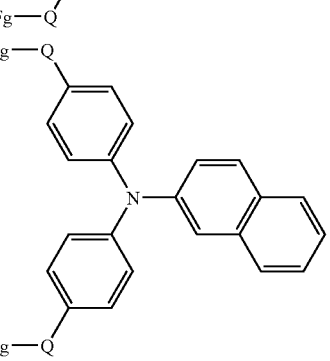

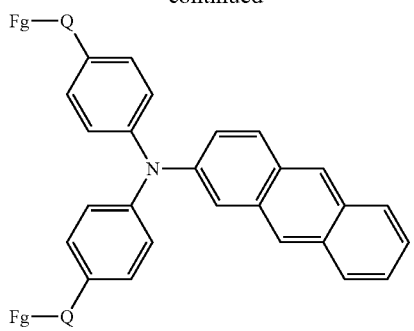

tetraarylbiphenylenediamine (TBD) cores

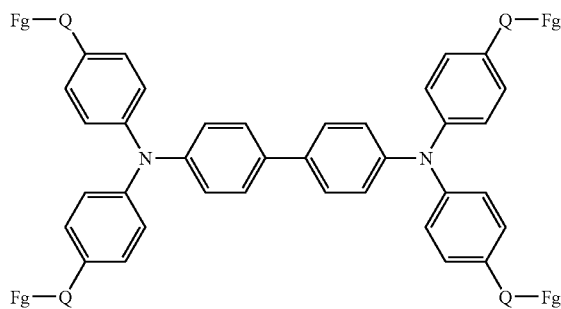

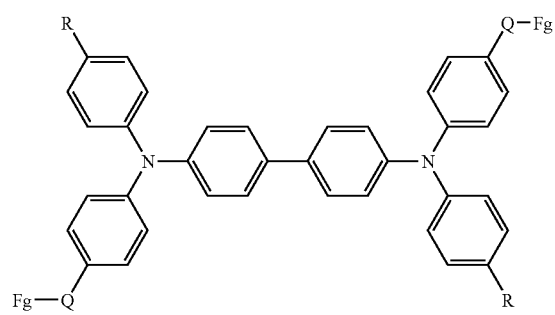

tetraarylterphenylenediamine (TER) cores

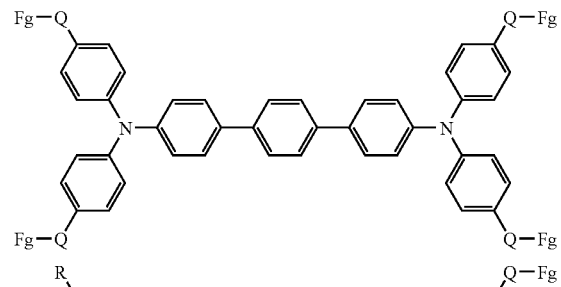

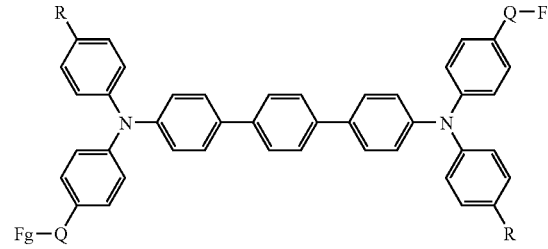

The segment core comprising a hydrazone being represented by the following general formula:

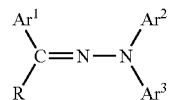

wherein $Ar^1$, $Ar^2$, and $Ar^3$ each independently represents an aryl group optionally containing one or more substituents, and R represents a hydrogen atom, an aryl group, or an alkyl group optionally containing a substituent; wherein at least two of $Ar^1$, $Ar^2$, and $Ar^3$ comprises a Fg (previously defined); and a related oxadiazole being represented by the following general formula:

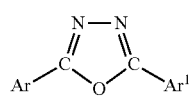

wherein Ar and $Ar^1$ each independently represent an aryl group that comprises a Fg (previously defined).

Molecular building blocks comprising hydrazone and oxadiazole core segments with inclined hole transport properties may be derived from the list of chemical structures including, for example, those listed below:

hydrazone cores

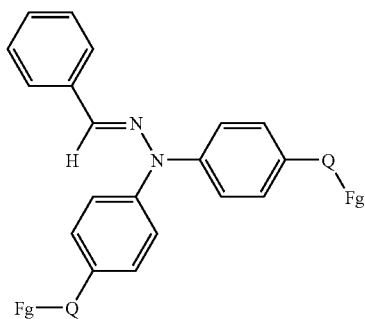

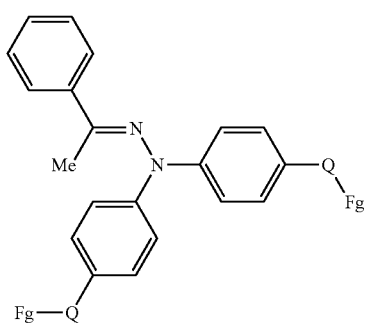

-continued

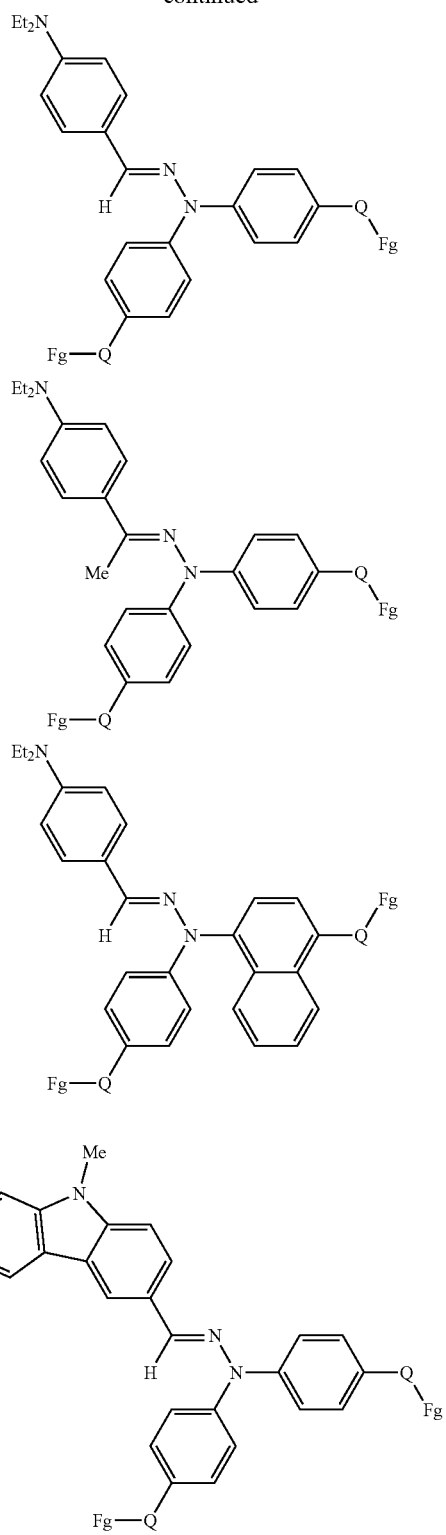

oxadiazole cores

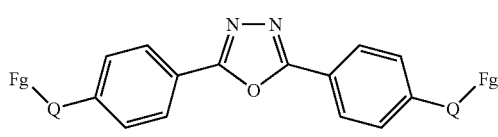

The segment core comprising an enamine being represented by the following general formula:

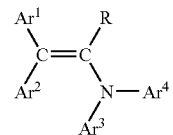

wherein $Ar^1$, $Ar^2$, $Ar^3$, and $Ar^4$ each independently represents an aryl group that optionally contains one or more substituents or a heterocyclic group that optionally contains one or more substituents, and R represents a hydrogen atom, an aryl group, or an alkyl group optionally containing a substituent; wherein at least two of $Ar^1$, $Ar^2$, $Ar^3$, and $Ar^4$ comprises a Fg (previously defined).

Molecular building blocks comprising enamine core segments with inclined hole transport properties may be derived from the list of chemical structures including, for example, those listed below:

enamine cores

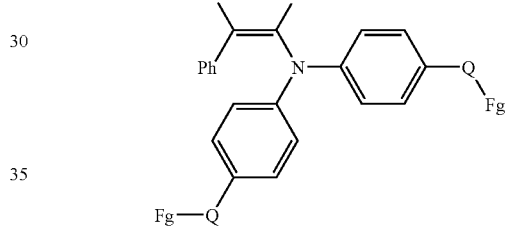

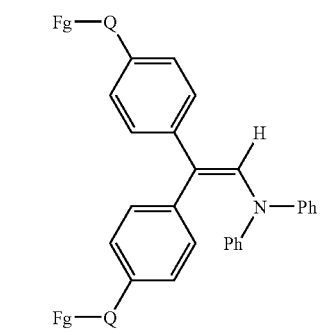

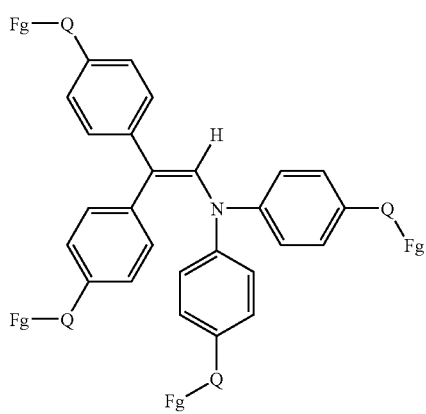

-continued

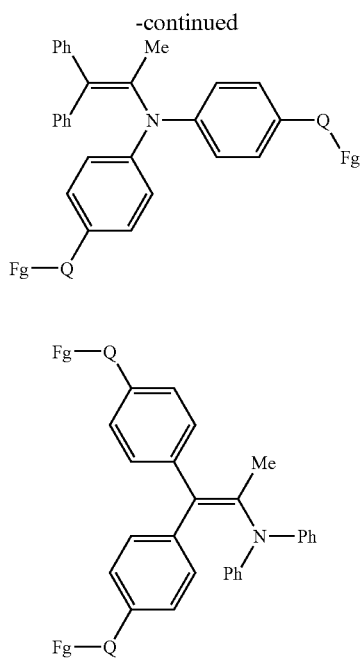

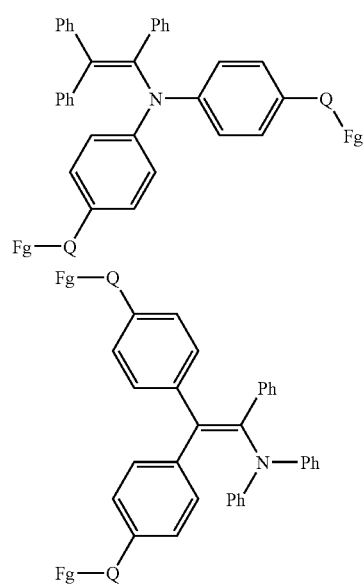

-continued

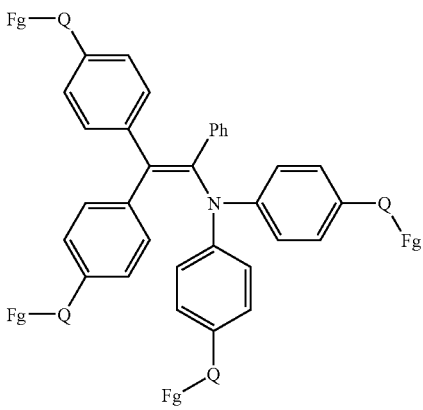

SOFs with electron transport added functionality may be obtained by selecting segment cores comprising, for example, nitrofluorenones, 9-fluorenylidene malonitriles, diphenoquinones, and naphthalenetetracarboxylic diimides with the following general structures:

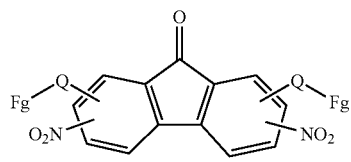

nitrofluorenones

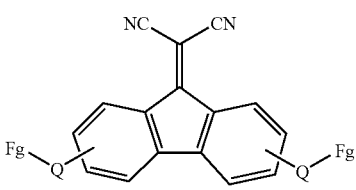

9-fluorenylidene malonitriles

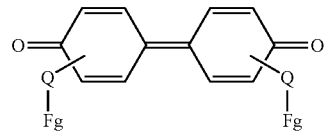

diphenoquinones

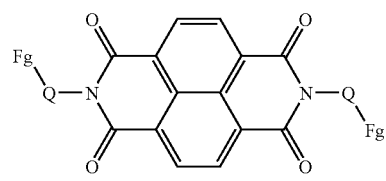

naphthalenetetracarboxylic diimides

It should be noted that the carbonyl groups of diphenylquinones could also act as Fgs in the SOF forming process.

SOFs with semiconductor added functionality may be obtained by selecting segment cores such as, for example, acmes, thiophenes/oligothiophenes/fused thiophenes, perylene bisimides, or tetrathiofulvalenes, and derivatives thereof with the following general structures:

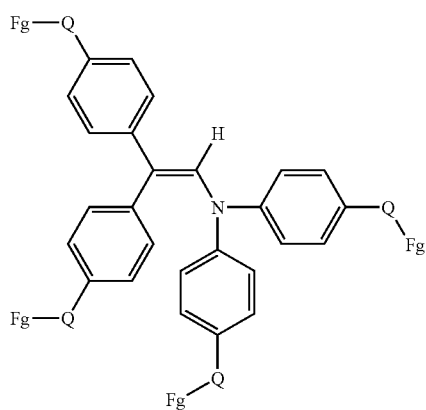

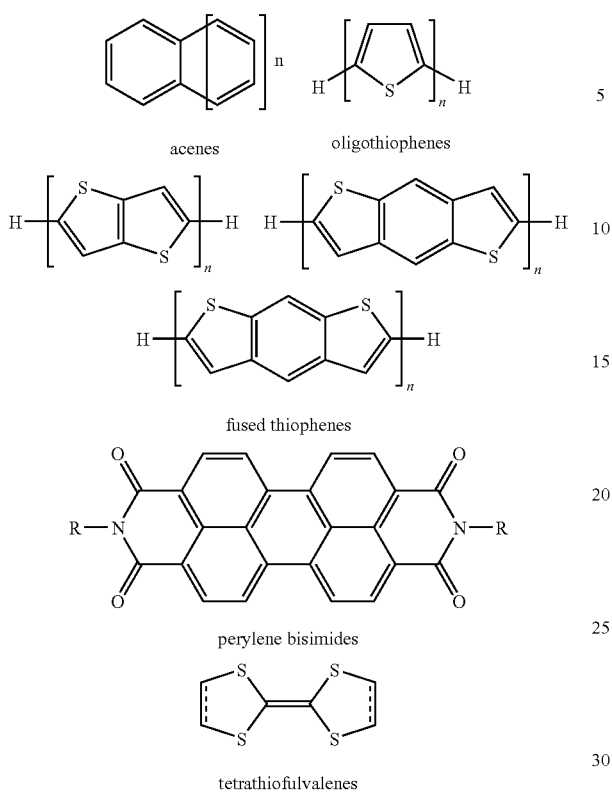

acenes · oligothiophenes · fused thiophenes · perylene bisimides · tetrathiofulvalenes The SOF may be a p-type semiconductor, n-type semiconductor or ambipolar semiconductor. The SOF semiconductor type depends on the nature of the molecular building blocks. Molecular building blocks that possess an electron donating property such as alkyl, alkoxy, aryl, and amino groups, when present in the SOF, may render the SOF a p-type semiconductor. Alternatively, molecular building blocks that are electron withdrawing such as cyano, nitro, fluoro, fluorinated alkyl, and fluorinated aryl groups may render the SOF into the n-type semiconductor.

Molecular building blocks comprising acene core segments with inclined semiconductor properties may be derived from the list of chemical structures including, for example, those listed below:

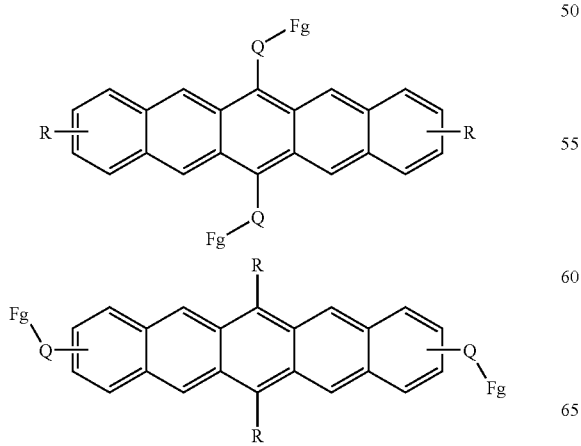

Molecular building blocks comprising thiophene/oligothiophene/fused thiophene core segments with inclined semiconductor properties may be derived from the list of chemical structures including, for example, those listed below:

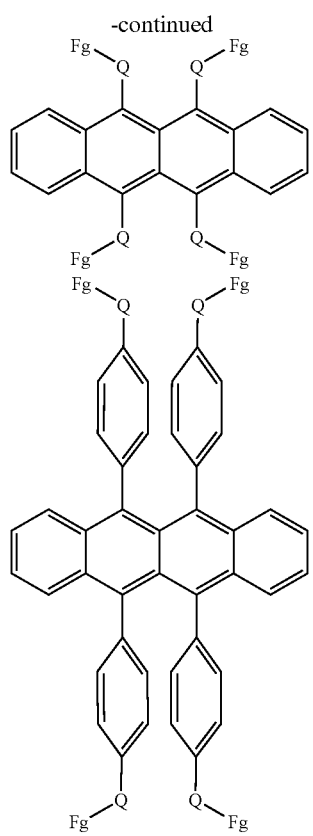

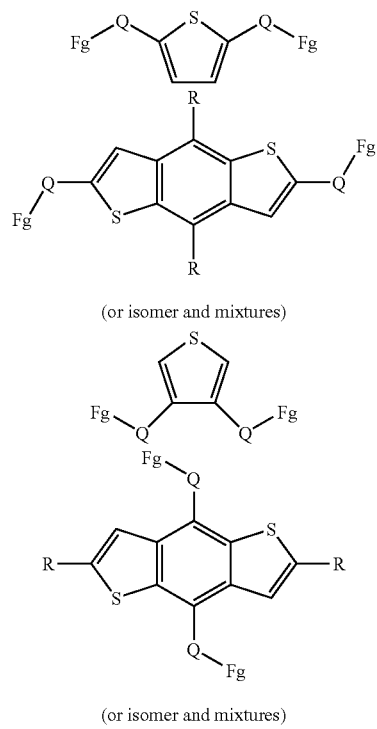

(or isomer and mixtures)

(or isomer and mixtures)

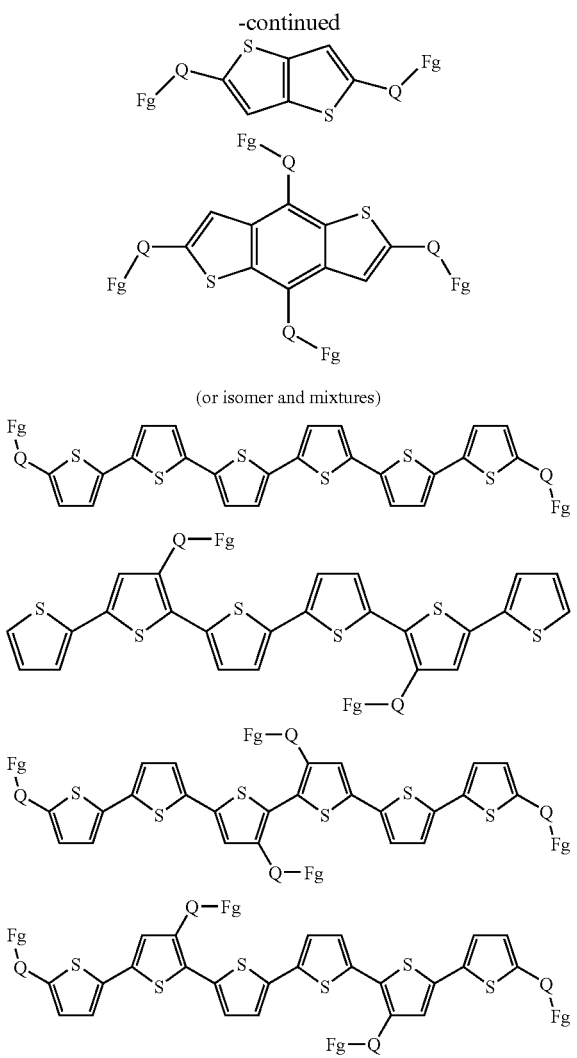

(or isomer and mixtures)

Examples of molecular building blocks comprising perylene bisimide core segments with inclined semiconductor properties may be derived from the chemical structure below:

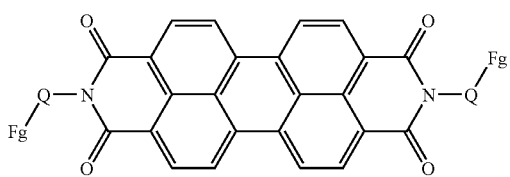

Molecular building blocks comprising tetrathiofulvalene core segments with inclined semiconductor properties may be derived from the list of chemical structures including, for example, those listed below:

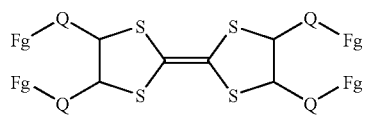

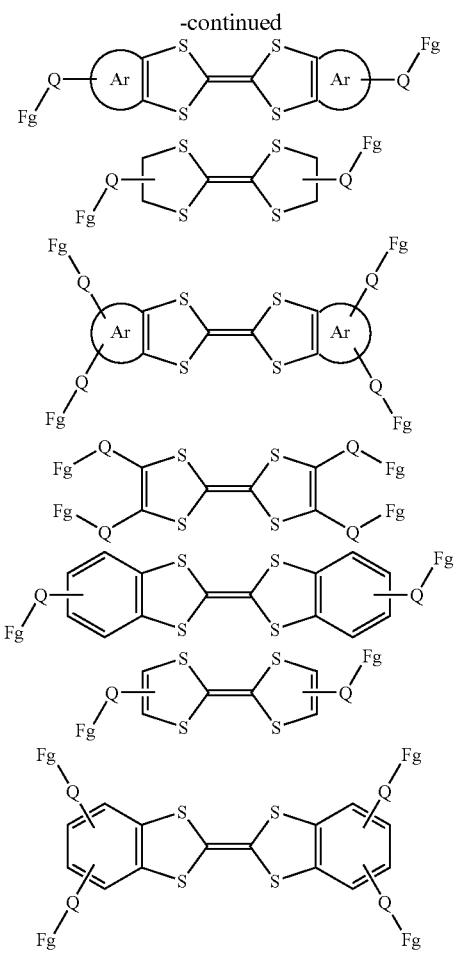

wherein Ar each independently represents an aryl group that optionally contains one or more substituents or a heterocyclic group that optionally contains one or more substituents.

Similarly, the electroactivity of SOFs prepared by these molecular building blocks will depend on the nature of the segments, nature of the linkers, and how the segments are orientated within the SOF. Linkers that favor preferred orientations of the segment moieties in the SOF are expected to lead to higher electroactivity.

Process for Preparing a Structured Organic Film

The process for making SOFs typically comprises a number of activities or steps (set forth below) that may be performed in any suitable sequence or where two or more activities are performed simultaneously or in close proximity in time:

A process for preparing a structured organic film comprising:

(a) preparing a liquid-containing reaction mixture comprising a plurality of molecular building blocks each comprising a segment and a number of functional groups, and a pre-SOF;
(b) depositing the reaction mixture as a wet film;
(c) promoting a change of the wet film including the molecular building blocks to a dry film comprising the SOF comprising a plurality of the segments and a plurality of linkers arranged as a covalent organic framework, wherein at a macroscopic level the covalent organic framework is a film;
(d) optionally removing the SOF from the coating substrate to obtain a free-standing SOF;
(e) optionally processing the free-standing SOF into a roll;

(f) optionally cutting and seaming the SOF into a belt; and
(g) optionally performing the above SOF formation process (es) upon an SOF (which was prepared by the above SOF formation process(es)) as a substrate for subsequent SOF formation process(es).

The above activities or steps may be conducted at atmospheric, super atmospheric, or subatmospheric pressure. The term "atmospheric pressure" as used herein refers to a pressure of about 760 torr. The term "super atmospheric" refers to pressures greater than atmospheric pressure, but less than 20 atm. The term "subatmospheric pressure" refers to pressures less than atmospheric pressure. In an embodiment, the activities or steps may be conducted at or near atmospheric pressure. Generally, pressures of from about 0.1 atm to about 2 atm, such as from about 0.5 atm to about 1.5 atm, or 0.8 atm to about 1.2 atm may be conveniently employed.

Process Action A: Preparation of the Liquid-Containing Reaction Mixture

The reaction mixture comprises a plurality of molecular building blocks that are dissolved, suspended, or mixed in a liquid. The plurality of molecular building blocks may be of one type or two or more types. When one or more of the molecular building blocks is a liquid, the use of an additional liquid is optional. Catalysts may optionally be added to the reaction mixture to enable pre-SOF formation and/or modify the kinetics of SOF formation during Action C described above. The term "pre-SOF" may refer to, for example, at least two molecular building blocks that have reacted and have a molecular weight higher than the starting molecular building block and contain multiple functional groups capable of undergoing further reactions with functional groups of other building blocks or pre-SOFs to obtain a SOF, which may be a substantially defect-free or defect-free SOF, and/or the 'activation' of molecular building block functional groups that imparts enhanced or modified reactivity for the film forming process. Activation may include dissociation of a functional group moiety, pre-association with a catalyst, association with a solvent molecule, liquid, second solvent, second liquid, secondary component, or with any entity that modifies functional group reactivity. In embodiments, pre-SOF formation may include the reaction between molecular building blocks or the 'activation' of molecular building block functional groups, or a combination of the two. The formation of the "pre-SOF" may be achieved by in a number of ways, such as heating the reaction mixture, exposure of the reaction mixture to UV radiation, or any other means of partially reacting the molecular building blocks and/or activating functional groups in the reaction mixture prior to deposition of the wet layer on the substrate. Additives or secondary components may optionally be added to the reaction mixture to alter the physical properties of the resulting SOF.

The reaction mixture components (molecular building blocks, optionally a liquid, optionally catalysts, and optionally additives) are combined in a vessel. The order of addition of the reaction mixture components may vary; however, typically when a process for preparing a SOF includes a pre-SOF or formation of a pre-SOF, the catalyst, when present, may be added to the reaction mixture before depositing the reaction mixture as a wet film. In embodiments, the molecular building blocks may be reacted actinically, thermally, chemically or by any other means with or without the presence of a catalyst to obtain a pre-SOF. The pre-SOF and the molecular building blocks formed in the absence of catalyst may be may be heated in the liquid in the absence of the catalyst to aid the dissolution of the molecular building blocks and pre-SOFs. In embodiments, the pre-SOF and the molecular building blocks formed in the presence of catalyst may be may be heated at a temperature that does not cause significant further reaction of the molecular building blocks and/or the pre-SOFs to aid the dissolution of the molecular building blocks and pre-SOFs. The reaction mixture may also be mixed, stirred, milled, or the like, to ensure even distribution of the formulation components prior to depositing the reaction mixture as a wet film.

In embodiments, the reaction mixture may be heated prior to being deposited as a wet film. This may aid the dissolution of one or more of the molecular building blocks and/or increase the viscosity of the reaction mixture by the partial reaction of the reaction mixture prior to depositing the wet layer to form pre-SOFs. For example, the weight percent of molecular building blocks in the reaction mixture that are incorporated into pre-reacted molecular building blocks pre-SOFs may be less than 20%, such as about 15% to about 1%, or 10% to about 5%. In embodiments, the molecular weight of the 95% pre-SOF molecules is less than 5,000 daltons, such as 2,500 daltons, or 1,000 daltons. The preparation of pre-SOFs may be used to increase the loading of the molecular building blocks in the reaction mixture.

In the case of pre-SOF formation via functional group activation, the molar percentage of functional groups that are activated may be less than 50%, such as about 30% to about 10%, or about 10% to about 5%.

In embodiments, the two methods of pre-SOF formation (pre-SOF formation by the reaction between molecular building blocks or pre-SOF formation by the 'activation' of molecular building block functional groups) may occur in combination and the molecular building blocks incorporated into pre-SOF structures may contain activated functional groups. In embodiments, pre-SOF formation by the reaction between molecular building blocks and pre-SOF formation by the 'activation' of molecular building block functional groups may occur simultaneously.

In embodiments, the duration of pre-SOF formation lasts about 10 seconds to about 48 hours, such as about 30 seconds to about 12 hours, or about 1 minute to 6 hours.

In particular embodiments, the reaction mixture needs to have a viscosity that will support the deposited wet layer. Reaction mixture viscosities range from about 10 to about 50,000 cps, such as from about 25 to about 25,000 cps or from about 50 to about 1000 cps.

The molecular building block loading or "loading" in the reaction mixture is defined as the total weight of the molecular building blocks and optionally the catalysts divided by the total weight of the reaction mixture. Building block loadings may range from about 3 to 100%, such as from about 5 to about 50%, or from about 15 to about 40%. In the case where a liquid molecular building block is used as the only liquid component of the reaction mixture (i.e. no additional liquid is used), the building block loading would be about 100%.

In embodiments, the pre-SOF may be made from building blocks with one or more of the added functionality selected from the group consisting of hydrophobic added functionality, superhydrophobic added functionality, hydrophilic added functionality, lipophobic added functionality, superlipophobic added functionality, lipophilic added functionality, photochromic added functionality, and electroactive added functionality. In embodiments, the inclined property of the molecular building blocks is the same as the added functionality of the pre-SOF. In embodiments, the added functionality of the SOF is not an inclined property of the molecular building blocks.

Liquids used in the reaction mixture may be pure liquids, such as solvents, and/or solvent mixtures. Liquids are used to dissolve or suspend the molecular building blocks and catalyst/modifiers in the reaction mixture. Liquid selection is generally based on balancing the solubility/dispersion of the molecular building blocks and a particular building block loading, the viscosity of the reaction mixture, and the boiling point of the liquid, which impacts the promotion of the wet layer to the dry SOF. Suitable liquids may have boiling points from about 30 to about 300° C., such as from about 65° C. to about 250° C., or from about 100° C. to about 180° C.

Liquids can include molecule classes such as alkanes (hexane, heptane, octane, nonane, decane, cyclohexane, cycloheptane, cyclooctane, decalin); mixed alkanes (hexanes, heptanes); branched alkanes (isooctane); aromatic compounds (toluene, o-, m-, p-xylene, mesitylene, nitrobenzene, benzonitrile, butylbenzene, aniline); ethers (benzyl ethyl ether, butyl ether, isoamyl ether, propyl ether); cyclic ethers (tetrahydrofuran, dioxane), esters (ethyl acetate, butyl acetate, butyl butyrate, ethoxyethyl acetate, ethyl propionate, phenyl acetate, methyl benzoate); ketones (acetone, methyl ethyl ketone, methyl isobutylketone, diethyl ketone, chloroacetone, 2-heptanone), cyclic ketones (cyclopentanone, cyclohexanone), amines (1°, 2°, or 3° amines such as butylamine, diisopropylamine, triethylamine, diisoproylethylamine; pyridine); amides (dimethylformamide, N-methylpyrolidinone, N,N-dimethylformamide); alcohols (methanol, ethanol, n-, i-propanol, n-, t-butanol, 1-methoxy-2-propanol, hexanol, cyclohexanol, 3-pentanol, benzyl alcohol); nitriles (acetonitrile, benzonitrile, butyronitrile), halogenated aromatics (chlorobenzene, dichlorobenzene, hexafluorobenzene), halogenated alkanes (dichloromethane, chloroform, dichloroethylene, tetrachloroethane); and water.

Mixed liquids comprising a first solvent, second solvent, third solvent, and so forth may also be used in the reaction mixture. Two or more liquids may be used to aid the dissolution/dispersion of the molecular building blocks; and/or increase the molecular building block loading; and/or allow a stable wet film to be deposited by aiding the wetting of the substrate and deposition instrument; and/or modulate the promotion of the wet layer to the dry SOF. In embodiments, the second solvent is a solvent whose boiling point or vapor-pressure curve or affinity for the molecular building blocks differs from that of the first solvent. In embodiments, a first solvent has a boiling point higher than that of the second solvent. In embodiments, the second solvent has a boiling point equal to or less than about 100° C., such as in the range of from about 30° C. to about 100° C., or in the range of from about 40° C. to about 90° C., or about 50° C. to about 80° C.

In embodiments, the first solvent, or higher boiling point solvent, has a boiling point equal to or greater than about 65° C., such as in the range of from about 80° C. to about 300° C., or in the range of from about 100° C. to about 250° C., or about 100° C. to about 180° C. The higher boiling point solvent may include, for example, the following (the value in parentheses is the boiling point of the compound): hydrocarbon solvents such as amylbenzene (202° C.), isopropylbenzene (152° C.), 1,2-diethylbenzene (183° C.), 1,3-diethylbenzene (181° C.), 1,4-diethylbenzene (184° C.), cyclohexylbenzene (239° C.), dipentene (177° C.), 2,6-dimethylnaphthalene (262° C.), p-cymene (177° C.), camphor oil (160-185° C.), solvent naphtha (110-200° C.), cis-decalin (196° C.), trans-decalin (187° C.), decane (174° C.), tetralin (207° C.), turpentine oil (153-175° C.), kerosene (200-245° C.), dodecane (216° C.), dodecylbenzene (branched), and so forth; ketone and aldehyde solvents such as acetophenone (201.7° C.), isophorone (215.3° C.), phorone (198-199° C.), methylcyclohexanone (169.0-170.5° C.), methyl n-heptyl ketone (195.3° C.), and so forth; ester solvents such as diethyl phthalate (296.1° C.), benzyl acetate (215.5° C.), γ-butyrolactone (204° C.), dibutyl oxalate (240° C.), 2-ethylhexyl acetate (198.6° C.), ethyl benzoate (213.2° C.), benzyl formate (203° C.), and so forth; diethyl sulfate (208° C.), sulfolane (285° C.), and halohydrocarbon solvents; etherified hydrocarbon solvents; alcohol solvents; ether/acetal solvents; polyhydric alcohol solvents; carboxylic anhydride solvents; phenolic solvents; water; and silicone solvents.

The ratio of the mixed liquids may be established by one skilled in the art. The ratio of liquids a binary mixed liquid may be from about 1:1 to about 99:1, such as from about 1:10 to about 10:1, or about 1:5 to about 5:1, by volume. When n liquids are used, with n ranging from about 3 to about 6, the amount of each liquid ranges from about 1% to about 95% such that the sum of each liquid contribution equals 100%.

In embodiments, the mixed liquid comprises at least a first and a second solvent with different boiling points. In further embodiments, the difference in boiling point between the first and the second solvent may be from about nil to about 150° C., such as from nil to about 50° C. For example, the boiling point of the first solvent may exceed the boiling point of the second solvent by about 1° C. to about 100° C., such as by about 5° C. to about 100° C., or by about 10° C. to about 50° C. The mixed liquid may comprise at least a first and a second solvent with different vapor pressures, such as combinations of high vapor pressure solvents and/or low vapor pressure solvents. The term "high vapor pressure solvent" refers to, for example, a solvent having a vapor pressure of at least about 1 kPa, such as about 2 kPa, or about 5 kPa. The term "low vapor pressure solvent" refers to, for example, a solvent having a vapor pressure of less than about 1 kPa, such as about 0.9 kPa, or about 0.5 kPa. In embodiments, the first solvent may be a low vapor pressure solvent such as, for example, terpineol, diethylene glycol, ethylene glycol, hexylene glycol, N-methyl-2-pyrrolidone, and tri(ethylene glycol)dimethyl ether. A high vapor pressure solvent allows rapid removal of the solvent by drying and/or evaporation at temperatures below the boiling point. High vapor pressure solvents may include, for example, acetone, tetrahydrofuran, toluene, xylene, ethanol, methanol, 2-butanone and water.

In embodiments where mixed liquids comprising a first solvent, second solvent, third solvent, and so forth are used in the reaction mixture, promoting the change of the wet film and forming the dry SOF may comprise, for example, heating the wet film to a temperature above the boiling point of the reaction mixture to form the dry SOF film; or heating the wet film to a temperature above the boiling point of the second solvent (below the temperature of the boiling point of the first solvent) in order to remove the second solvent while substantially leaving the first solvent and then after substantially removing the second solvent, removing the first solvent by heating the resulting composition at a temperature either above or below the boiling point of the first solvent to form the dry SOF film; or heating the wet film below the boiling point of the second solvent in order to remove the second solvent (which is a high vapor pressure solvent) while substantially leaving the first solvent and, after removing the second solvent, removing the first solvent by heating the resulting composition at a temperature either above or below the boiling point of the first solvent to form the dry SOF film.

The term "substantially removing" refers to, for example, the removal of at least 90% of the respective solvent, such as about 95% of the respective solvent. The term. "substantially leaving" refers to, for example, the removal of no more than 2% of the respective solvent, such as removal of no more than 1% of the respective solvent.

These mixed liquids may be used to slow or speed up the rate of conversion of the wet layer to the SOF in order to manipulate the characteristics of the SOFs. For example, in condensation and addition/elimination linking chemistries, liquids such as water, 1°, 2°, or 3° alcohols (such as methanol, ethanol, propanol, isopropanol, butanol, 1-methoxy-2-propanol, tert-butanol) may be used.

Optionally a catalyst may be present in the reaction mixture to assist the promotion of the wet layer to the dry SOF. Selection and use of the optional catalyst depends on the functional groups on the molecular building blocks. Catalysts may be homogeneous (dissolved) or heterogeneous (undissolved or partially dissolved) and include Brönsted acids (HCl (aq), acetic acid, p-toluenesulfonic acid, amine-protected p-toluenesulfonic acid such as pyrridium p-toluenesulfonate, trifluoroacetic acid); Lewis acids (boron trifluoroetherate, aluminum trichloride); Brönsted bases (metal hydroxides such as sodium hydroxide, lithium hydroxide, potassium hydroxide; 1°, 2°, or 3° amines such as butylamine, diisopropylamine, triethylamine, diisoproylethylamine); Lewis bases (N,N-dimethyl-4-aminopyridine); metals (Cu bronze); metal salts ($FeCl_3$, $AuCl_3$); and metal complexes (ligated palladium complexes, ligated ruthenium catalysts). Typical catalyst loading ranges from about 0.01% to about 25%, such as from about 0.1% to about 5% of the molecular building block loading in the reaction mixture. The catalyst may or may not be present in the final SOF composition.

Optionally additives or secondary components, such as dopants, may be present in the reaction mixture and wet layer. Such additives or secondary components may also be integrated into a dry SOF. Additives or secondary components can be homogeneous or heterogeneous in the reaction mixture and wet layer or in a dry SOF. The terms "additive" or "secondary component," refer, for example, to atoms or molecules that are not covalently bound in the SOF, but are randomly distributed in the composition. In embodiments, secondary components such as conventional additives may be used to take advantage of the known properties associated with such conventional additives. Such additives may be used to alter the physical properties of the SOF such as electrical properties (conductivity, semiconductivity, electron transport, hole transport), surface energy (hydrophobicity, hydrophilicity), tensile strength, and thermal conductivity; such additives may include impact modifiers, reinforcing fibers, lubricants, antistatic agents, coupling agents, wetting agents, antifogging agents, flame retardants, ultraviolet stabilizers, antioxidants, biocides, dyes, pigments, odorants, deodorants, nucleating agents and the like.

In embodiments, the SOF may contain antioxidants as a secondary component to protect the SOF from oxidation. Examples of suitable antioxidants include (1) N,N'-hexamethylene bis(3,5-di-tert-butyl-4-hydroxy hydrocinnamamide) (IRGANOX 1098, available from Ciba-Geigy Corporation), (2) 2,2-bis(4-(2-(3,5-di-tert-butyl-4-hydroxyhydrocinnamoyloxy))ethoxyphenyl)propane (TOPANOL-205, available from ICI America Corporation), (3) tris(4-tert-butyl-3-hydroxy-2,6-dimethyl benzyl)isocyanurate (CYANOX 1790, 41,322-4, LTDP, Aldrich D12,840-6), (4) 2,2'-ethylidene bis(4,6-di-tert-butylphenyl)fluoro phosphonite (ETHANOX-398, available from Ethyl Corporation), (5) tetrakis(2,4-di-tert-butylphenyl)-4,4'-biphenyl diphosphonite (ALDRICH 46,852-5; hardness value 90), (6) pentaerythritol tetrastearate (TCI America #PO739), (7) tributylammonium hypophosphite (Aldrich 42,009-3), (8) 2,6-di-tert-butyl-4-methoxyphenol (Aldrich 25,106-2), (9) 2,4-di-tert-butyl-6-(4-methoxybenzyl)phenol (Aldrich 23,008-1), (10) 4-bromo-2,6-dimethylphenol (Aldrich 34,951-8), (11) 4-bromo-3,5-didimethylphenol (Aldrich B6,420-2), (12) 4-bromo-2-nitrophenol (Aldrich 30,987-7), (13) 4-(diethyl aminomethyl)-2,5-dimethylphenol (Aldrich 14,668-4), (14) 3-dimethylaminophenol (Aldrich D14,400-2), (15) 2-amino-4-Cert-amylphenol (Aldrich 41,258-9), (16) 2,6-bis(hydroxymethyl)-p-cresol (Aldrich 22,752-8), (17) 2,2'-methylenediphenol (Aldrich B4,680-8), (18) 5-(diethylamino)-2-nitrosophenol (Aldrich 26,951-4), (19) 2,6-dichloro-4-fluorophenol (Aldrich 28,435-1), (20) 2,6-dibromo fluorophenol (Aldrich 26,003-7), (21) a trifluoro-o-cresol (Aldrich 21,979-7), (22) 2-bromo-4-fluorophenol (Aldrich 30,246-5), (23) 4-fluorophenol (Aldrich F1,320-7), (24) 4-chlorophenyl-2-chloro-1,1,2-tri-fluoroethyl sulfone (Aldrich 13,823-1), (25) 3,4-difluorophenylacetic acid (Aldrich 29,043-2), (26) 3-fluorophenylacetic acid (Aldrich 24,804-5), (27) 3,5-difluoro phenylacetic acid (Aldrich 29,044-0), (28) 2-fluorophenylacetic acid (Aldrich 20,894-9), (29) 2,5-bis(trifluoromethyl)benzoic acid (Aldrich 32,527-9), (30) ethyl-2-(4-(4-(trifluoromethyl)phenoxy)phenoxy)propionate (Aldrich 25,074-0), (31) tetrakis(2,4-ditent-butyl phenyl)-4,4'-biphenyl diphosphonite (Aldrich 46,852-5), (32) 4-tert-amyl phenol (Aldrich 15,384-2), (33) 3-(2H-benzotriazol-2-yl)-4-hydroxy phenethylalcohol (Aldrich 43,071-4), NAUGARD 76, NAUGARD 445, NAUGARD 512, and NAUGARD 524 (manufactured by Uniroyal Chemical Company), and the like, as well as mixtures thereof. The antioxidant, when present, may be present in the SOF composite in any desired or effective amount, such as from about 0.25 percent to about 10 percent by weight of the SOF or from about 1 percent to about 5 percent by weight of the SOF.

In embodiments, the SOF may further comprise any suitable polymeric material known in the art as a secondary component, such as polycarbonates, acrylate polymers, vinyl polymers, cellulose polymers, polyesters, polysiloxanes, polyamides, polyurethanes, polystyrenes, polystyrene, polyolefins, fluorinated hydrocarbons (fluorocarbons), and engineered resins as well as block, random or alternating copolymers thereof. The SOF composite may comprise homopolymers, higher order polymers, or mixtures thereof, and may comprise one species of polymeric material or mixtures of multiple species of polymeric material, such as mixtures of two, three, four, five or more multiple species of polymeric material. In embodiments, suitable examples of the about polymers include, for example, crystalline and amorphous polymers, or a mixtures thereof. In embodiments, the polymer is a fluoroelastomer.

Suitable fluoroelastomers are those described in detail in U.S. Pat. Nos. 5,166,031, 5,281,506, 5,366,772, 5,370,931, 4,257,699, 5,017,432 and 5,061,965, the disclosures each of which are incorporated by reference herein in their entirety. The amount of fluoroelastomer compound present in the SOF, in weight percent total solids, is from about 1 to about 50 percent, or from about 2 to about 10 percent by weight of the SOF. Total solids, as used herein, includes the amount of secondary components and SOF.

In embodiments, examples of styrene-based monomer and acrylate-based monomers include, for example, poly(styrene-alkyl acrylate), poly(styrene-1,3-diene), polystyrene-alkyl methacrylate), poly(styrene-alkyl acrylate-acrylic acid), poly(styrene-1,3-diene-acrylic acid), poly(styrene-alkyl methacrylate-acrylic acid), poly(alkyl methacrylate-alkyl acrylate), poly(alkyl methacrylate-aryl acrylate), poly(aryl methacrylate-alkyl acrylate), poly(alkyl methacrylate-acrylic acid), poly(styrene-alkyl acrylate-acrylonitrile-acrylic acid), poly(styrene-1,3-diene-acrylonitrile-acrylic acid), poly(alkyl acrylate-acrylonitrile-acrylic acid), poly (styrene-butadiene), poly(methylstyrene-butadiene), poly (methyl methacrylate-butadiene), poly(ethyl methacrylate-butadiene), poly(propyl methacrylate-butadiene), poly(butyl methacrylate-butadiene), poly(methyl acrylate-butadiene), poly(ethyl acrylate-butadiene), poly(propyl acrylate-butadiene), poly(butyl acrylate-butadiene), poly(styrene-isoprene), poly(methylstyrene-isoprene), poly(methyl methacrylate-isoprene), poly(ethyl methacrylate-isoprene), poly(propyl methacrylate-isoprene), poly(butyl methacrylate-isoprene), poly(methyl acrylate-isoprene), poly(ethyl acrylate-isoprene), poly(propyl acrylate-isoprene), and poly(butyl acrylate-isoprene); poly(styrene-propyl acrylate), poly(styrene-butyl acrylate), poly(styrene-butadiene-acrylic acid), poly(styrene-butadiene-methacrylic acid), poly(styrene-butadiene-acrylonitrile-acrylic acid), poly(styrene-butyl acrylate-acrylic acid), poly(styrene-butyl acrylate-methacrylic acid), poly(styrene-butyl acrylate-acrylonitrile), poly(styrene-butyl acrylate-acrylonitrile-acrylic acid), and other similar polymers.

Further examples of the various polymers that are suitable for use as a secondary component in SOFs include polyethylene terephthalate, polybutadienes, polysulfones, polyarylethers, polyarylsulfones, polyethersulfones, polycarbonates, polyethylenes, polypropylenes, polydecene, polydodecene, polytetradecene, polyhexadecene, polyoctadene, and polycyclodecene, polyolefin copolymers, mixtures of polyolefins, functional polyolefins, acidic polyolefins, branched polyolefins, polymethylpentenes, polyphenylene sulfides, polyvinyl acetates, polyvinylbutyrals, polysiloxanes, polyacrylates, polyvinyl acetals, polyamides, polyimides, polystyrene and acrylonitrile copolymers, polyvinylchlorides, polyvinyl alcohols, poly-N-vinylpyrrolidinone)s, vinylchloride and vinyl acetate copolymers, acrylate copolymers, poly(amideimide), styrene-butadiene copolymers, vinylidenechloride-vinylchloride copolymers, vinylacetate-vinylidenechloride copolymers, polyvinylcarbazoles, polyethylene-terephthalate, polypropylene-terephthalate, polybutylene-terephthalate, polypentylene-terephthalate, polyhexalene-terephthalate, polyheptadene-terephthalate, polyoctadene-terephthalate, polyethylene-sebacate, polypropylene sebacate, polybutylene-sebacate, polyethylene-adipate, polypropylene-adipate, polybutylene-adipate, polypentylene-adipate, polyhexalene-adipate, polyheptadene-adipate, polyoctalene-adipate, polyethylene-glutarate, polypropylene-glutarate, polybutylene-glutarate, polypentylene-glutarate, polyhexalene-glutarate, polyheptadene-glutarate, polyoctalene-glutarate polyethylene-pimelate, polypropylene-pimelate, polybutylene-pimelate, polypentylene-pimelate, polyhexalene-pimelate, polyheptadene-pimelate, poly(propoxylated bisphenol-fumarate), poly(propoxylated bisphenol-succinate), poly(propoxylated bisphenol-adipate), poly(propoxylated bisphenol-glutarate), SPAR™ (Dixie Chemicals), BECKOSOL™ (Reichhold Chemical Inc), ARAKOTE™ (Ciba-Geigy Corporation), HETRON™ (Ashland Chemical), PARAPLEX™ (Rohm & Hass), POLYLITE™ (Reichhold Chemical Inc), PLASTHALL™ (Rohm & Hass), CYGAL™ (American Cyanamide), ARMCO™ (Armco Composites), ARPOL™ (Ashland Chemical), CELANEX™ (Celanese Eng), RYNITE™ (DuPont), STYPOL™ (Freeman Chemical Corporation) mixtures thereof and the like.

In embodiments, the secondary components, including polymers may be distributed homogeneously, or heterogeneously, such as in a linear or nonlinear gradient in the SOF. In embodiments, the polymers may be incorporated into the SOF in the form of a fiber, or a particle whose size may range from about 50 nm to about 2 mm. The polymers, when present, may be present in the SOF composite in any desired or effective amount, such as from about 1 percent to about 50 percent by weight of the SOF or from about 1 percent to about 15 percent by weight of the SOF.

In embodiments, the SOF may further comprise carbon nanotubes or nanofiber aggregates, which are microscopic particulate structures of nanotubes, as described in U.S. Pat. Nos. 5,165,909; 5,456,897; 5,707,916; 5,877,110; 5,110,693; 5,500,200 and 5,569,635, all of which are hereby entirely incorporated by reference.

In embodiments, the SOF may further comprise metal particles as a secondary component; such metal particles include noble and non-noble metals and their alloys. Examples of suitable noble metals include, aluminum, titanium, gold, silver, platinum, palladium and their alloys. Examples of suitable non-noble metals include, copper, nickel, cobalt, lead, iron, bismuth, zinc, ruthenium, rhodium, rubidium, indium, and their alloys. The size of the metal particles may range from about 1 nm to 1 mm and their surfaces may be modified by stabilizing molecules or dispersant molecules or the like. The metal particles, when present, may be present in the SOF composite in any desired or effective amount, such as from about 0.25 percent to about 70 percent by weight of the SOF or from about 1 percent to about 15 percent by weight of the SOF.

In embodiments, the SOF may further comprise oxides and sulfides as a secondary components. Examples of suitable metal oxides include, titanium dioxide (titania, rutile and related polymorphs), aluminum oxide including alumina, hydradated alumina, and the like, silicon oxide including silica, quartz, cristobalite, and the like, aluminosilicates including zeolites, talcs, and clays, nickel oxide, iron oxide, cobalt oxide. Other examples of oxides include glasses, such as silica glass, borosilicate glass, aluminosilicate glass and the like. Examples of suitable sulfides include nickel sulfide, lead sulfide, cadmium sulfide, tin sulfide, and cobalt sulfide. The diameter of the oxide and sulfide materials may range from about 50 nm to 1 mm and their surfaces may be modified by stabilizing molecules or dispersant molecules or the like. The oxides, when present, may be present in the SOF composite in any desired or effective amount, such as from about 0.25 percent to about 20 percent by weight of the SOF or from about 1 percent to about 15 percent by weight of the SOF.

In embodiments, the SOF may further comprise metalloid or metal-like elements from the periodic table. Examples of suitable metalloid elements include, silicon, selenium, tellurium, tin, lead, germanium, gallium, arsenic, antimony and their alloys or intermetallics. The size of the metal particles may range from about 10 nm to 1 mm and their surfaces may be modified by stabilizing molecules or dispersant molecules or the like. The metalloid particles, when present, may be present in the SOF composite in any desired or effective amount, such as from about 0.25 percent to about 10 percent by weight of the SOF or from about 1 percent to about 5 percent by weight of the SOF.

In embodiments, the SOF may further comprise hole transport molecules or electron acceptors as a secondary component, such charge transport molecules include for example a positive hole transporting material selected from compounds having in the main chain or the side chain a polycyclic aromatic ring such as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and hydrazone compounds. Typical hole transport materials include electron donor materials, such as carbazole; N-ethyl carbazole; N-isopropyl carbazole; N-phenyl carbazole; tetraphenylpyrene; 1-methyl pyrene; perylene; chrysene; anthracene; tetraphene; 2-phenyl naphthalene; azopyrene;

1-ethyl pyrene; acetyl pyrene; 2,3-benzochrysene; 2,4-benzopyrene; 1,4-bromopyrene; poly(N-vinylcarbazole); poly(vinylpyrene); poly(vinyltetraphene); poly(vinyltetracene) and poly(vinylperylene). Suitable electron transport materials include electron acceptors such as 2,4,7-trinitro-9-fluorenone; 2,4,5,7-tetranitro-fluorenone; dinitroanthracene; dinitroacridene; tetracyanopyrene; dinitroanthraquinone; and butylcarbonylfluorenemalononitrile, see U.S. Pat. No. 4,921,769 the disclosure of which is incorporated herein by reference in its entirety. Other hole transporting materials include arylamines described in U.S. Pat. No. 4,265,990 the disclosure of which is incorporated herein by reference in its entirety, such as N,N'-diphenyl-N,N'-bis(alkylphenyl)-(1,1'-biphenyl)-4,4'-diamine wherein alkyl is selected from the group consisting of methyl, ethyl, propyl, butyl, hexyl, and the like. Hole transport molecules of the type described in, for example, U.S. Pat. Nos. 4,306,008; 4,304,829; 4,233,384; 4,115,116; 4,299,897; 4,081,274, and 5,139,910, the entire disclosures of each are incorporated herein by reference. Other known charge transport layer molecules may be selected, reference for example U.S. Pat. Nos. 4,921,773 and 4,464,450 the disclosures of which are incorporated herein by reference in their entireties. The hole transport molecules or electron acceptors, when present, may be present in the SOF composite in any desired or effective amount, such as from about 0.25 percent to about 50 percent by weight of the SOF or from about 1 percent to about 20 percent by weight of the SOF.

In embodiments, the SOF may further comprise biocides as a secondary component. Biocides may be present in amounts of from about 0.1 to about 1.0 percent by weight of the SOF. Suitable biocides include, for example, sorbic acid, 1-(3-chloroallyl)-3,5,7-triaza-1-azoniaadamantane chloride, commercially available as DOWICIL 200 (Dow Chemical Company), vinylene-bis thiocyanate, commercially available as CYTOX 3711 (American Cyanamid Company), disodium ethylenebis-dithiocarbamate, commercially available as DITHONE D14 (Rohm & Haas Company), bis(trichloromethyl)sulfone, commercially available as BIOCIDE N-1386 (Stauffer Chemical Company), zinc pyridinethione, commercially available as zinc omadine (Olin Corporation), 2-bromo-t-nitropropane-1,3-diol, commercially available as ONYXIDE 500 (Onyx Chemical Company), BOSQUAT MB50 (Louza, Inc.), and the like.

In embodiments, the SOF may further comprise small organic molecules as a secondary component; such small organic molecules include those discussed above with respect to the first and second solvents. The small organic molecules, when present, may be present in the SOF in any desired or effective amount, such as from about 0.25 percent to about 50 percent by weight of the SOF or from about 1 percent to about 10 percent by weight of the SOF.

When present, the secondary components or additives may each, or in combination, be present in the composition in any desired or effective amount, such as from about 1 percent to about 50 percent by weight of the composition or from about 1 percent to about 20 percent by weight of the composition.

When SOFs are modified with secondary components (dopants and additives, such as, hole transport molecules (mTBD), polymers (polystyrene), nanoparticles (C60 Buckminster fullerene), small organic molecules (biphenyl), metal particles (copper micropowder), and electron acceptors (quinone)) to give composite structured organic films. Secondary components may be introduced to the liquid formulation that is used to generate a wet film in which a change is promoted to form the SOF. Secondary components (dopants, additives, etc.) may either be dissolved or undissolved (suspended) in the reaction mixture. Secondary components are not bonded into the network of the film. For example, a secondary component may be added to a reaction mixture that contains a plurality of building blocks having four methoxy groups (—OMe) on a segment, such as N4,N4,N4',N4'-tetra-p-tolylbiphenyl-4,4'-diamine, which upon promotion of a change in the wet film, exclusively react with the two alcohol (—OH) groups on a building block, such as 1,4-benzenedimethanol, which contains ap-xylyl segment. The chemistry that is occurring to link building blocks is an acid catalyzed transetherfication reaction. Because —OH groups will only react with —OMe groups (and vice versa) and not with the secondary component, these molecular building blocks can only follow one pathway. Therefore, the SOF is programmed to order molecules in a way that leaves the secondary component incorporated within and/or around the SOF structure. This ability to pattern molecules and incorporate secondary components affords superior performance and unprecedented control over properties compared to conventional polymers and available alternatives.

In embodiments, the secondary components may have similar or disparate properties to accentuate or hybridize (synergistic effects or ameliorative effects as well as the ability to attenuate inherent or inclined properties of the SOF) the intended property of the SOF to enable it to meet performance targets. For example, doping the SOFs with antioxidant compounds will extend the life of the SOF by preventing chemical degradation pathways. Additionally, additives maybe added to improve the morphological properties of the SOF by tuning the reaction occurring during the promotion of the change of the reaction mixture to form the SOF.

Process Action B: Depositing the Reaction Mixture as a Wet Film

The reaction mixture may be applied as a wet film to a variety of substrates using a number of liquid deposition techniques. The thickness of the SOF is dependant on the thickness of the wet film and the molecular building block and/or pre-SOF loading in the reaction mixture. The thickness of the wet film is dependent on the viscosity of the reaction mixture and the method used to deposit the reaction mixture as a wet film. In embodiments, the thickness of the wet layer may be greater than 100 nm, such as in the range from about 200 nm to about 5 mm, or about 500 nm to about 50 microns.

Substrates include, for example, polymers, papers, metals and metal alloys, doped and undoped forms of elements from Groups III-VI of the periodic table, metal oxides, metal chalcogenides, and previously prepared SOF films. Examples of polymer film substrates include polyesters, polyolefins, polycarbonates, polystyrenes, polyvinylchloride, block and random copolymers thereof, and the like. Examples of metallic surfaces include metallized polymers, metal foils, metal plates; mixed material substrates such as metals patterned or deposited on polymer, semiconductor, metal oxide, or glass substrates. Examples of substrates comprised of doped and undoped elements from Groups III-VI of the periodic table include, aluminum, silicon, silicon n-doped with phosphorous, silicon p-doped with boron, tin, gallium arsenide, lead, gallium indium phosphide, and indium. Examples of metal oxides include silicon dioxide, titanium dioxide, indium tin oxide, tin dioxide, selenium dioxide, and alumina. Examples of metal chalcogenides include cadmium sulfide, cadmium telluride, and zinc selenide. Additionally, it is appreciated that chemically treated or mechanically modified forms of the above substrates remain within the scope of surfaces which may be coated with the reaction mixture.

In embodiments, the substrate may be composed of, for example, silicon, glass plate, plastic film or sheet. For structurally flexible devices, a plastic substrate such as polyester, polycarbonate, polyimide sheets and the like may be used. The thickness of the substrate may be from around 10 micrometers to over 10 millimeters with an exemplary thickness being from about 50 to about 100 micrometers, especially for a flexible plastic substrate, and from about 1 to about 10 millimeters for a rigid substrate such as glass or silicon.

The reaction mixture may be applied to the substrate using a number of liquid deposition techniques including, for example, spin coating, blade coating, web coating, dip coating, cup coating, rod coating, screen printing, ink jet printing, spray coating, stamping and the like. The method used to deposit the wet layer depends on the nature, size, and shape of the substrate and the desired wet layer thickness. The thickness of the wet layer can range from about 10 nm to about 5 mm, such as from about 100 nm to about 1 mm, or from about 1 μm to about 500 μm.

In embodiments, the secondary component may be introduced following completion of the above described process action B. The incorporation of the secondary component in this way may be accomplished by any means that serves to distribute the secondary component homogeneously, heterogeneously, or as a specific pattern over the wet film. Following introduction of the secondary component subsequent process actions may be carried out resuming with process action C.

For example, following completion of process action B (i.e., after the reaction mixture may be applied to the substrate), secondary components (dopants, additives, etc.) may be added to the wet layer by any suitable method, such as by distributing (e.g., dusting, spraying, pouring, sprinkling, etc, depending on whether the secondary component is a particle, powder or liquid) the secondary component on the top the wet layer. The secondary components may be applied to the formed wet layer in a homogeneous or heterogeneous manner, including various patterns, wherein the concentration or density of the secondary component is reduced in specific areas, such as to form a pattern of alternating bands of high and low concentrations of the secondary component of a given width on the wet layer. In embodiments, the application of the secondary component to the top of the wet layer may result in a portion of the secondary component diffusing or sinking into the wet layer and thereby forming a heterogeneous distribution of secondary components within the thickness of the SOF, such that a linear or nonlinear concentration gradient may be obtained in the resulting SOF obtained after promotion of the change of the wet layer to a dry SOF. In embodiments, a secondary component may be added to the top surface of a deposited wet layer, which upon promotion of a change in the wet film, results in an SOF having an heterogeneous distribution of the secondary component in the dry SOF. Depending on the density of the wet film and the density of the secondary component, a majority of the secondary component may end up in the upper half (which is opposite the substrate) of the dry SOF or a majority of the secondary component may end up in the lower half (which is adjacent to the substrate) of the dry SOF.

Process Action C: Promoting the Change of Wet Film to the Dry SOF

The term "promoting" refers, for example, to any suitable technique to facilitate a reaction of the molecular building blocks and/or pre-SOFs, such as a chemical reaction of the functional groups of the building blocks and/or pre-SOFs. In the case where a liquid needs to be removed to form the dry film, "promoting" also refers to removal of the liquid. Reaction of the molecular building blocks and/or pre-SOFs and removal of the liquid can occur sequentially or concurrently. In certain embodiments, the liquid is also one of the molecular building blocks and is incorporated into the SOF. The term "dry SOF" refers, for example, to substantially dry SOFs, for example, to a liquid content less than about 5% by weight of the SOF, or to a liquid content less than 2% by weight of the SOF.

Promoting the wet layer to form a dry SOF may be accomplished by any suitable technique. Promoting the wet layer to form a dry SOF typically involves thermal treatment including, for example, oven drying, infrared radiation (IR), and the like with temperatures ranging from 40 to 350° C. and from 60 to 200° C. and from 85 to 160° C. The total heating time can range from about four seconds to about 24 hours, such as from one minute to 120 minutes, or from three minutes to 60 minutes.

IR promotion of the wet layer to the COF film may be achieved using an IR heater module mounted over a belt transport system. Various types of IR emitters may be used, such as carbon IR emitters or short wave IR emitters (available from Heraerus). Additional exemplary information regarding carbon JR emitters or short wave IR emitters is summarized in the following Table.

| IR lamp | Peak Wavelength | Number of lamps | Module Power (kW) |
|---|---|---|---|
| Carbon | 2.0 micron | 2 - twin tube | 4.6 |
| Short wave | 1.2-1.4 micron | 3 - twin tube | 4.5 |

Process Action D: Optionally Removing the SOF from the Coating Substrate to Obtain a Free-Standing SOF In embodiments, a free-standing SOF is desired. Free-standing SOFs may be obtained when an appropriate low adhesion substrate is used to support the deposition of the wet layer. Appropriate substrates that have low adhesion to the SOF may include, for example, metal foils, metalized polymer substrates, release papers and SOFs, such as SOFs prepared with a surface that has been altered to have a low adhesion or a decreased propensity for adhesion or attachment. Removal of the SOF from the supporting substrate may be achieved in a number of ways by someone skilled in the art. For example, removal of the SOF from the substrate may occur by starting from a corner or edge of the film and optionally assisted by passing the substrate and SOF over a curved surface.

Process Action E: Optionally Processing the Free-Standing SOF into a Roll

Optionally, a free-standing SOF or a SOF supported by a flexible substrate may be processed into a roll. The SOF may be processed into a roll for storage, handling, and a variety of other purposes. The starting curvature of the roll is selected such that the SOF is not distorted or cracked during the rolling process.

Process Action F: Optionally Cutting and Seaming the SOF into a Shape, such as a Belt The method for cutting and seaming the SOF is similar to that described in U.S. Pat. No. 5,455,136 issued on Oct. 3, 1995 (for polymer films), the disclosure of which is herein totally incorporated by reference. An SOF belt may be fabricated from a single SOF, a multi layer SOF or an SOF sheet cut from a web. Such sheets may be rectangular in shape or any particular shape as desired. All sides of the SOF(s) may be of the same length, or one pair of parallel sides may be longer than the other pair of parallel sides. The SOF(s) may be fabricated into shapes, such as a belt by overlap joining the opposite marginal end regions of the SOF sheet. A seam is typically produced in the overlapping marginal end regions at the point of joining. Joining may be affected by any suitable means. Typical joining techniques include, for example, welding (including ultrasonic), gluing, taping, pressure heat fusing and the like. Methods, such as ultrasonic welding, are desirable general methods of joining flexible sheets because of their speed, cleanliness (no solvents) and production of a thin and narrow seam.

Process Action G: Optionally using a SOF as a Substrate for Subsequent SOF Formation Processes A SOF may be used as a substrate in the SOF forming process to afford a multi-layered structured organic film. The layers of a multi-layered SOF may be chemically bound in or in physical contact. Chemically bound, multi-layered SOFs are formed when functional groups present on the substrate SOF surface can react with the molecular building blocks present in the deposited wet layer used to form the second structured organic film layer. Multi-layered SOFs in physical contact may not chemically bound to one another.

A SOF substrate may optionally be chemically treated prior to the deposition of the wet layer to enable or promote chemical attachment of a second SOF layer to form a multi-layered structured organic film.

Alternatively, a SOF substrate may optionally be chemically treated prior to the deposition of the wet layer to disable chemical attachment of a second SOF layer (surface pacification) to form a physical contact multi-layered SOF.

Other methods, such as lamination of two or more SOFs, may also be used to prepare physically contacted multi-layered SOFs.

Applications of SOFs

SOFs may be used in for instance electronic devices such as solar cells, radio frequency identification tags, organic light emitting devices, photoreceptors, thin film transistors and the like.

Application A: SOFs in Photoreceptor Layers

Figure 2:
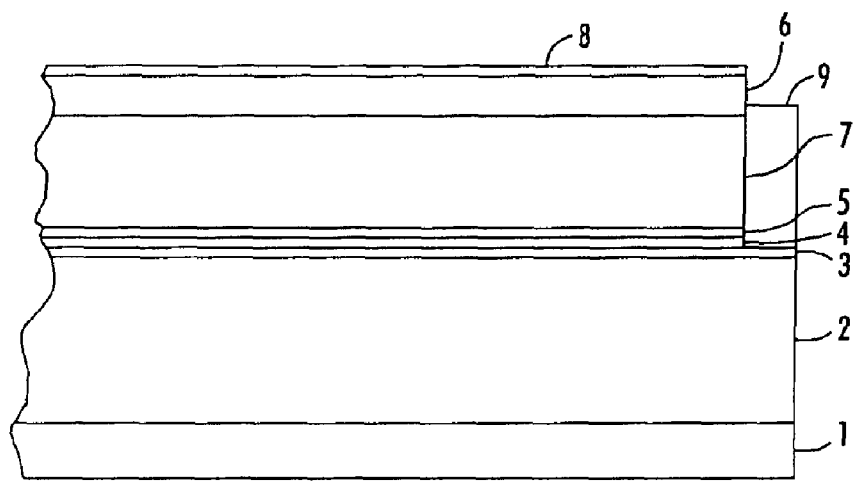
FIG. 2 represents a simplified side view of a second exemplary photoreceptor that incorporates a SOF of the present disclosure.
Figure 3:
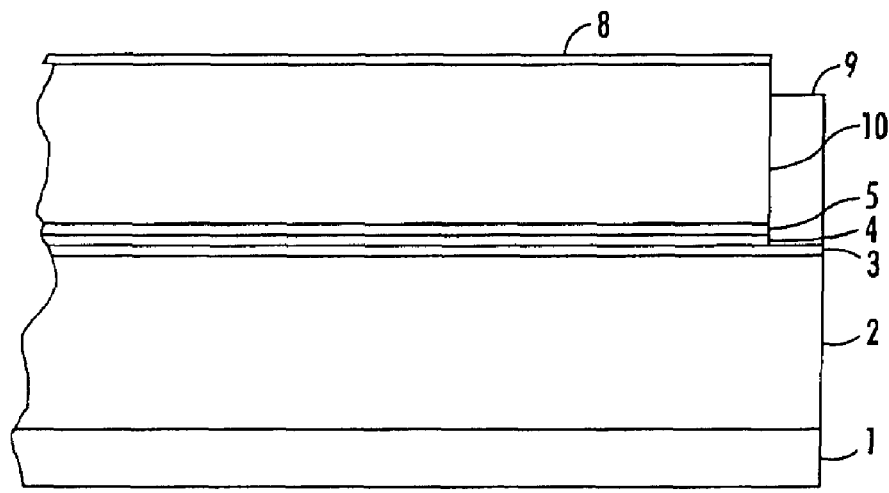
FIG. 3 represents a simplified side view of a third exemplary photoreceptor that incorporates a SOF of the present disclosure.

Representative structures of an electrophotographic imaging member (e.g., a photoreceptor) are shown in FIGS. 1-3. These imaging members are provided with an anti-curl layer 1, a supporting substrate 2, an electrically conductive ground plane 3, a charge blocking layer 4, an adhesive layer 5, a charge generating layer 6, a charge transport layer 7, an overcoating layer 8, and a ground strip 9. In FIG. 3, imaging layer 10 (containing both charge generating material and charge transport material) takes the place of separate charge generating layer 6 and charge transport layer 7.

As seen in the figures, in fabricating a photoreceptor, a charge generating material (CGM) and a charge transport material (CTM) may be deposited onto the substrate surface either in a laminate type configuration where the CGM and CTM are in different layers (e.g., FIGS. 1 and 2) or in a single layer configuration where the CGM and CTM are in the same layer (e.g., FIG. 3). In embodiments, the photoreceptors may be prepared by applying over the electrically conductive layer the charge generation layer 6 and, optionally, a charge transport layer 7. In embodiments, the charge generation layer and, when present, the charge transport layer, may be applied in either order.

Anti Curl Layer

For some applications, an optional anti-curl layer 1, which comprises film-forming organic or inorganic polymers that are electrically insulating or slightly semi-conductive, may be provided. The anti-curl layer provides flatness and/or abrasion resistance.

Anti-curl layer 1 may be formed at the back side of the substrate 2, opposite the imaging layers. The anti-curl layer may include, in addition to the film-forming resin, an adhesion promoter polyester additive. Examples of film-forming resins useful as the anti-curl layer include, but are not limited to, polyacrylate, polystyrene, poly(4,4'-isopropylidene diphenylcarbonate), poly(4,4'-cyclohexylidene diphenylcarbonate), mixtures thereof and the like.

Additives may be present in the anti-curl layer in the range of about 0.5 to about 40 weight percent of the anti-curl layer. Additives include organic and inorganic particles that may further improve the wear resistance and/or provide charge relaxation property. Organic particles include Teflon powder, carbon black, and graphite particles. Inorganic particles include insulating and semiconducting metal oxide particles such as silica, zinc oxide, tin oxide and the like. Another semiconducting additive is the oxidized oligomer salts as described in U.S. Pat. No. 5,853,906. The oligomer salts are oxidized N,N,N',N'-tetra-p-tolyl-4,4'-biphenyldiamine salt.

Typical adhesion promoters useful as additives include, but are not limited to, duPont 49,000 (duPont), Vitel PE-100, Vitel PE-200, Vitel PE-307 (Goodyear), mixtures thereof and the like. Usually from about 1 to about 15 weight percent adhesion promoter is selected for film-forming resin addition, based on the weight of the film-forming resin.

The thickness of the anti-curl layer is typically from about 3 micrometers to about 35 micrometers, such as from about 10 micrometers to about 20 micrometers, or about 14 micrometers.

The anti-curl coating may be applied as a solution prepared by dissolving the film-forming resin and the adhesion promoter in a solvent such as methylene chloride. The solution may be applied to the rear surface of the supporting substrate (the side opposite the imaging layers) of the photoreceptor device, for example, by web coating or by other methods known in the art. Coating of the overcoat layer and the anti-curl layer may be accomplished simultaneously by web coating onto a multilayer photoreceptor comprising a charge transport layer, charge generation layer, adhesive layer, blocking layer, ground plane and substrate. The wet film coating is then dried to produce the anti-curl layer 1.

The Supporting Substrate

As indicated above, the photoreceptors are prepared by first providing a substrate 2, i.e., a support. The substrate may be opaque or substantially transparent and may comprise any additional suitable material(s) having given required mechanical properties, such as those described in U.S. Pat. Nos. 4,457,994; 4,871,634; 5,702,854; 5,976,744; and 7,384,717 the disclosures of which are incorporated herein by reference in their entireties.

The substrate may comprise a layer of electrically non-conductive material or a layer of electrically conductive material, such as an inorganic or organic composition. If a non-conductive material is employed, it may be necessary to provide an electrically conductive ground plane over such non-conductive material. If a conductive material is used as the substrate, a separate ground plane layer may not be necessary.

The substrate may be flexible or rigid and may have any of a number of different configurations, such as, for example, a sheet, a scroll, an endless flexible belt, a web, a cylinder, and the like. The photoreceptor may be coated on a rigid, opaque, conducting substrate, such as an aluminum drum.

Various resins may be used as electrically non-conducting materials, including, for example, polyesters, polycarbonates, polyamides, polyurethanes, and the like. Such a substrate may comprise a commercially available biaxially oriented polyester known as MYLAR™, available from E.I. duPont de Nemours & Co., MELINEX™, available from ICI Americas Inc., or HOSTAPHAN™, available from American Hoechst Corporation. Other materials of which the substrate may be comprised include polymeric materials, such as polyvinyl fluoride, available as TEDLAR™ from E. I. duPont de Nemours & Co., polyethylene and polypropylene, available as MARLEX™ from Phillips Petroleum Company, polyphenylene sulfide, RYTON™ available from Phillips Petroleum Company, and polyimides, available as KAPTON™ from E. I. duPont de Nemours & Co. The photoreceptor may also be coated on an insulating plastic drum, provided a conducting ground plane has previously been coated on its surface, as described above. Such substrates may either be seamed or seamless.

When a conductive substrate is employed, any suitable conductive material may be used. For example, the conductive material can include, but is not limited to, metal flakes, powders or fibers, such as aluminum, titanium, nickel, chromium, brass, gold, stainless steel, carbon black, graphite, or the like, in a binder resin including metal oxides, sulfides, silicides, quaternary ammonium salt compositions, conductive polymers such as polyacetylene or its pyrolysis and molecular doped products, charge transfer complexes, and polyphenyl silane and molecular doped products from polyphenyl silane. A conducting plastic drum may be used, as well as the conducting metal drum made from a material such as aluminum.

The thickness of the substrate depends on numerous factors, including the required mechanical performance and economic considerations. The thickness of the substrate is typically within a range of from about 65 micrometers to about 150 micrometers, such as from about 75 micrometers to about 125 micrometers for optimum flexibility and minimum induced surface bending stress when cycled around small diameter rollers, e.g., 19 mm diameter rollers. The substrate for a flexible belt may be of substantial thickness, for example, over 200 micrometers, or of minimum thickness, for example, less than 50 micrometers, provided there are no adverse effects on the final photoconductive device. Where a drum is used, the thickness should be sufficient to provide the necessary rigidity. This is usually about 1-6 mm.

The surface of the substrate to which a layer is to be applied may be cleaned to promote greater adhesion of such a layer. Cleaning may be effected, for example, by exposing the surface of the substrate layer to plasma discharge, ion bombardment, and the like. Other methods, such as solvent cleaning, may also be used.

Regardless of any technique employed to form a metal layer, a thin layer of metal oxide generally forms on the outer surface of most metals upon exposure to air. Thus, when other layers overlying the metal layer are characterized as "contiguous" layers, it is intended that these overlying contiguous layers may, in fact, contact a thin metal oxide layer that has formed on the outer surface of the oxidizable metal layer.

The Electrically Conductive Ground Plane

As stated above, in embodiments, the photoreceptors prepared comprise a substrate that is either electrically conductive or electrically non-conductive. When a non-conductive substrate is employed, an electrically conductive ground plane 3 must be employed, and the ground plane acts as the conductive layer. When a conductive substrate is employed, the substrate may act as the conductive layer, although a conductive ground plane may also be provided.

If an electrically conductive ground plane is used, it is positioned over the substrate. Suitable materials for the electrically conductive ground plane include, for example, aluminum, zirconium, niobium, tantalum, vanadium, hafnium, titanium, nickel, stainless steel, chromium, tungsten, molybdenum, copper, and the like, and mixtures and alloys thereof. In embodiments, aluminum, titanium, and zirconium may be used.

The ground plane may be applied by known coating techniques, such as solution coating, vapor deposition, and sputtering. A method of applying an electrically conductive ground plane is by vacuum deposition. Other suitable methods may also be used.

In embodiments, the thickness of the ground plane may vary over a substantially wide range, depending on the optical transparency and flexibility desired for the electrophotoconductive member. For example, for a flexible photoresponsive imaging device, the thickness of the conductive layer may be between about 20 angstroms and about 750 angstroms; such as, from about 50 angstroms to about 200 angstroms for an optimum combination of electrical conductivity, flexibility, and light transmission. However, the ground plane can, if desired, be opaque.

The Charge Blocking Layer

After deposition of any electrically conductive ground plane layer, a charge blocking layer 4 may be applied thereto. Electron blocking layers for positively charged photoreceptors permit holes from the imaging surface of the photoreceptor to migrate toward the conductive layer. For negatively charged photoreceptors, any suitable hole blocking layer capable of forming a barrier to prevent hole injection from the conductive layer to the opposite photoconductive layer may be utilized.

If a blocking layer is employed, it may be positioned over the electrically conductive layer. The term "over," as used herein in connection with many different types of layers, should be understood as not being limited to instances wherein the layers are contiguous. Rather, the term "over" refers, for example, to the relative placement of the layers and encompasses the inclusion of unspecified intermediate layers.

The blocking layer 4 may include polymers such as polyvinyl butyral, epoxy resins, polyesters, polysiloxanes, polyamides, polyurethanes, and the like; nitrogen-containing siloxanes or nitrogen-containing titanium compounds, such as trimethoxysilyl propyl ethylene diamine, N-beta(aminoethyl) gamma-aminopropyl trimethoxy silane, isopropyl 4-aminobenzene sulfonyl titanate, di(dodecylbenezene sulfonyl)titanate, isopropyl di(4-aminobenzoyl)isostearoyl titanate, isopropyl tri(N-ethyl amino)titanate, isopropyl trianthranil titanate, isopropyl tri(N,N-dimethyl-ethyl amino)titanate, titanium-4-amino benzene sulfonate oxyacetate, titanium 4-aminobenzoate isostearate oxyacetate, gamma-aminobutyl methyl dimethoxy silane, gamma-aminopropyl methyl dimethoxy silane, and gamma-aminopropyl trimethoxy silane, as disclosed in U.S. Pat. Nos. 4,338,387; 4,286,033; and 4,291,110 the disclosures of which are incorporated herein by reference in their entireties.

The blocking layer may be continuous and may have a thickness ranging, for example, from about 0.01 to about 10 micrometers, such as from about 0.05 to about 5 micrometers.

The blocking layer 4 may be applied by any suitable technique, such as spraying, dip coating, draw bar coating, gravure coating, silk screening, air knife coating, reverse roll coating, vacuum deposition, chemical treatment, and the like. For convenience in obtaining thin layers, the blocking layer may be applied in the form of a dilute solution, with the solvent being removed after deposition of the coating by conventional techniques, such as by vacuum, heating, and the like. Generally, a weight ratio of blocking layer material and solvent of between about 0.5:100 to about 30:100, such as about 5:100 to about 20:100, is satisfactory for spray and dip coating.

The present disclosure further provides a method for forming the electrophotographic photoreceptor, in which the charge blocking layer is formed by using a coating solution composed of the grain shaped particles, the needle shaped particles, the binder resin and an organic solvent.

The organic solvent may be a mixture of an azeotropic mixture of $C_{1-3}$ lower alcohol and another organic solvent selected from the group consisting of dichloromethane, chloroform, 1,2-dichloroethane, 1,2-dichloropropane, toluene and tetrahydrofuran. The azeotropic mixture mentioned above is a mixture solution in which a composition of the liquid phase and a composition of the vapor phase are coincided with each other at a certain pressure to give a mixture having a constant boiling point. For example, a mixture consisting of 35 parts by weight of methanol and 65 parts by weight of 1,2-dichloroethane is an azeotropic solution. The presence of an azeotropic composition leads to uniform evaporation, thereby forming a uniform charge blocking layer without coating defects and improving storage stability of the charge blocking coating solution.

The binder resin contained in the blocking layer may be formed of the same materials as that of the blocking layer formed as a single resin layer. Among them, polyamide resin may be used because it satisfies various conditions required of the binder resin such as (1) polyamide resin is neither dissolved nor swollen in a solution used for forming the imaging layer on the blocking layer, and (ii) polyamide resin has an excellent adhesiveness with a conductive support as well as flexibility. In the polyamide resin, alcohol soluble nylon resin may be used, for example, copolymer nylon polymerized with 6-nylon, 6,6-nylon, 610-nylon, 11-nylon, 12-nylon and the like; and nylon which is chemically denatured such as N-alkoxy methyl denatured nylon and N-alkoxy ethyl denatured nylon. Another type of binder resin that may be used is a phenolic resin or polyvinyl butyral resin.

The charge blocking layer is formed by dispersing the binder resin, the grain shaped particles, and the needle shaped particles in the solvent to form a coating solution for the blocking layer; coating the conductive support with the coating solution and drying it. The solvent is selected for improving dispersion in the solvent and for preventing the coating solution from gelation with the elapse of time. Further, the azeotropic solvent may be used for preventing the composition of the coating solution from being changed as time passes, whereby storage stability of the coating solution may be improved and the coating solution may be reproduced.

The phrase "n-type" refers, for example, to materials which predominately transport electrons. Typical n-type materials include dibromoanthanthrone, benzimidazole perylene, zinc oxide, titanium oxide, azo compounds such as chlorodiane Blue and bisazo pigments, substituted 2,4-dibromotriazines, polynuclear aromatic quinones, zinc sulfide, and the like.

The phrase "p-type" refers, for example, to materials which transport holes. Typical p-type organic pigments include, for example, metal-free phthalocyanine, titanyl phthalocyanine, gallium phthalocyanine, hydroxy gallium phthalocyanine, chlorogallium phthalocyanine, copper phthalocyanine, and the like.

The Adhesive Layer

An intermediate layer 5 between the blocking layer and the charge generating layer may, if desired, be provided to promote adhesion. However, in embodiments, a dip coated aluminum drum may be utilized without an adhesive layer.

Additionally, adhesive layers may be provided, if necessary, between any of the layers in the photoreceptors to ensure adhesion of any adjacent layers. Alternatively, or in addition, adhesive material may be incorporated into one or both of the respective layers to be adhered. Such optional adhesive layers may have thicknesses of about 0.001 micrometer to about 0.2 micrometer. Such an adhesive layer may be applied, for example, by dissolving adhesive material in an appropriate solvent, applying by hand, spraying, dip coating, draw bar coating, gravure coating, silk screening, air knife coating, vacuum deposition, chemical treatment, roll coating, wire wound rod coating, and the like, and drying to remove the solvent. Suitable adhesives include, for example, film-forming polymers, such as polyester, dupont 49,000 (available from E.I. duPont de Nemours & Co.), Vitel PE-100 (available from Goodyear Tire and Rubber Co.), polyvinyl butyral, polyvinyl pyrrolidone, polyurethane, polymethyl methacrylate, and the like. The adhesive layer may be composed of a polyester with a $M_w$ of from about 50,000 to about 100,000, such as about 70,000, and a $M_n$ of about 35,000.

The Imaging Layer(s)

The imaging layer refers to a layer or layers containing charge generating material, charge transport material, or both the charge generating material and the charge transport material.

Either a n-type or a p-type charge generating material may be employed in the present photoreceptor.

In the case where the charge generating material and the charge transport material are in different layers—for example a charge generation layer and a charge transport layer—the charge transport layer may comprise a SOF. Further, in the case where the charge generating material and the charge transport material are in the same layer, this layer may comprise a SOF.

Charge Generation Layer

Illustrative organic photoconductive charge generating materials include azo pigments such as Sudan Red, Dian Blue, Janus Green B, and the like; quinone pigments such as Algol Yellow, Pyrene Quinone, Indanthrene Brilliant Violet RRP, and the like; quinocyanine pigments; perylene pigments such as benzimidazole perylene; indigo pigments such as indigo, thioindigo, and the like; bisbenzoimidazole pigments such as Indofast Orange, and the like; phthalocyanine pigments such as copper phthalocyanine, aluminochloro-phthalocyanine, hydroxygallium phthalocyanine, chlorogallium phthalocyanine, titanyl phthalocyanine and the like; quinacridone pigments; or azulene compounds. Suitable inorganic photoconductive charge generating materials include for example cadium sulfide, cadmium sulfoselenide, cadmium selenide, crystalline and amorphous selenium, lead oxide and other chalcogenides. In embodiments, alloys of selenium may be used and include for instance selenium-arsenic, selenium-tellurium-arsenic, and selenium-tellurium.

Any suitable inactive resin binder material may be employed in the charge generating layer. Typical organic resinous binders include polycarbonates, acrylate polymers, methacrylate polymers, vinyl polymers, cellulose polymers, polyesters, polysiloxanes, polyamides, polyurethanes, epoxies, polyvinylacetals, and the like.

To create a dispersion useful as a coating composition, a solvent is used with the charge generating material. The solvent may be for example cyclohexanone, methyl ethyl ketone, tetrahydrofuran, alkyl acetate, and mixtures thereof. The alkyl acetate (such as butyl acetate and amyl acetate) can have from 3 to 5 carbon atoms in the alkyl group. The amount of solvent in the composition ranges for example from about 70% to about 98% by weight, based on the weight of the composition.

The amount of the charge generating material in the composition ranges for example from about 0.5% to about 30% by weight, based on the weight of the composition including a solvent. The amount of photoconductive particles (i.e., the charge generating material) dispersed in a dried photoconductive coating varies to some extent with the specific photoconductive pigment particles selected. For example, when phthalocyanine organic pigments such as titanyl phthalocyanine and metal-free phthalocyanine are utilized, satisfactory results are achieved when the dried photoconductive coating comprises between about 30 percent by weight and about 90 percent by weight of all phthalocyanine pigments based on the total weight of the dried photoconductive coating. Because the photoconductive characteristics are affected by the relative amount of pigment per square centimeter coated, a lower pigment loading may be utilized if the dried photoconductive coating layer is thicker. Conversely, higher pigment loadings are desirable where the dried photoconductive layer is to be thinner.

Generally, satisfactory results are achieved with an average photoconductive particle size of less than about 0.6 micrometer when the photoconductive coating is applied by dip coating. The average photoconductive particle size may be less than about 0.4 micrometer. In embodiments, the photoconductive particle size is also less than the thickness of the dried photoconductive coating in which it is dispersed.

In a charge generating layer, the weight ratio of the charge generating material ("CGM") to the binder ranges from 30 (CGM):70 (binder) to 70 (CGM):30 (binder).

For multilayered photoreceptors comprising a charge generating layer (also referred herein as a photoconductive layer) and a charge transport layer, satisfactory results may be achieved with a dried photoconductive layer coating thickness of between about 0.1 micrometer and about 10 micrometers. In embodiments, the photoconductive layer thickness is between about 0.2 micrometer and about 4 micrometers. However, these thicknesses also depend upon the pigment loading. Thus, higher pigment loadings permit the use of thinner photoconductive coatings. Thicknesses outside these ranges may be selected providing the objectives of the present invention are achieved.

Any suitable technique may be utilized to disperse the photoconductive particles in the binder and solvent of the coating composition. Typical dispersion techniques include, for example, ball milling, roll milling, milling in vertical attritors, sand milling, and the like. Typical milling times using a ball roll mill is between about 4 and about 6 days.

Charge transport materials include an organic polymer, a non-polymeric material, or a SOF capable of supporting the injection of photoexcited holes or transporting electrons from the photoconductive material and allowing the transport of these holes or electrons through the organic layer to selectively dissipate a surface charge.

Organic Polymer Charge Transport Layer

Illustrative charge transport materials include for example a positive hole transporting material selected from compounds having in the main chain or the side chain a polycyclic aromatic ring such as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and hydrazone compounds. Typical hole transport materials include electron donor materials, such as carbazole; N-ethyl carbazole; N-isopropyl carbazole; N-phenyl carbazole; tetraphenylpyrene; 1-methyl pyrene; perylene; chrysene; anthracene; tetraphene; 2-phenyl naphthalene; azopyrene; 1-ethyl pyrene; acetyl pyrene; 2,3-benzochrysene; 2,4-benzopyrene; 1,4-bromopyrene; poly(N-vinylcarbazole); poly(vinylpyrene); poly(vinyltetraphene); poly(vinyltetracene) and poly(vinylperylene). Suitable electron transport materials include electron acceptors such as 2,4,7-trinitro-9-fluorenone; 2,4,5,7-tetranitro-fluorenone; dinitroanthracene; dinitroacridene; tetracyanopyrene; dinitroanthraquinone; and butylcarbonylfluorenemalononitrile, see U.S. Pat. No. 4,921,769 the disclosure of which is incorporated herein by reference in its entirety. Other hole transporting materials include arylamines described in U.S. Pat. No. 4,265,990 the disclosure of which is incorporated herein by reference in its entirety, such as N,N'-diphenyl-N,N'-bis(alkylphenyl)-(1,1'-biphenyl)-4,4'-diamine wherein alkyl is selected from the group consisting of methyl, ethyl, propyl, butyl, hexyl, and the like. Other known charge transport layer molecules may be selected, reference for example U.S. Pat. Nos. 4,921,773 and 4,464,450 the disclosures of which are incorporated herein by reference in their entireties.

Any suitable inactive resin binder may be employed in the charge transport layer. Typical inactive resin binders soluble in methylene chloride include polycarbonate resin, polyvinylcarbazole, polyester, polyarylate, polystyrene, polyacrylate, polyether, polysulfone, and the like. Molecular weights can vary from about 20,000 to about 1,500,000.

In a charge transport layer, the weight ratio of the charge transport material ("CTM") to the binder ranges from 30 (CTM):70 (binder) to 70 (CTM):30 (binder).

Any suitable technique may be utilized to apply the charge transport layer and the charge generating layer to the substrate. Typical coating techniques include dip coating, roll coating, spray coating, rotary atomizers, and the like. The coating techniques may use a wide concentration of solids. The solids content is between about 2 percent by weight and 30 percent by weight based on the total weight of the dispersion. The expression "solids" refers, for example, to the charge transport particles and binder components of the charge transport coating dispersion. These solids concentrations are useful in dip coating, roll, spray coating, and the like. Generally, a more concentrated coating dispersion may be used for roll coating. Drying of the deposited coating may be effected by any suitable conventional technique such as oven drying, infra-red radiation drying, air drying and the like. Generally, the thickness of the transport layer is between about 5 micrometers to about 100 micrometers, but thicknesses outside these ranges can also be used. In general, the ratio of the thickness of the charge transport layer to the charge generating layer is maintained, for example, from about 2:1 to 200:1 and in some instances as great as about 400:1.

SOF Charge Transport Layer

Illustrative charge transport SOFs include for example a positive hole transporting material selected from compounds having a segment containing a polycyclic aromatic ring such as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and hydrazone compounds. Typical hole transport SOF segments include electron donor materials, such as carbazole; N-ethyl carbazole; N-isopropyl carbazole; N-phenyl carbazole; tetraphenylpyrene; 1-methyl pyrene; perylene; chrysene; anthracene; tetraphene; 2-phenyl naphthalene; azopyrene; 1-ethyl pyrene; acetyl pyrene; 2,3-benzochrysene; 2,4-benzopyrene; and 1,4-bromopyrene. Suitable electron transport SOF segments include electron acceptors such as 2,4,7-trinitro-9-fluorenone; 2,4,5,7-tetranitro-fluorenone; dinitroanthracene; dinitroacridene; tetracyanopyrene; dinitroanthraquinone; and butylcarbonylfluorenemalononitrile, see U.S. Pat. No. 4,921,769. Other hole transporting SOF segments include arylamines described in U.S. Pat. No. 4,265,990, such as N,N'-diphenyl-N,N'-bis(alkylphenyl)-(1,1'-biphenyl)-4,4'-diamine wherein alkyl is selected from the group consisting of methyl, ethyl, propyl, butyl, hexyl, and the like. Other known charge transport SOF segments may be selected, reference for example U.S. Pat. Nos. 4,921,773 and 4,464,450.

The SOF charge transport layer may be prepared by
  (a) preparing a liquid-containing reaction mixture comprising a plurality of molecular building blocks with inclined charge transport properties each comprising a segment and a number of functional groups;
  (b) depositing the reaction mixture as a wet film; and
  (c) promoting a change of the wet film including the molecular building blocks to a dry film comprising the SOF comprising a plurality of the segments and a plurality of linkers arranged as a covalent organic framework, wherein at a macroscopic level the covalent organic framework is a film.

The deposition of the reaction mixture as a wet layer may be achieved by any suitable conventional technique and applied by any of a number of application methods. Typical application methods include, for example, hand coating, spray coating, web coating, dip coating and the like. The SOF forming reaction mixture may use a wide range of molecular building block loadings. In embodiments, the loading is between about 2 percent by weight and 50 percent by weight based on the total weight of the reaction mixture. The term "loading" refers, for example, to the molecular building block components of the charge transport SOF reaction mixture. These loadings are useful in dip coating, roll, spray coating, and the like. Generally, a more concentrated coating dispersion may be used for roll coating. Drying of the deposited coating may be affected by any suitable conventional technique such as oven drying, infra-red radiation drying, air drying and the like. Generally, the thickness of the charge transport SOF layer is between about 5 micrometers to about 100 micrometers, such as about 10 micrometers to about 70 micrometers or 10 micrometers to about 40 micrometers. In general, the ratio of the thickness of the charge transport layer to the charge generating layer may be maintained from about 2:1 to 200:1 and in some instances as great as 400:1.

Single Layer P/R—Organic Polymer

The materials and procedures described herein may be used to fabricate a single imaging layer type photoreceptor containing a binder, a charge generating material, and a charge transport material. For example, the solids content in the dispersion for the single imaging layer may range from about 2% to about 30% by weight, based on the weight of the dispersion.

Where the imaging layer is a single layer combining the functions of the charge generating layer and the charge transport layer, illustrative amounts of the components contained therein are as follows: charge generating material (about 5% to about 40% by weight), charge transport material (about 20% to about 60% by weight), and binder (the balance of the imaging layer).

Single Layer P/R—SOF

The materials and procedures described herein may be used to fabricate a single imaging layer type photoreceptor containing a charge generating material and a charge transport SOF. For example, the solids content in the dispersion for the single imaging layer may range from about 2% to about 30% by weight, based on the weight of the dispersion.

Where the imaging layer is a single layer combining the functions of the charge generating layer and the charge transport layer, illustrative amounts of the components contained therein are as follows: charge generating material (about 2% to about 40% by weight), with an inclined added functionality of charge transport molecular building block (about 20% to about 75% by weight).

The Overcoating Layer

Embodiments in accordance with the present disclosure can, optionally, further include an overcoating layer or layers 8, which, if employed, are positioned over the charge generation layer or over the charge transport layer. This layer comprises SOFs that are electrically insulating or slightly semiconductive.

Such a protective overcoating layer includes a SOF forming reaction mixture containing a plurality of molecular building blocks that optionally contain charge transport segments.

Additives may be present in the overcoating layer in the range of about 0.5 to about 40 weight percent of the overcoating layer. In embodiments, additives include organic and inorganic particles which can further improve the wear resistance and/or provide charge relaxation property. In embodiments, organic particles include Teflon powder, carbon black, and graphite particles. In embodiments, inorganic particles include insulating and semiconducting metal oxide particles such as silica, zinc oxide, tin oxide and the like. Another semiconducting additive is the oxidized oligomer salts as described in U.S. Pat. No. 5,853,906 the disclosure of which is incorporated herein by reference in its entirety. In embodiments, oligomer salts are oxidized N,N,N',N'-tetra-p-tolyl-4,4'-biphenyldiamine salt.

The SOF overcoating layer may be prepared by
  (a) preparing a liquid-containing reaction mixture comprising a plurality of molecular building blocks with an inclined charge transport properties each comprising a segment and a number of functional groups;
  (b) depositing the reaction mixture as a wet film; and
  (c) promoting a change of the wet film including the molecular building blocks to a dry film comprising the SOF comprising a plurality of the segments and a plurality of linkers arranged as a covalent organic framework, wherein at a macroscopic level the covalent organic framework is a film.

The deposition of the reaction mixture as a wet layer may be achieved by any suitable conventional technique and applied by any of a number of application methods. Typical application methods include, for example, hand coating, spray coating, web coating, dip coating and the like. Promoting the change of the wet film to the dry SOF may be affected by any suitable conventional techniques, such as oven drying, infrared radiation drying, air drying, and the like.

Overcoating layers from about 2 micrometers to about 15 micrometers, such as from about 3 micrometers to about 8 micrometers are effective in preventing charge transport molecule leaching, crystallization, and charge transport layer cracking in addition to providing scratch and wear resistance.

The Ground Strip

The ground strip 9 may comprise a film-forming binder and electrically conductive particles. Cellulose may be used to disperse the conductive particles. Any suitable electrically conductive particles may be used in the electrically conductive ground strip layer 8. The ground strip 8 may, for example, comprise materials that include those enumerated in. U.S. Pat. No. 4,664,995 the disclosure of which is incorporated herein by reference in its entirety. Typical electrically conductive particles include, for example, carbon black, graphite, copper, silver, gold, nickel, tantalum, chromium, zirconium, vanadium, niobium, indium tin oxide, and the like.

The electrically conductive particles may have any suitable shape. Typical shapes include irregular, granular, spherical, elliptical, cubic, flake, filament, and the like. In embodiments, the electrically conductive particles should have a particle size less than the thickness of the electrically conductive ground strip layer to avoid an electrically conductive ground strip layer having an excessively irregular outer surface. An average particle size of less than about 10 micrometers generally avoids excessive protrusion of the electrically conductive particles at the outer surface of the dried ground strip layer and ensures relatively uniform dispersion of the particles through the matrix of the dried ground strip layer. Concentration of the conductive particles to be used in the ground strip depends on factors such as the conductivity of the specific conductive materials utilized.

In embodiments, the ground strip layer may have a thickness of from about 7 micrometers to about 42 micrometers, such as from about 14 micrometers to about 27 micrometers.

Application B: SOFs in Thin Film Transistors

Figure 4:
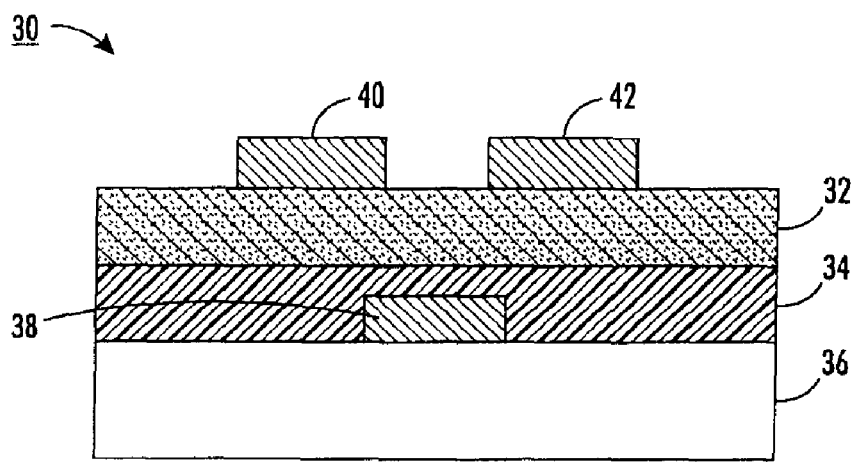
FIG. 4 represents a simplified side view of a first exemplary thin film transistor that incorporates a SOF of the present disclosure.

FIG. 4 schematically illustrates a thin film transistor (TFT) configuration 30 comprised of a substrate 36, a gate electrode 38, a source electrode 40 and a drain electrode 42, an insulating layer 34, and an organic semiconductor layer 32.

The substrate may be composed of for instance silicon wafer, glass plate, metal sheet, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The compositions of the gate electrode, the source electrode, and the drain electrode are now discussed. The gate electrode may be a thin metal film, a conducting polymer film, a conducting film made from conducting ink or paste or the substrate itself, for example heavily doped silicon. Examples of gate electrode materials include, for example, aluminum, silver, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer may be prepared by vacuum evaporation, sputtering of metals or conductive metal oxides, coating from conducting polymer solutions or conducting inks by spin coating, casting or printing. The thickness of the gate electrode layer ranges, for example, from about 10 to about 200 nanometers for metal films and in the range of about 1 to about 10 micrometers for polymer conductors. The source and drain electrode layers may be fabricated from materials which provide a low resistance ohmic contact to the semiconductor layer. Typical materials suitable for use as source and drain electrodes include those of the gate electrode materials such as silver, gold, nickel, aluminum, platinum, conducting polymers and conducting inks. Typical thicknesses of source and drain electrodes are about, for example, from about 40 nanometers to about 1 micrometer, such as about 100 to about 400 nanometers.

The insulating layer generally may be an inorganic material film or an organic polymer film. Inorganic materials suitable as the insulating layer include, for example, silicon oxide, silicon nitride, aluminum oxide, barium titanate, barium zirconium titanate and the like; examples of organic polymers for the insulating layer include polyesters, polycarbonates, poly(vinyl phenol), polyimides, polystyrene, poly (methacrylate)s, poly(acrylate)s, epoxy resin, liquid glass, and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers, such as from about 200 nanometers to about 400 nanometers. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nanometers to about 1 micrometer, or about 40 to about 100 nanometers. The semiconductor layer may comprise a SOF with semiconductor added functionality. The process for preparing the SOF with semiconductor added functionality is as follows:

(a) preparing a liquid-containing reaction mixture comprising a plurality of molecular building blocks each comprising a segment with inclined semiconductor properties and a number of functional groups;

(b) depositing the reaction mixture as a wet film; and (c) promoting a change of the wet film including the molecular building blocks to a dry film comprising the SOF comprising a plurality of the segments and a plurality of linkers arranged as a covalent organic framework, wherein at a macroscopic level the covalent organic framework is a film which is multi-segment thick.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode may be formed simultaneously or sequentially. The composition, fabrication, and operation of thin film transistors are described in Bao et al., U.S. Pat. No. 6,107,117, the disclosure of which is totally incorporated herein by reference.

EXAMPLES

A number of examples of the process used to make SOFs are set forth herein and are illustrative of the different compositions, conditions, techniques that may be utilized. Identified within each example are the nominal actions associated with this activity. The sequence and number of actions along with operational parameters, such as temperature, time, coating method, and the like, are not limited by the following examples. All proportions are by weight unless otherwise indicated. The term "rt" refers, for example, to temperatures ranging from about 20° C. to about 25° C. Mechanical measurements were measured on a TA Instruments DMA Q800 dynamic mechanical analyzer using methods standard in the art. Differential scanning calorimetery was measured on a TA Instruments DSC 2910 differential scanning calorimeter using methods standard in the art. Thermal gravimetric analysis was measured on a TA Instruments TGA 2950 thermal gravimetric analyzer using methods standard in the art. FT-IR spectra was measured on a Nicolet Magna 550 spectrometer using methods standard in the art. Thickness measurements <1 micron were measured on a Dektak 6m Surface Profiler. Surface energies were measured on a Fibro DAT 1100 (Sweden) contact angle instrument using methods standard in the art. Unless otherwise noted, the SOFs produced in the following examples were either defect-free SOFs or substantially defect-free SOFs.

The SOFs coated onto Mylar were delaminated by immersion in a room temperature water bath. After soaking for 10 minutes the SOF film generally detached from Mylar substrate. This process is most efficient with a SOF coated onto substrates known to have high surface energy (polar), such as glass, mica, salt, and the like.

Given the examples below it will be apparent, that the compositions prepared by the methods of the present disclosure may be practiced with many types of components and may have many different uses in accordance with the disclosure above and as pointed out hereinafter.

Embodiment of a Patterned SOF Composition

An embodiment of the disclosure is to attain a SOF wherein the microscopic arrangement of segments is patterned. The term "patterning" refers, for example, to the sequence in which segments are linked together. A patterned SOF would therefore embody a composition wherein, for example, segment A is only connected to segment B, and conversely, segment B is only connected to segment A. Further, a system wherein only one segment exists, say segment A, is employed is will be patterned because A is intended to only react with A. In principle a patterned SOF may be achieved using any number of segment types. The patterning of segments may be controlled by using molecular building blocks whose functional group reactivity is intended to compliment a partner molecular building block and wherein the likelihood of a molecular building block to react with itself is minimized. The aforementioned strategy to segment patterning is non-limiting. Instances where a specific strategy to control patterning has not been deliberately implemented are also embodied herein.

A patterned film may be detected using spectroscopic techniques that are capable of assessing the successful formation of linking groups in a SOF. Such spectroscopies include, for example, Fourier-transfer infrared spectroscopy, Raman spectroscopy, and solid-state nuclear magnetic resonance spectroscopy. Upon acquiring a data by a spectroscopic technique from a sample, the absence of signals from functional groups on building blocks and the emergence of signals from linking groups indicate the reaction between building blocks and the concomitant patterning and formation of an SOF.

Different degrees of patterning are also embodied. Full patterning of a SOF will be detected by the complete absence of spectroscopic signals from building block functional groups. Also embodied are SOFs having lowered degrees of patterning wherein domains of patterning exist within the SOF. SOFs with domains of patterning, when measured spectroscopically, will produce signals from building block functional groups which remain unmodified at the periphery of a patterned domain.

It is appreciated that a very low degree of patterning is associated with inefficient reaction between building blocks and the inability to form a film. Therefore, successful implementation of the process of the present disclosure requires appreciable patterning between building blocks within the SOF. The degree of necessary patterning to form a SOF is variable and can depend on the chosen building blocks and desired linking groups. The minimum degree of patterning required is that required to form a film using the process described herein, and may be quantified as formation of about 20% or more of the intended linking groups, such as about 40% or more of the intended linking groups or about 50% or more of the intended linking groups; the nominal degree of patterning embodied by the present disclosure is formation of about 60% of the intended linking group, such as formation of about 100% of the intended linking groups. Formation of linking groups may be detected spectroscopically as described earlier in the embodiments.

Production of a Patterned SOF

The following experiments demonstrate the development of a patterned SOF. The activity described below is non-limiting as it will be apparent that many types of approaches may be used to generate patterning in a SOF.

EXAMPLE 1 describes the synthesis of a Type 2 SOF wherein components are combined such that etherification linking chemistry is promoted between two building blocks. The presence of an acid catalyst and a heating action yield a SOF with the method described in EXAMPLE 1.

Example 1

Type 2 SOF (Action A) Preparation of the liquid containing reaction mixture. The following were combined: the building block benzene-1,4-dimethanol [segment=p-xylyl; Fg=hydroxyl (—OH); (0.47 g, 3.4 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.12 g, 1.7 mmol)], and 17.9 g of 1-methoxy-2-propanol. The mixture was shaken and heated to 60° C. until a homogenous solution resulted. Upon cooling to room temperature, the solution was filtered through a 0.45 micron PTFE membrane. To the filtered solution was added an acid catalyst delivered as 0.31 g of a 10 wt % solution of p-toluenesulfonic acid in 1-methoxy-2-propanol to yield the liquid containing reaction mixture.

(Action B) Deposition of reaction mixture as a wet film. The reaction mixture was applied to the reflective side of a metalized (TiZr) MYLAR™ substrate using a constant velocity draw down coater outfitted with a bird bar having an 8 mil gap.

Figure 5:
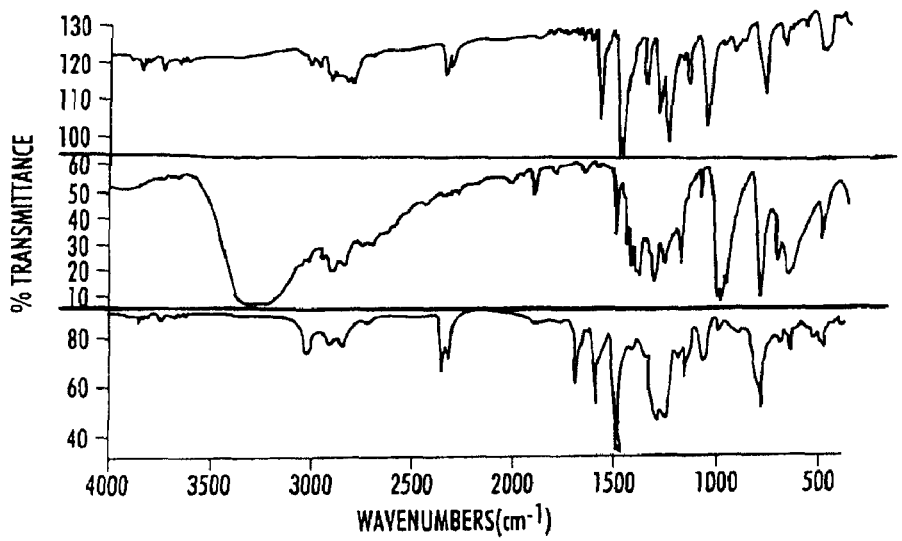
FIG. 5 is a graphic representation that compares the Fourier transform infrared spectral of the products of control experiments mixtures, wherein only N4,N4,N4',N4'-tetrakis(4-(methoxymethyl)phenyl)biphenyl-4,4'-diamine is added to the liquid reaction mixture (top), wherein only benzene-1,4-dimethanol is added to the liquid reaction mixture (middle), and wherein the necessary components needed to form a patterned Type 2 SOF are included into the liquid reaction mixture (bottom).

(Action C) Promotion of the change of the wet film to a dry SOF. The metalized MYLAR™ substrate supporting the wet layer was rapidly transferred to an actively vented oven preheated to 130° C. and left to heat for 40 min. These actions provided a SOF having a thickness ranging from about 3-6 microns, which may be delaminated from the substrate as a single free-standing SOF. The color of the SOF was green. The Fourier-transform infrared spectrum of a portion of this SOF is provided in FIG. 5.

To demonstrate that the SOF prepared in EXAMPLE 1 comprises segments from the employed molecular building blocks that are patterned within the SOF, three control experiments were conducted. Namely, three liquid reaction mixtures were prepared using the same procedure as set forth in Action A in EXAMPLE 1; however, each of these three formulations were modified as follows:

(Control reaction mixture 1; Example 2) the building block benzene-1,4-dimethanol was not included.
(Control reaction mixture 2; Example 3) the building block N4,N4,N4',N4'-tetrakis(4-(methoxymethyl)phenyl)biphenyl-4,4'-diamine was not included.
(Control reaction mixture 3; Example 4) the catalyst p-toluenesulfonic acid was not included The full descriptions of the SOF forming process for the above described control experiments are detailed in EXAMPLES 2-4 below.

Example 2

Control Experiment Wherein the Building Block benzene-1,4-dimethanol was Not Included (Action A) Preparation of the liquid containing reaction mixture. The following were combined: the building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.12 g, 1.7 mmol)], and 17.9 g of 1-methoxy-2-propanol. The mixture was shaken and heated to 60° C. until a homogenous solution resulted. Upon cooling to room temperature, the solution was filtered through a 0.45 micron PTFE membrane. To the filtered solution was added an acid catalyst delivered as 0.31 g of a 10 wt % solution of p-toluenesulfonic acid in 1-methoxy-2-propanol to yield the liquid containing reaction mixture.

(Action B) Deposition of reaction mixture as a wet film. The reaction mixture was applied to the reflective side of a metalized (TiZr) MYLAR™ substrate using a constant velocity draw down coater outfitted with a bird bar having an 8 mil gap.

(Action C) Attempted promotion of the change of the wet film to a dry SOF. The metalized MYLAR™ substrate supporting the wet layer was rapidly transferred to an actively vented oven preheated to 130° C. and left to heat for 40 min. These actions did not provide a film. Instead, a precipitated powder of the building block was deposited onto the substrate.

Example 3

Control Experiment Wherein the Building Block N4,N4,N4',N4'-tetrakis(4-(methoxymethyl)phenyl) biphenyl-4,4'-diamine was Not Included (Action A) Preparation of the liquid containing reaction mixture. The following were combined: the building block benzene-1,4-dimethanol [segment=p-xylyl; Fg=hydroxyl (—OH); (0.47 g, 3.4 mmol)] and 17.9 g of 1-methoxy-2-propanol. The mixture was shaken and heated to 60° C. until a homogenous solution resulted. Upon cooling to room temperature, the solution was filtered through a 0.45 micron PTFE membrane. To the filtered solution was added an acid catalyst delivered as 0.31 g of a 10 wt % solution of p-toluenesulfonic acid in 1-methoxy-2-propanol to yield the liquid containing reaction mixture.

(Action B) Deposition of reaction mixture as a wet film. The reaction mixture was applied to the reflective side of a metalized (TiZr) MYLAR™ substrate using a constant velocity draw down coater outfitted with a bird bar having an 8 mil gap.

(Action C) Attempted promotion of the change of the wet film to a dry SOF. The metalized MYLAR™ substrate supporting the wet layer was rapidly transferred to an actively vented oven preheated to 130° C. and left to heat for 40 min. These actions did not provide a film. Instead, a precipitated powder of the building block was deposited onto the substrate.

Example 4

Control Experiment Wherein the Acid Catalyst p-toluenesulfonic Acid was Not Included (Action A) Preparation of the liquid containing reaction mixture. The following were combined: the building block benzene-1,4-dimethanol [segment=p-xylyl; Fg=hydroxyl (—OH); (0.47 g, 3.4 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.12 g, 1.7 mmol)], and 17.9 g of 1-methoxy-2-propanol. The mixture was shaken and heated to 60° C. until a homogenous solution resulted. Upon cooling to room temperature, the solution was filtered through a 0.45 micron PTFE membrane to yield the liquid containing reaction mixture.

(Action B) Deposition of reaction mixture as a wet film. The reaction mixture was applied to the reflective side of a metalized (TiZr) MYLAR™ substrate using a constant velocity draw down coater outfitted with a bird bar having an 8 mil gap.

(Action C) Attempted promotion of the change of the wet film to a dry SOF. The metalized MYLAR™ substrate supporting the wet layer was rapidly transferred to an actively vented oven preheated to 130° C. and left to heat for 40 min. These actions did not provide a film. Instead, a precipitated powder of the building blocks was deposited onto the substrate.

Figure 6:
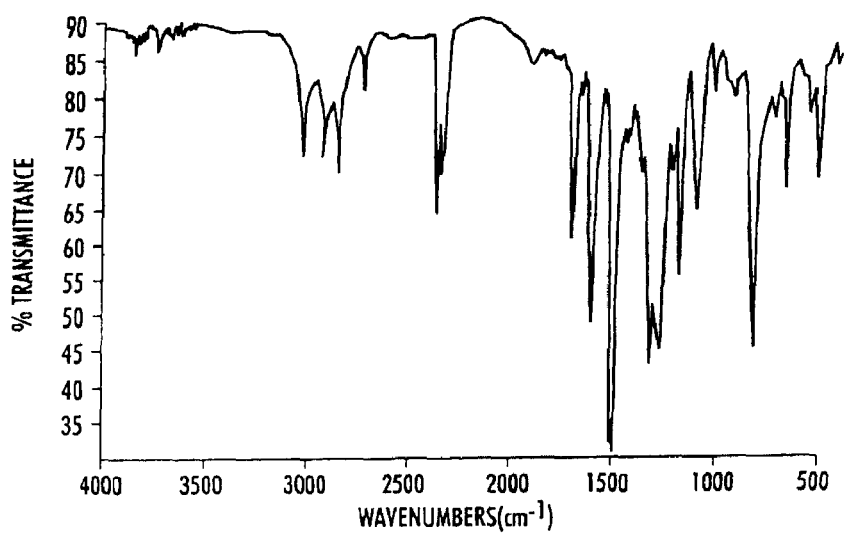
FIG. 6 is a graphic representation of a Fourier transform infrared spectrum of a free standing SOF comprising N4,N4,N4',N4'-tetra-p-tolylbiphenyl-4,4'-diamine segments, p-xylyl segments, and ether linkers.

As described in EXAMPLES 2-4, each of the three control reaction mixtures were subjected to Action B and Action C as outlined in EXAMPLE 1. However, in all cases a SOF did not form; the building blocks simply precipitated on the substrate. It is concluded from these results that building blocks cannot react with themselves under the stated processing conditions nor can the building blocks react in the absence of a promoter (p-toluenesulfonic acid). Therefore, the activity described in EXAMPLE 1 is one wherein building blocks (benzene-1,4-dimethanol and N4,N4,N4',N4'-tetrakis(4-(methoxymethyl)phenyl)biphenyl-4,4'-diamine) can only react with each other when promoted to do so. A patterned SOF results when the segments=p-xylyl and N4,N4,N4',N4'-tetra-p-tolylbiphenyl-4,4'-diamine connect only with each other. The Fourier-transform infrared spectrum, compared to that of the products of the control experiments (FIG. 6) of the SOF shows absence of functional groups (notably the absence of the hydroxyl band from the benzene-1,4-dimethanol) from the starting materials and further supports that the connectivity between segments has proceed as described above. Also, the complete absence of the hydroxyl band in the spectrum for the SOF indicates that the patterning is to a very high degree.

Described below are further Examples of defect-free SOFs and/or substantially defect-free SOFs prepared in accordance with the present disclosure. In the following examples (Action A) is the preparation of the liquid containing reaction mixture; (Action B) is the deposition of reaction mixture as a wet film; and (Action C) is the promotion of the change of the wet film to a dry SOF.

Example 5

Type 2 SOF (Action A) The following were combined: the building block benzene-1,3,5-trimethanol [segment=benzene-1,3,5-trimethyl; Fg=hydroxyl (—OH); (0.2 g, 1.2 mmol)] and a second building block N4,N4,N4',N4'-tetrakis(4-(methoxymethyl)phenyl)biphenyl-4,4'-diamine [segment=N4,N4, N4',N4'-tetra-p-tolylbiphenyl-4,4'-diamine; Fg=methoxy ether (—OCH$_3$); (0.59 g, 0.8 mmol)], and 8.95 g of 1-methoxy-2-propanol. The mixture was shaken and heated to 60° C. until a homogenous solution resulted. Upon cooling to room temperature, the solution was filtered through a 0.45 micron PTFE membrane. To the filtered solution was added an acid catalyst delivered as 0.16 g of a 10 wt % solution of p-toluenesulfonic acid in 1-methoxy-2-propanol to yield the liquid containing reaction mixture. (Action B) The reaction mixture was applied to the reflective side of a metalized (TiZr) MYLAR™ substrate using a constant velocity draw down coater outfitted with a bird bar having an 20 mil gap. (Action C) The metalized MYLAR™ substrate supporting the wet layer was rapidly transferred to an actively vented oven preheated to 130° C. and left to heat for 40 min. These actions provided a SOF having a thickness ranging from about 2-4 microns that could be delaminated from the substrate as a single free-standing SOF. The color of the SOF was green.

Example 6

Figure 7:
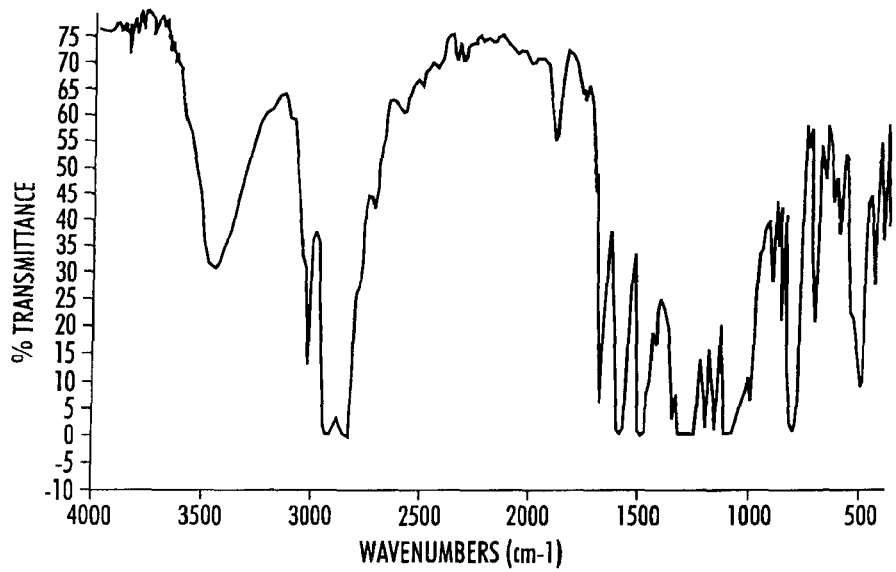
FIG. 7. is a graphic representation of a Fourier transform infrared spectrum of a free standing SOF comprising N4,N4,N4',N4'-tetra-p-tolylbiphenyl-4,4'-diamine segments, n-hexyl segments, and ether linkers.

Type 2 SOF (Action A) The following were combined: the building block 1,6-n-hexanediol [segment=n-hexyl; Fg=hydroxyl (—OH); (0.21 g, 1.8 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (0.58 g, 0.87 mmol)], and 8.95 g of 1-methoxy-2-propanol. The mixture was shaken and heated to 60° C. until a homogenous solution resulted. Upon cooling to room temperature, the solution was filtered through a 0.45 micron PTFE membrane. To the filtered solution was added an acid catalyst delivered as 0.16 g of a 10 wt % solution of p-toluenesulfonic acid in 1-methoxy-2-propanol to yield the liquid containing reaction mixture. (Action B) The reaction mixture was applied to the reflective side of a metalized (TiZr) MYLAR™ substrate using a constant velocity draw down coater outfitted with a bird bar having a 20 mil gap. (Action C) The metalized MYLAR™ substrate supporting the wet layer was rapidly transferred to an actively vented oven preheated to 130° C. and left to heat for 40 min. These actions provided a SOF having a thickness ranging from about 4-5 microns that could be delaminated from the substrate as a single free standing SOF. The color of the SOF was green. The Fourier-transform infrared spectrum of a portion of this SOF is provided in FIG. 7.

Example 7

Type 2 SOF (Action A) The following were combined: the building block benzene-1,4-dimethanol [segment=p-xylyl; Fg=hydroxyl (—OH); (0.64 g, 4.6 mmol)] and a second building block N4,N4,N4',N4'-tetrakis(4-(methoxymethyl) phenyl)biphenyl-4,4'-diamine [segment=N4,N4,N4',N4'-tetra-p-tolylbiphenyl-4,4'-diamine; Fg=methoxy ether (—OCH$_3$); (1.54 g, 2.3 mmol)], and 7.51 g of 1,4-dioxane. The mixture was shaken and heated to 60° C. until a homogenous solution resulted, which was then filtered through a 0.45 micron PTFE membrane. To the filtered solution was added an acid catalyst delivered as 0.28 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having an 10 mil gap. (Action C) The metalized MYLAR™ substrate supporting the wet layer was rapidly transferred to an actively vented oven preheated to 130° C. and left to heat for 4 min. These actions provided a SOF having a thickness ranging from about 8-12 microns that could be delaminated from substrate as a single free-standing film. The color of the SOF was green.

Example 8

Type 2 SOF (Action A) The following were combined: the building block 1,6-n-hexanediol [segment=n-hexyl; Fg=hydroxyl (—OH); (0.57 g, 4.8 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.61 g, 2.42 mmol)], and 7.51 g of 1,4-dioxane. The mixture was shaken and heated to 60° C. until a homogenous solution resulted. Upon cooling to rt, the solution was filtered through a 0.45 micron PTFE membrane. To the filtered solution was added an acid catalyst delivered as 0.22 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 130° C. and left to heat for 40 min. These actions provided a SOF having a thickness ranging from about 12-20 microns that could be delaminated from the substrate as a single free-standing film. The color of the SOF was green.

Example 9

Figure 8:
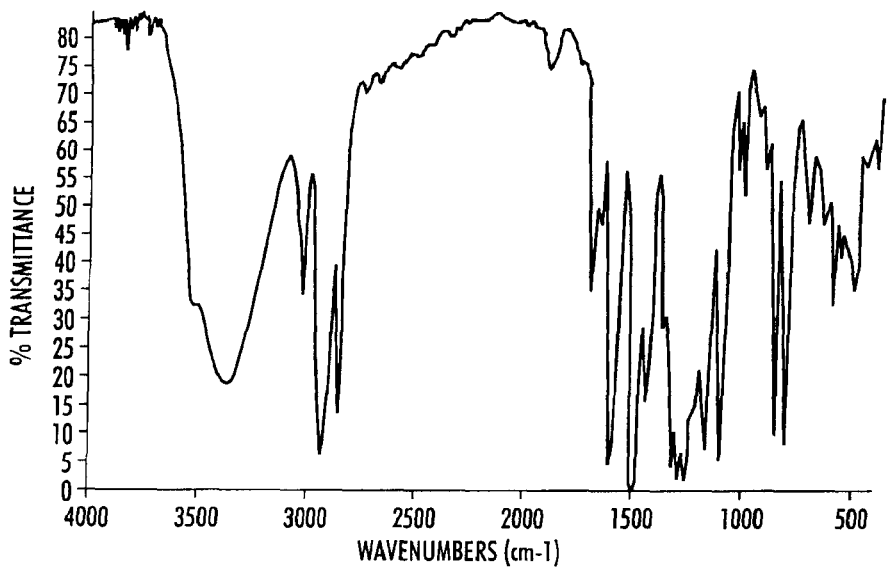
FIG. 8 is a graphic representation of a Fourier transform infrared spectrum of a free standing SOF comprising N4,N4,N4',N4'-tetra-p-tolylbiphenyl-4,4'-diamine segments, 4,4'-(cyclohexane-1,1-diyl)diphenyl, and ether linkers.

Type 2 SOF (Action A) The following were combined: the building block 4,4'-(cyclohexane-1,1-diyl)diphenol [segment=4,4'-(cyclohexane-1,1-diyl)diphenyl; Fg=hydroxyl (—OH); (0.97 g, 6 mmol)] and a second building block N4,N4,N4', N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.21 g, 1.8 mmol)], and 7.51 g of 1,4-dioxane. The mixture was shaken and heated to 60° C. until a homogenous solution resulted. Upon cooling to rt, the solution was filtered through a 0.45 micron PTFE membrane. To the filtered solution was added an acid catalyst delivered as 0.22 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 130° C. and left to heat for 40 min. These actions provided a SOF having a thickness ranging from about 12-20 microns that could be delaminated from the substrate as a single free-standing film. The color of the SOF was green. The Fourier-transform infrared spectrum of SOF is provided in FIG. 8.

Example 10

Type 2 SOF (Action A) The following were combined: the building block benzene-1,4-dimethanol [segment=p-xylyl; Fg=hydroxyl (—OH); (0.52 g, 3.8 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.26 g, 1.9 mmol)], and 6.3 g of 1,4-dioxane and 1.57 g of n-butyl acetate. The mixture was shaken and heated to 60° C. until a homogenous solution resulted, which was then filtered through a 0.45 micron PTFE membrane. To the filtered solution was added an acid catalyst delivered as 0.28 g of a 10 wt % solution of p-toluenesulfonic acid in 1,4-dioxane to yield the liquid containing reaction mixture. (Action. B) The reaction mixture was applied to the reflective side of a metalized (TiZr) MYLAR™ substrate using a constant velocity draw down coater outfitted with a bird bar having an 10 mil gap. (Action C) The metalized MYLAR™ substrate supporting the wet layer was rapidly transferred to an actively vented oven preheated to 130° C. and left to heat for 4 min. These actions provided a SOF having a thickness of 7-10 microns that could be delaminated from substrate as a single free-standing film. The color of the SOF was green.

Example 11

Type 2 SOF (Action A) Same as EXAMPLE 7. (Action B) The reaction mixture was applied to a photoconductive layer, containing a pigment and polymeric binder, supported on metalized (TiZr) MYLAR™ substrate using a constant velocity draw down coater outfitted with a bird bar having a 10 mil gap. (Action C) The supported wet layer was rapidly transferred to an actively vented oven preheated to 120° C. and left to heat for 20 min. These actions provided a uniformly coated multilayer device wherein the SOF had a thickness ranging from about 9-10 microns.

Example 12

Type 2 SOF (Action A) The following were combined: the building block benzene-1,4-dimethanol [segment=p-xylyl; Fg=hydroxyl (—OH); (0.52 g, 3.8 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.26 g, 1.9 mmol)], and 6.3 g of 1,4-dioxane and 1.57 g of methyl isobutyl ketone. The mixture was shaken and heated to 60° C. until a homogenous solution resulted, which was then filtered through a 0.45 micron PTFE membrane. To the filtered solution was added an acid catalyst delivered as 0.28 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having an 10 mil gap. (Action C) The metalized MYLAR™ substrate supporting the wet layer was rapidly transferred to an actively vented oven preheated to 130° C. and left to heat for 4 min. These actions provided a SOF having a thickness ranging from about 7-10 microns that could be delaminated from substrate as a single free-standing film. The color of the SOF was green.

Example 13

Type 2 SOF (Action A) The following were combined: the building block 1,6-n-hexanediol [segment=n-hexyl; Fg=hydroxyl (—OH); (0.47 g, 4.0 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.31 g, 2.0 mmol)], 6.3 g of 1,4-dioxane, and 1.57 g of n-butyl acetate. The mixture was shaken and heated to 60° C. until a homogenous solution resulted. Upon cooling to room temperature, the solution was filtered through a 0.45 micron PTFE membrane. To the filtered solution was added an acid catalyst delivered as 0.22 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 130° C. and left to heat for 40 min. These actions provided a SOF having a thickness ranging from about 8-12 microns that could be delaminated from the substrate as a single free-standing film. The color of the SOF was green.

Example 14

Type 2 SOF (Action A) Same as EXAMPLE 10. (Action B) The reaction mixture was applied to a photoconductive layer, containing a pigment and polymeric binder, supported on metalized (TiZr) MYLAR™ substrate using a constant velocity draw down coater outfitted with a bird bar having a 10 mil gap. (Action C) The supported wet layer was rapidly transferred to an actively vented oven preheated to 120° C. and left to heat for 20 min. These actions provided a uniformly coated multilayer device wherein the SOF had a thickness ranging from about 9-10 microns.

Example 15

Type 2 SOF (Action A) The following were combined: the building block 1,6-n-hexanediol [segment=n-hexyl; Fg=hydroxyl (—OH); (0.47 g, 4.0 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (1.31 g, 2.0 mmol)], 6.3 g of 1,4-dioxane, and 1.57 g of methyl isobutyl ketone.

The mixture was shaken and heated to 60° C. until a homogenous solution resulted. Upon cooling to room temperature, the solution was filtered through a 0.45 micron PTFE membrane. To the filtered solution was added an acid catalyst delivered as 0.22 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 130° C. and left to heat for 40 min. These actions provided a SOF having a thickness ranging from about 8-12 microns that could be delaminated from the substrate as a single free-standing film. The color of the SOF was green.

Example 16

Type 2 SOF (Action A) The following were combined: the building block 4,4'-(cyclohexane-1,1-diyl)diphenol [segment=4,4'-(cyclohexane-1,1-diyl)diphenyl; Fg=hydroxyl (—OH); (0.8 g)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (0.8 g, 1.5 mmol)], dioxane, and 1.57 g of n-butyl acetate. The mixture was shaken and heated to 60° C. until a homogenous solution resulted. Upon cooling to rt, the solution was filtered through a 0.45 micron PTFE membrane. To the filtered solution was added an acid catalyst delivered as 0.22 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 130° C. and left to heat for 40 min. These actions provided SOF having a thickness of about 12 microns that could be delaminated from the substrate as a single free-standing film. The color of the SOF was green.

Example 17

Type 2 SOF (Action A) Same as EXAMPLE 13. (Action B) The reaction mixture was applied to a photoconductive layer, containing a pigment and polymeric binder, supported on metalized (TiZr) MYLAR™ substrate using a constant velocity draw down coater outfitted with a bird bar having a 10 mil gap. (Action C) The supported wet layer was rapidly transferred to an actively vented oven preheated to 120° C. and left to heat for 20 min. These actions provided a uniformly coated multilayer device wherein the SOF had a thickness ranging from about 9-10 microns.

Example 18

Type 2 SOF (Action A) The following were combined: the building block 4,4'-(cyclohexane-1,1-diyl)diphenol [segment=4,4'-(cyclohexane-1,1-diyl)diphenyl; Fg=hydroxyl (—OH); (0.8 g, 3.0 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH$_3$); (0.8 g, 1.5 mmol)], 1,4-dioxane, and 1.57 g of methyl isobutyl ketone. The mixture was shaken and heated to 60° C. until a homogenous solution resulted. Upon cooling to room temperature, the solution was filtered through a 0.45 micron PTFE membrane. To the filtered solution was added an acid catalyst delivered as 0.22 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 130° C. and left to heat for 40 min. These actions provided SOF having a thickness of about 12 microns that could be delaminated from the substrate as a single free-standing film. The color of the SOF was green.

Example 19

Type 2 SOF (Action A) Same as EXAMPLE 7. (Action B) The reaction mixture was applied to a photoconductive layer, containing a pigment and polymeric binder, supported on metalized (TiZr) MYLAR™ substrate using a constant velocity draw down coater outfitted with a bird bar having a 10 mil gap. (Action C) The supported wet layer was allowed to dry at ambient temperature in an actively vented fume hood for 5 min and was then transferred to an actively vented oven preheated to 120° C. and left to heat for 15 min. These actions provided a uniformly coated multilayer device wherein the SOF had a thickness ranging from about 9-10 microns.

Example 20

Type 2 SOF (Action A) Same as EXAMPLE 10. (Action B) The reaction mixture was applied to a photoconductive layer, containing a pigment and polymeric binder, supported on metalized (TiZr) MYLAR™ substrate using a constant velocity draw down coater outfitted with a bird bar having a 10 mil gap. (Action C) The supported wet layer was allowed to dry at ambient temperature in an actively vented fume hood for 5 min and was then transferred to an actively vented oven preheated to 120° C. and left to heat for 15 min. These actions provided a uniformly coated multilayer device wherein the SOF had a thickness ranging from about 9-10 microns.

Example 21

Type 2 SOF (Action A) Same as EXAMPLE 13. (Action B) The reaction mixture was applied to a photoconductive layer, containing a pigment and polymeric binder, supported on metalized (TiZr) MYLAR™ substrate using a constant velocity draw down coater outfitted with a bird bar having a 10 mil gap. (Action C) The supported wet layer was allowed to dry at ambient temperature in an actively vented fume hood for 5 min and was then transferred to an actively vented oven preheated to 120° C. and left to heat for 15 min. These actions provided a uniformly coated multilayer device wherein the SOF had a thickness ranging from about 9-10 microns and could not be delaminated.

Example 22

Type 2 SOF (Action A) Same as EXAMPLE 7. (Action B) The reaction mixture was applied to a layered photosensitive member comprising a generator layer and a transport layer containing a diamine type molecule dispersed in a polymeric binder using a constant velocity draw down coater outfitted with a bird bar having a 10 mil gap. (Action C) The supported wet layer was allowed to dry at ambient temperature in an actively vented fume hood for 5 min and was then transferred to an actively vented oven preheated to 120° C. and left to heat for 15 min. These actions provided a uniformly coated multilayer device wherein the SOF had a thickness ranging from about 9-10 microns.

Example 23

Type 2 SOF (Action A) Same as EXAMPLE 10. (Action B) The reaction mixture was applied to layered photosensitive member comprising a generator layer and a transport layer containing a diamine type molecule dispersed in a polymeric binder using a constant velocity draw down coater outfitted with a bird bar having a 10 mil gap. (Action C) The supported wet layer was allowed to dry at ambient temperature in an actively vented fume hood for 5 min and was then transferred to an actively vented oven preheated to 120° C. and left to heat for 15 min. These actions provided a uniformly coated multilayer device wherein the SOF had a thickness ranging from about 9-10 microns.

Example 24

Type 2 SOF (Action A) Same as EXAMPLE 13. (Action B) The reaction mixture was applied to layered photosensitive member comprising a generator layer and a transport layer containing a diamine type molecule dispersed in a polymeric binder using a constant velocity draw down coater outfitted with a bird bar having a 10 mil gap. (Action C) The supported wet layer was allowed to dry at ambient temperature in an actively vented fume hood for 5 min and was then transferred to an actively vented oven preheated to 120° C. and left to heat for 15 min. These actions provided a uniformly coated multilayer device wherein the SOF had a thickness ranging from about 9-10 microns.

Example 25

Type 1 SOF (Action A) The following were combined: the building block (4,4',4'',4'''-(biphenyl-4,4'-diylbis(azanetriyl))tetrakis(benzene-4,1-diyl))tetramethanol [segment=(4,4',4'',4'''-(biphenyl-4,4'-diylbis(azanetriyl))tetrakis(benzene-4,1-diyl); Fg=alcohol (—OH); (1.48 g, 2.4 mmol)], and 8.3 g of 1,4-dioxane. The mixture was shaken and heated to 60° C. until a homogenous solution resulted. Upon cooling to room temperature, the solution was filtered through a 0.45 micron PTFE membrane. To the filtered solution was added an acid catalyst delivered as 0.15 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 25 mil gap. (Action C) The metalized MYLAR™ substrate supporting the wet layer was rapidly transferred to an actively vented oven preheated to 130° C. and left to heat for 40 min. These actions provided SOF having a thickness ranging from about 8-24 microns. The color of the SOF was green.

Example 26

Figure 9:
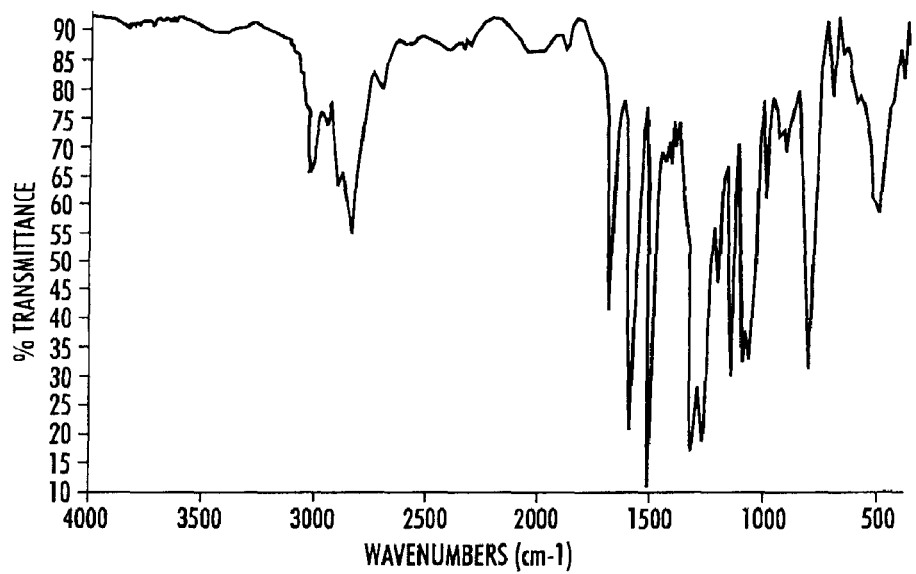
FIG. 9 is a graphic representation of a Fourier transform infrared spectrum of a free standing SOF comprising of triphenylamine segments and ether linkers.
Figure 15:
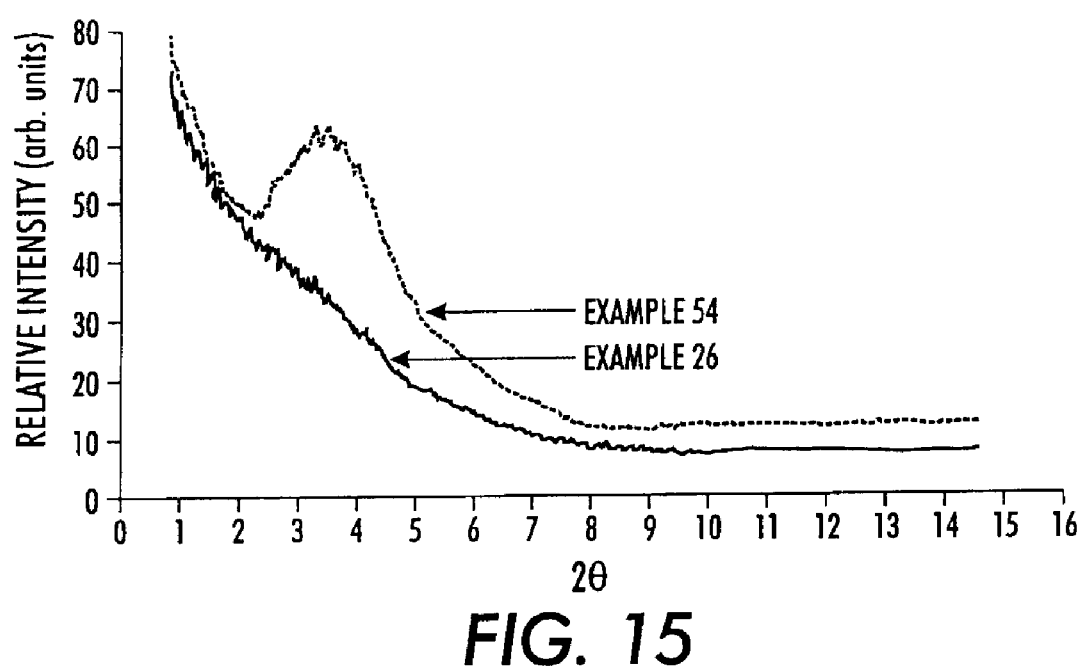
FIG. 15 is a graphic representation of two-dimensional X-ray scattering data for the SOFs produced in Examples 26 and 54.

Type 1 SOF (Action A) The following were combined: the building 4,4',4''-nitrilotris(benzene-4,1-diyl)trimethanol [segment=(4,4',4''-nitrilotris(benzene-4,1-diyl)trimethyl); Fg=alcohol (—OH); (1.48 g, 4.4 mmol)], and 8.3 g of 1,4-dioxane. The mixture was shaken and heated to 60° C. until a homogenous solution resulted. Upon cooling to room temperature, the solution was filtered through a 0.45 micron PTFE membrane. To the filtered solution was added an acid catalyst delivered as 0.15 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 15 mil gap. (Action C) The metalized MYLAR™ substrate supporting the wet layer was rapidly transferred to an actively vented oven preheated to 130° C. and left to heat for 40 min. These actions provided SOF having a thickness ranging from about 6-15 microns that could be delaminated from substrate as a single free-standing film. The color of the SOF was green. The Fourier-transform infrared spectrum of this film is provided in FIG. 9. Two-dimensional X-ray scattering data is provided in FIG. 15. As seen in FIG. 15, no signal above the background is present, indicating the absence of molecular order having any detectable periodicity.

Example 27

Type 2 SOF (Action A) The following were combined: the building block N4,N4,N4',N4'-tetrakis(4-(methoxymethyl)phenyl)biphenyl-4,4'-diamine [segment=N4,N4,N4',N4'-tetra-p-tolyl-biphenyl-4,4'-diamine; Fg=methoxy ether (—OCH$_3$); (0.2 g, 0.40 mmol)] and a second building block 3,3'-(4,4'-(biphenyl-4-ylazanediyl)bis(4,1-phenylene))dipropan-1-ol [segment=3,3'-(4,4'-(biphenyl-4-ylazanediyl)bis(4,1-phenylene))dipropyl; Fg=hydroxy (—OH); (0.34 g, 0.78 mmol)], and 1.29 mL of 1-methoxy-2-propanol. The mixture was shaken and heated to 60° C. until a homogenous solution resulted. Upon cooling to room temperature, the solution was filtered through a 0.45 micron PTFE membrane. To the filtered solution was added an acid catalyst delivered as 0.2 g of a 10 wt % solution of p-toluenesulfonic acid in 1-methoxy-2-propanol to yield the liquid containing reaction mixture. (Action B) The reaction mixture was applied to the reflective side of a metalized (TiZr) MYLAR™ substrate using a constant velocity draw down coater outfitted with a bird bar having an 8 mil gap. (Action C) The metalized MYLAR™ substrate supporting the wet layer was rapidly transferred to an actively vented oven preheated to 150° C. and left to heat for 40 min. These actions provided SOF having a thickness ranging from about 15-20 microns that could be delaminated from substrate as a single free-standing film. The color of the SOF was green.

Example 28

Type 2 SOF (Action A) Same as EXAMPLE 24. (Action B) The reaction mixture was applied to layered photosensitive member comprising a generator layer and a transport layer containing a diamine type molecule dispersed in a polymeric binder using a constant velocity draw down coater outfitted with a bird bar having a 5 mil gap. (Action C) The supported wet layer was rapidly transferred to an actively vented oven preheated to 130° C. and left to heat for 40 min. These actions provided a uniformly coated multilayer device wherein the SOF had a thickness of about 5 microns.

Example 29

Type 2 SOF (Action A) Same as EXAMPLE 24. (Action B) The reaction mixture was applied to layered photosensitive member comprising a generator layer and a transport layer containing a diamine type molecule dispersed in a polymeric binder affixed to a spin coating device rotating at 750 rpm. The liquid reaction mixture was dropped at the centre rotating substrate to deposit the wet layer. (Action C) The supported wet layer was rapidly transferred to an actively vented oven preheated to 140° C. and left to heat for 40 min. These actions provided a uniformly coated multilayer device wherein the SOF had a thickness of about 0.2 microns.

Example 30

Figure 10:
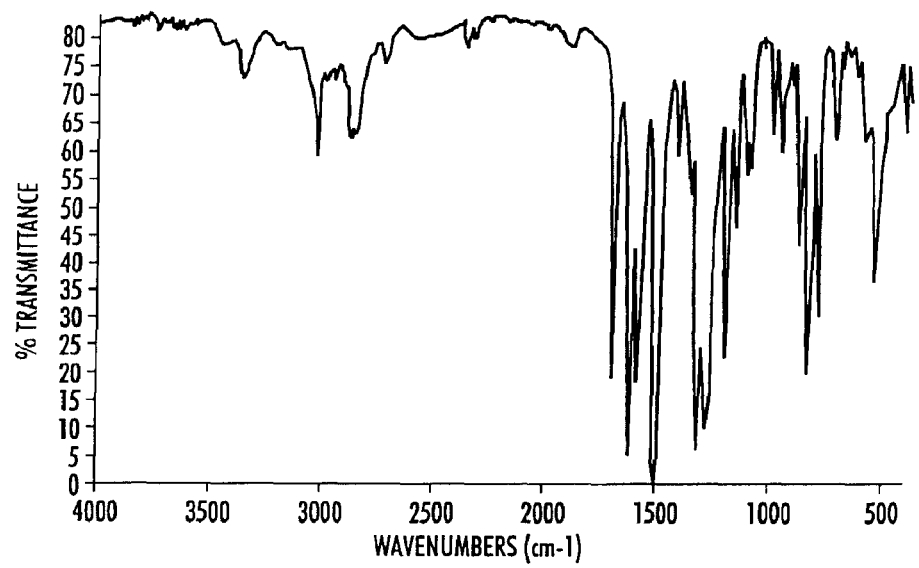
FIG. 10 is a graphic representation of a Fourier transform infrared spectrum of a free standing SOF comprising triphenylamine segments, benzene segments, and imine linkers.

Type 2 SOF (Action A) The following were combined: the building block terephthalaldehyde [segment=benzene; Fg=aldehyde (—CHO); (0.18 g, 1.3 mmol)] and a second building block tris(4-aminophenyl)amine [segment=triphenylamine; Fg=amine (—NH$_2$); (0.26 g, 0.89 mmol)], and 2.5 g of tetrahydrofuran. The mixture was shaken until a homogenous solution resulted. Upon cooling to room temperature, the solution was filtered through a 0.45 micron PTFE membrane. To the filtered solution was added an acid catalyst delivered as 0.045 g of a 10 wt % solution of p-toluenesulfonic acid in 1-tetrahydrofuran to yield the liquid containing reaction mixture. (Action B) The reaction mixture was applied to the reflective side of a metalized (TiZr) MYLAR™ substrate using a constant velocity draw down coater outfitted with a bird bar having an 5 mil gap. (Action C) The metalized MYLAR™ substrate supporting the wet layer was rapidly transferred to an actively vented oven preheated to 120° C. and left to heat for 40 min. These actions provided a SOF having a thickness of about 6 microns that could be delaminated from substrate as a single free-standing film. The color of the SOF was red-orange. The Fourier-transform infrared spectrum of this film is provided in FIG. 10.

Example 31

Figure 11:
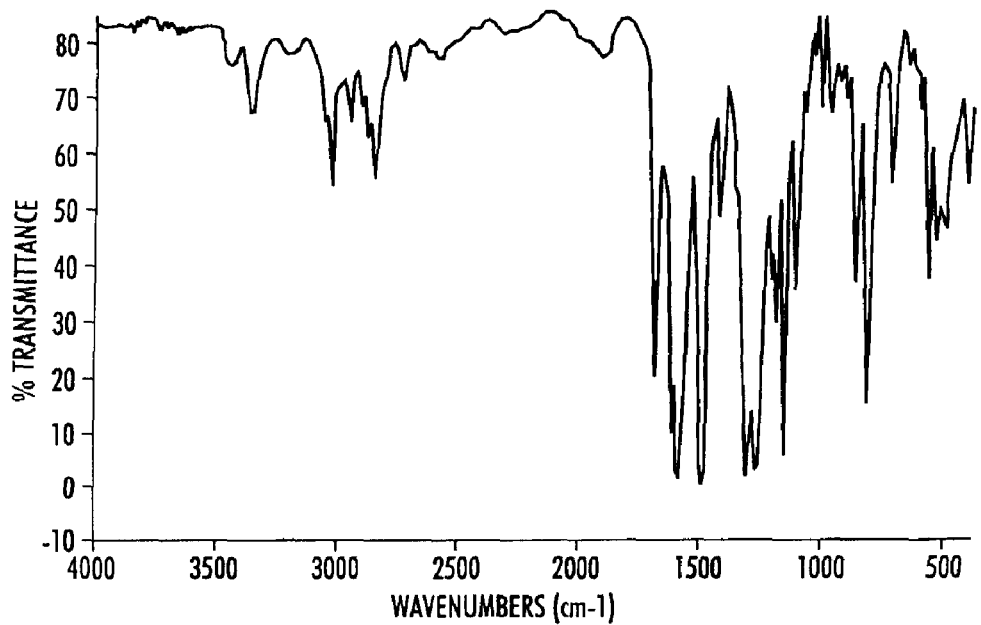
FIG. 11. is a graphic representation of a Fourier transform infrared spectrum of a free standing SOF comprising triphenylamine segments, and imine linkers.

Type 1 SOF (Action A) The following were combined: the building block 4,4',4"-nitrilotribenzaldehyde [segment=triphenylamine; Fg=aldehyde (—CHO); (0.16 g, 0.4 mmol)] and a second building block tris(4-aminophenyl) amine[segment=triphenylamine; Fg=amine (—NH$_2$); (0.14 g, 0.4 mmol)], and 1.9 g of tetrahydrofuran. The mixture was stirred until a homogenous solution resulted. Upon cooling to room temperature, the solution was filtered through a 0.45 micron PTFE membrane. (Action B) The reaction mixture was applied to the reflective side of a metalized (TiZr) MYLAR™ substrate using a constant velocity draw down coater outfitted with a bird bar having an 5 mil gap. (Action C) The metalized MYLAR™ substrate supporting the wet layer was rapidly transferred to an actively vented oven preheated to 120° C. and left to heat for 40 min. These actions provided a SOF having a thickness of about 6 microns that could be delaminated from substrate as a single free-standing film. The color of the SOF was red. The Fourier-transform infrared spectrum of this film is provided in FIG. 11.

Example 32

Type 2 SOF (Action A) The following were combined: the building block glyoxal [segment=single covalent bond; Fg=aldehyde (—CHO); (0.31 g, 5.8 mmol—added as 40 wt % solution in water i.e. 0.77 g aqueous glyoxal)] and a second building block tris(4-aminophenyl)amine [segment=triphenylamine; Fg=amine (—NH$_2$); (1.14 g, (3.9 mmol)], and 8.27 g of tetrahydrofuran. The mixture was shaken until a homogenous solution resulted. Upon cooling to room temperature, the solution was filtered through a 0.45 micron PTFE membrane. (Action B) The reaction mixture was applied to the reflective side of a metalized (TiZr) MYLAR™ substrate using a constant velocity draw down coater outfitted with a bird bar having a 10 mil gap. (Action C) The metalized MYLAR™ substrate supporting the wet layer was rapidly transferred to an actively vented oven preheated to 120° C. and left to heat for 40 min. These actions provided a SOF having a thickness ranging from about 6-12 microns that could be delaminated from substrate as a single free-standing film. The color of the SOF was red.

Example 33

Type 2 SOF (Action A) The following were combined: the building block terephthalaldehyde [segment=benzene; Fg=aldehyde (—CHO); (0.18 g, 1.3 mmol)] and a second building block tris(4-aminophenyl)amine [segment=triphenylamine; Fg=amine (—NH$_2$); (0.26 g, 0.89 mmol)], 2.5 g of tetrahydrofuran, and 0.4 g water. The mixture was shaken until a homogenous solution resulted. Upon cooling to room temperature, the solution was filtered through a 0.45 micron PTFE membrane. (Action B) The reaction mixture was applied to the reflective side of a metalized (TiZr) MYLAR™ substrate using a constant velocity draw down coater outfitted with a bird bar having a 5 mil gap. (Action C) The metalized MYLAR™ substrate supporting the wet layer was rapidly transferred to an actively vented oven preheated to 120° C. and left to heat for 40 min. These actions provided a SOF having a thickness ranging 6 microns that could be delaminated from substrate as a single free-standing film. The color of the SOF was red-orange.

Example 34

Type 1 SOF (Action A) The following were combined: the building block 4,4',4"-nitrilotribenzaldehyde [segment=triphenylamine; Fg=aldehyde (—CHO); (0.16 g, 0.4 mmol)] and a second building block tris(4-aminophenyl) amine [segment=triphenylamine; Fg=amine (—NH$_2$); (0.14 g, 0.4 mmol)], 1.9 g of tetrahydrofuran, and 0.4 g water. The mixture was stirred until a homogenous solution resulted.

Upon cooling to room temperature, the solution was filtered through a 0.45 micron PTFE membrane. (Action B) The reaction mixture was applied to the reflective side of a metalized (TiZr) MYLAR™ substrate using a constant velocity draw down coater outfitted with a bird bar having an 5 mil gap. (Action C) The metalized MYLAR™ substrate supporting the wet layer was rapidly transferred to an actively vented oven preheated to 120° C. and left to heat for 40 min. These actions provided a SOF having a thickness of about 6 microns that could be delaminated from substrate as a single freestanding film. The color of the SOF was red-orange.

Example 35

Type 2 SOF (Action A) Same as EXAMPLE 28. (Action B) The reaction mixture was dropped from a glass pipette onto a glass slide. (Action C) The glass slide was heated to 80° C. on a heating stage yielding a deep red SOF having a thickness of about 200 microns which could be delaminated from the glass slide.

Example 36

Figure 12:
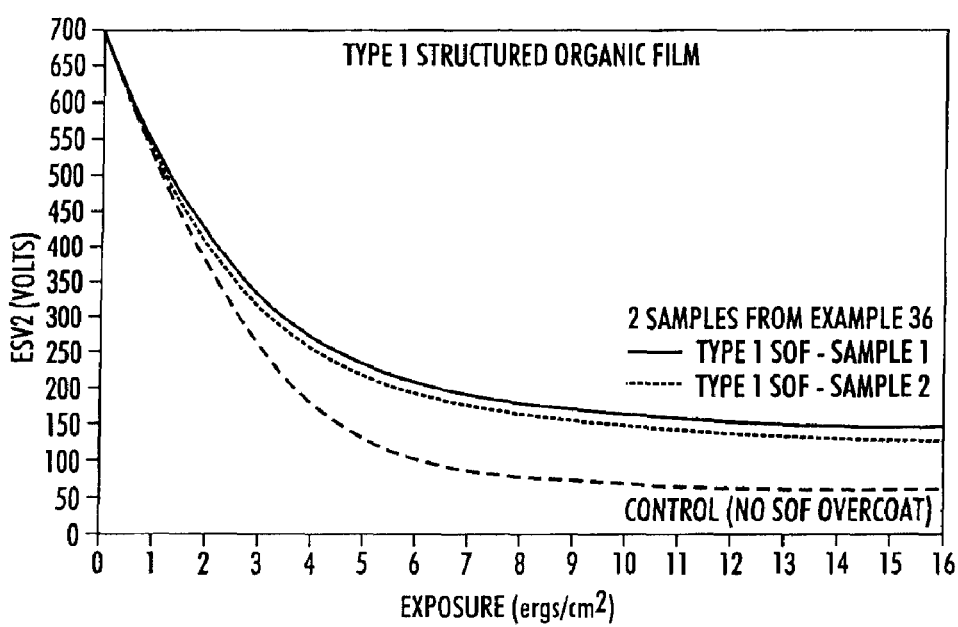
FIG. 12 is a graphic representation of a photo-induced discharge curve (PIDC) illustrating the photoconductivity of a Type 1 structured organic film overcoat layer.

Type 1 SOF (Action A) The following were combined: the building block tris-[(4-hydroxymethyl)-phenyl]-amine [segment=tri-(p-tolyl)-amine; Fg=hydroxy (—OH); 5.12 g]; the additives Cymel303 (55 mg) and Silclean 3700 (210 mg), and the catalyst Nacure XP-357 (267 mg) and 1-methoxy-2-propanol (13.27 g). The mixture was mixed on a rolling wave rotator for 10 min and then heated at 55° C. for 65 min until a homogenous solution resulted. The mixture was placed on the rotator and cooled to room temperature. The solution was filtered through a 1 micron PTFE membrane. (Action B) The reaction mixture was applied to a commercially available, 30 mm drum photoreceptor using a cup coater (Tsukiage coating) at a pull-rate of 240 mm/min. (Action C) The photoreceptor drum supporting the wet layer was rapidly transferred to an actively vented oven preheated to 140° C. and left to heat for 40 min. These actions provided a SOF having a thickness of about 6.9 microns. FIG. 12 is a photo-induced discharge curve (PIDC) illustrating the photoconductivity of this SOF overcoat layer (voltage at 75 ms (expose-to-measure)).

Example 37

Figure 13:
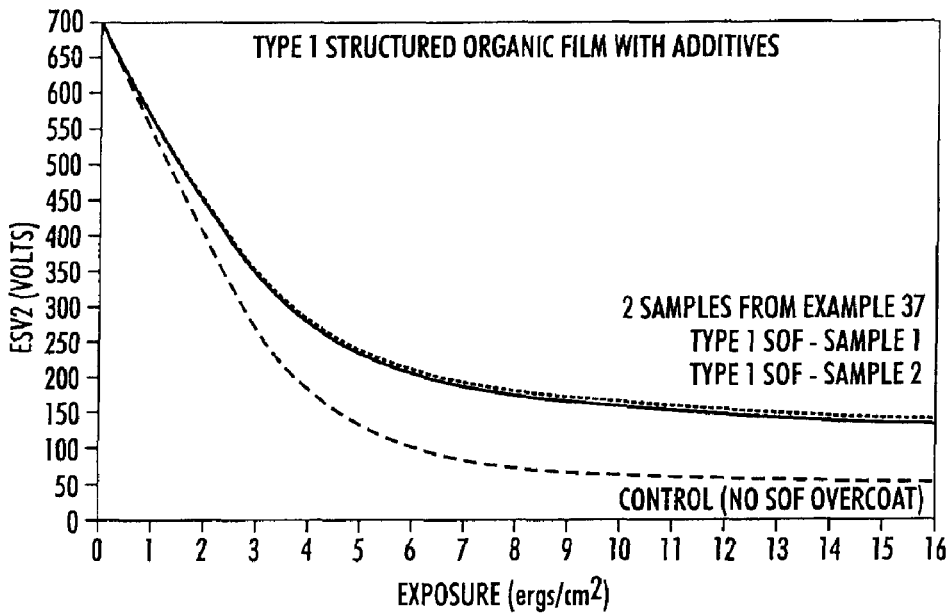
FIG. 13 is a graphic representation of a photo-induced discharge curve (PIDC) illustrating the photoconductivity of a Type 1 structured organic film overcoat layer containing wax additives.

Type 1 SOF with Additives (Action A) The following were combined: the building block tris-[(4-hydroxymethyl)-phenyl]-amine [segment=tri-(p-tolyl)-amine; Fg=hydroxy (—OH); 4.65 g]; the additives Cymel303 (49 mg) and Silclean 3700 (205 mg), and the catalyst Nacure XP-357 (254 mg) and 1-methoxy-2-propanol (12.25 g). The mixture was mixed on a rolling wave rotator for 10 min and then heated at 55° C. for 65 min until a homogenous solution resulted. The mixture was placed on the rotator and cooled to room temperature. The solution was filtered through a 1 micron PTFE membrane. A polyethylene wax dispersion (average particle size=5.5 microns, 40% solids in i-propyl alcohol, 613 mg) was added to the reaction mixture which was sonicated for 10 min and mixed on the rotator for 30 min. (Action B) The reaction mixture was applied to a commercially available, 30 mm drum photoreceptor using a cup coater (Tsukiage coating) at a pull-rate of 240 mm/min. (Action C) The photoreceptor drum supporting the wet layer was rapidly transferred to an actively vented oven preheated to 140° C. and left to heat for 40 min. These actions provided a film having a thickness of 6.9 microns with even incorporation of the wax particles in the SOF, FIG. 13 is a photo-induced discharge curve (PIDC) illustrating the photoconductivity of this SOF overcoat layer (voltage at 75 ms (expose-to-measure)).

Example 38

Figure 14:
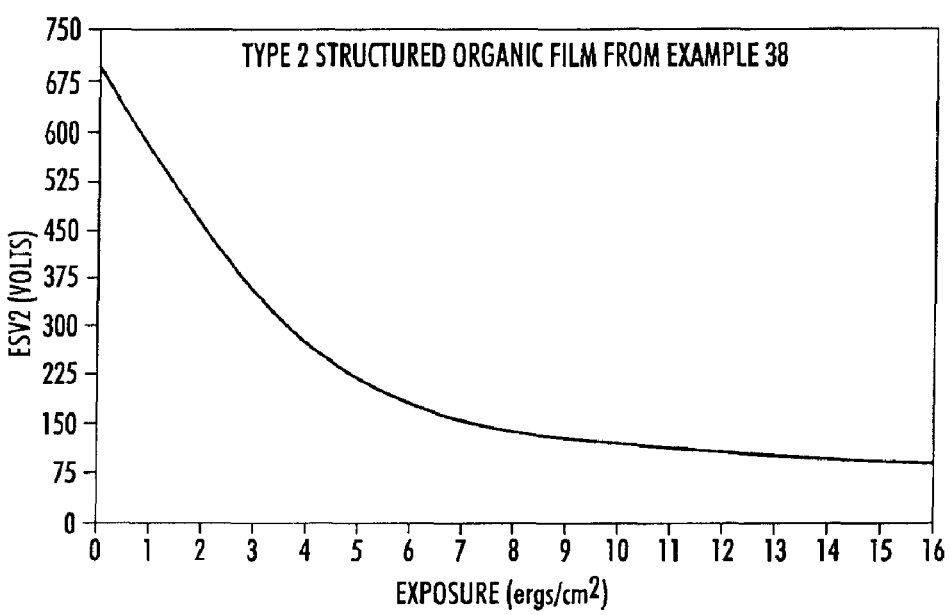
FIG. 14 is a graphic representation of a photo-induced discharge curve (PIDC) illustrating the photoconductivity of a Type 2 structured organic film overcoat layer.

Type 2 SOF (Action A) The following were combined: the building block N,N,N',N'-tetrakis-[(4-hydroxymethyl)phenyl]-biphenyl-4,4'-diamine [segment=N,N,N'N'-tetra-(p-tolyl)biphenyl-4,4'-diamine; Fg=hydroxy (—OH); 3.36 g] and the building block N,N'-diphenyl-N,N'-bis-(3-hydroxyphenyl)-biphenyl-4,4'-diamine [segment=N,N,N',N'-tetraphenyl-biphenyl-4,4'-diamine; Fg—hydroxyl (—OH); 5.56 g]; the additives Cymel303 (480 mg) and Silclean 3700 (383 mg), and the catalyst Nacure XP-357 (480 mg) and 1-methoxy-2-propanol (33.24 g). The mixture was mixed on a rolling wave rotator for 10 min and then heated at 55° C. for 65 min until a homogenous solution resulted. The mixture was placed on the rotator and cooled to room temperature. The solution was filtered through a 1 micron PTFE membrane. (Action B) The reaction mixture was applied to a commercially available, 30 mm drum photoreceptor using a cup coater (Tsukiage coating) at a pull-rate of 485 mm/min. (Action C) The photoreceptor drum supporting the wet layer was rapidly transferred to an actively vented oven preheated to 140° C. and left to heat for 40 min. These actions provided a film having a thickness ranging from 6.0 to 6.2 microns. FIG. 14 is a photo-induced discharge curve (PIDC) illustrating the photoconductivity of this SOF overcoat layer (voltage at 75 ms (expose-to-measure)).

Example 39

Type 2 SOF (Action A) The following can be combined: the building block dipropylcarbonate [segment=carbonyl [—C(=O)—]; Fg=propoxy ($CH_3CH_2CH_2O$—); 4.38 g, 30 mmol] and the building block 1,3,5-trihydroxycyclohexane [segment=cyclohexane; Fg—hydroxyl (—OH); 3.24 g, 20 mmol] and catalyst sodium methoxide (38 mg) and N-methyl-2-pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and heated for 40 min.

Example 40

Type 2 SOF (Action A) The following can be combined: the building block dipropylcarbonate [segment=carbonyl [—C(=O)—]; Fg=propoxy ($CH_3CH_2CH_2O$—); 4.38 g, 30 mmol] and the building block 1,3,5-trihydroxycyclohexane [segment=cyclohexane; Fg—hydroxyl (—OH); 3.24 g, 20 mmol]; phosphoric acid (2 M aq, 100 mg); and N-methyl-2- pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and left to heat for 40 min.

Example 41

Type 2 SOF (Action A) The following can be combined: the building block 1,1'-carbonyldiimidazole [segment=carbonyl [—C(=O)—]; Fg=imidazole; 4.86 g, 30 mmol] and the building block 1,3,5-trihydroxycyclohexane [segment cyclohexane; Fg—hydroxyl (—OH); 3.24 g, 20 mmol] and catalyst sodium methoxide (38 mg) and N-methyl-2-pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and left to heat for 40 min.

Example 42

Type 2 SOF (Action A) The following can be combined: the building block carbonyldiimidazole [segment=carbonyl [—C(=O)—]; Fg=imidazole; 4.86 g, 30 mmol] and the building block 1,3,5-trihydroxycyclohexane [segment=cyclohexane; Fg—hydroxyl (—OH); 3.24 g, 20 mmol]; phosphoric acid (2 M aq, 100 mg); and N-methyl-2-pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and left to heat for 40 min.

Example 43

Type 2 SOF (Action A) The following can be combined: the building block trimesic acid [segment=1,3,5-benzenetricarboxylate; Fg=H; 4.20 g, 20 mmol] and the building block 1,6-hexanediol [segment=hexane; Fg—hydroxyl (—OH); 3.55 g, 30 mmol]; phosphoric acid (2 M aq, 100 mg); and N-methyl-2-pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate, using a constant velocity draw down coater outfitted with a bird bar having a 5 mil gap. (Action C) The substrate supporting the wet layer is rapidly transferred to an actively vented oven preheated to 200° C. and left to heat for 40 min.

Example 44

Type 2 SOF (Action A) The following can be combined: the building block trimesic acid [segment=1,3,5-benzenetricarboxylate; Fg=H; 4.20 g, 20 mmol] and the building block 1,6-hexanediol [segment=hexane; Fg—hydroxyl (—OH); 3.55 g, 30 mmol]; N,N-dimethyl-4-aminopyridine (50 mg); and N-methyl-2-pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and left to heat for 40 min.

Example 45

Type 2 SOF (Action A) The following can be combined: the building block trimesic acid [segment=1,3,5-benzenetricarboxylate; Fg=H; 4.20 g, 20 mmol] and the building block hexamethylenediamine [segment=hexane; Fg—amine (—NH$_2$); 3.49 g, 30 mmol]; phosphoric acid (2 M aq, 100 mg); and N-methyl-2-pyrrolidinone (25.5 g). The mixture is mixed on a rolling wave rotator for 10 min and filtered through a 1 micron PTFE membrane. (Action B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and left to heat for 40 min.

Example 46

Type 2 SOF (Action A) The following can be combined: the building block trimesic acid [segment=1,3,5-benzenetricarboxylate; Fg=H; 4.20 g, 20 mmol] and the building block hexamethylenediamine [segment=hexane; Fg—amine (—NH$_2$); 3.49 g, 30 mmol]; N,N-dimethyl-4-aminopyridine (50 mg); and N-methyl-2-pyrrolidinone (25.5 g). The mixture is mixed on a rolling wave rotator for 10 min and filtered through a 1 micron PTFE membrane. (Action. B) The reaction mixture is applied to the reflective side of a metalized (TiZr) MYLAR™ substrate using a constant velocity draw down coater outfitted with a bird bar having a 5 mil gap. (Action C) The substrate supporting the wet layer is rapidly transferred to an actively vented oven preheated to 200° C. and left to heat for 40 min.

Example 47

Type 2 SOF (Action A) Preparation of liquid containing reaction mixture. The following can be combined: the building block 1,4-diisocyanatobenzene [segment=phenyl; Fg=isocyanate (—N=C=O); (0.5 g, 3.1 mmol)] and a second building block 4,4',4"-nitrilotris(benzene-4,1-diyl)trimethanol [segment=(4,4',4"-nitrilotris(benzene-4,1-diyl)trimethyl); (0.69, 2.1 mmol)] 10.1 g of dimethylformamide, and 1.0 g of triethylamine. The mixture is stirred until a homogenous solution is obtained. Upon cooling to room temperature, the solution is filtered through a 0.45 micron PTFE membrane. (Action B) The reaction mixture is to be applied to the reflective side of a metalized (TiZr) MYLAR™ substrate using a constant velocity draw down coater outfitted with a bird bar having a 8 mil gap. (Action C) The metalized MYLAR™ substrate supporting the wet layer is rapidly transferred to an actively vented oven preheated to 130° C. and left to heat for 120 min.

Example 48

Type 2 SOF (Action A) Preparation of liquid containing reaction mixture. The following can be combined: the building block 1,4-diisocyanatohexane [segment=hexyl; Fg=isocyanate (—N═C═O); (0.38 g, 3.6 mmol)] and a second building block triethanolamine [segment=triethylamine; (0.81, 5.6 mmol)] 10.1 g of dimethylformamide, and 1.0 g of triethylamine. The mixture is stirred until a homogenous solution is obtained. Upon cooling to room temperature, the solution is filtered through a 0.45 micron PTFE membrane. (Action B) The reaction mixture is to be applied to the reflective side of a metalized (TiZr) MYLAR™ substrate using a constant velocity draw down coater outfitted with a bird bar having a 8 mil gap. (Action C) The metalized MYLAR™ substrate supporting the wet layer is rapidly transferred to an actively vented oven preheated to 130° C. and left to heat for 120 min.

Example 49

Type 2 SOF (Action A) The following were combined: the building block N,N,N',N'-tetrakis-[(4-hydroxymethyl)phenyl]-biphenyl-4,4'-diamine [segment=N,N,N',N'-tetra-(p-tolyl)biphenyl-4,4'-diamine; Fg=hydroxy (—OH); 4.24 g] and the building block N,N'-diphenyl-N,N'-bis-(3-hydroxyphenyl)-terphenyl-4,4'-diamine [segment=N,N,N',N'-tetraphenyl-terphenyl-4,4'-diamine; Fg—hydroxyl (—OH); 5.62 g]; the additives Cymel303 (530 mg) and Silclean 3700 (420 mg), and the catalyst Nacure XP-357 (530 mg) and 1-methoxy-2-propanol (41.62 g). The mixture was mixed on a rolling wave rotator for 10 min and then heated at 55° C. for 65 min until a homogenous solution resulted. The mixture was placed on the rotator and cooled to room temperature. The solution was filtered through a 1 micron PTFE membrane. (Action B) The reaction mixture was applied to a commercially available, 30 mm drum photoreceptor using a cup coater (Tsukiage coating) at a pull-rate of 485 mm/min. (Action C) The photoreceptor drum supporting the wet layer was rapidly transferred to an actively vented oven preheated to 140° C. and left to heat for 40 min. These actions provided a SOF having a thickness of 6.2 microns.

Example 49

Type 2 SOF Attempt (Action A) Attempted preparation of the liquid containing reaction mixture. The following were combined: the building block tris-[(4-hydroxymethyl)-phenyl]-amine [segment=tri-(p-tolyl)-amine; Fg=hydroxy (—OH); 5.12 g]; the additives Cymel303 (55 mg), Silclean 3700 (210 mg), and 1-methoxy-2-propanol (13.27 g). The mixture was heated to 55° C. for 65 min in an attempt to fully dissolve the molecular building block. However it did not fully dissolve. A catalyst Nacure XP-357 (267 mg) was added and the heterogeneous mixture was further mixed on a rolling wave rotator for 10 min. In this Example, the catalyst was added after the heating step. The solution was not filtered prior to coating due to the amount of undissolved molecular building block. (Action B) Deposition of reaction mixture as a wet film. The reaction mixture was applied to a commercially available, 30 mm drum photoreceptor using a cup coater (Tsukiage coating) at a pull-rate of 240 mm/min. (Action C) Promotion of the change of the wet film to a dry film. The photoreceptor drum supporting the wet layer was rapidly transferred to an actively vented oven preheated to 140° C. and left to heat for 40 min. These actions did not provide a uniform film. There were some regions where a non-uniform film formed that contained particles and other regions where no film was formed at all.

Example 50

Type 2 SOF (Action A) The following were combined: the building block tris-[(4-hydroxymethyl)-phenyl]-amine [segment=tri-(p-tolyl)-amine; Fg=hydroxy (—OH); 5.12 g]; the additives Cymel303 (55 mg) and Silclean 3700 (210 mg), and the catalyst Nacure XP-357 (267 mg) and 1-methoxy-2-propanol (13.27 g). The mixture was mixed on a rolling wave rotator for 10 min and then heated at 55° C. for 65 min until a homogenous solution resulted. The mixture was placed on the rotator and cooled to room temperature. The solution was filtered through a 1 micron PTFE membrane. It was noted that the viscosity of the reaction mixture increased after the heating step (although the viscosity of the solution before and after heating was not measured). (Action B) The reaction mixture was applied to a commercially available, 30 mm drum photoreceptor using a cup coater (Tsukiage coating) at a pull-rate of 240 mm/min. (Action C) The photoreceptor drum supporting the wet layer was rapidly transferred to an actively vented oven preheated to 140° C. and left to heat for 40 min. These actions provided a SOF having a thickness of 6.9 microns.

Example 51

Type 2 SOF (Action A) The following were combined: the building block N,N,N',N'-tetrakis-[(4-hydroxymethyl)phenyl]-biphenyl-4,4'-diamine [segment=N,N,N',N'-tetra-(p-tolyl)biphenyl-4,4'-diamine; Fg=hydroxy (—OH); 1.84 g] and the building block 3,3'-(4,4'-(biphenyl-4-ylazanediyl)bis(4,1-phenylene))dipropan-1-ol [segment=3,3'-(4,4'-(biphenyl-4-ylazanediyl)bis(4,1-phenylene))dipropyl; Fg=hydroxy (—OH); (2.41 g] and a catalyst p-toluenesulphonic acid (10 wt % solution in dowanol, 460 mg) and 1-methoxy-2-propanol (16.9 g—containing 50 ppm DC510). The mixture was mixed on a rolling wave rotator for 5 min and then heated at 70° C. for 30 min until a homogenous solution resulted. The mixture was placed on the rotator and cooled to room temperature. The solution was filtered through a 1 micron PTFE membrane. (Action B) The reaction mixture was applied to a production-coated web photoreceptor with a Hirano web coater. Syringe pump speed: 4.5 mL/min. (Action C) The photoreceptor supporting the wet layer was fed at a rate of 1.5 m/min into an actively vented oven preheated to 130° C. for 2 min. These actions provided a SOF overcoat layer having a thickness of 2.1 microns on a photoreceptor.

Example 52

Type 2 SOF (Action A) The following were combined: the building block N,N,N',N'-tetrakis-[(4-hydroxymethyl)phenyl]-biphenyl-4,4'-diamine [segment=N,N,N',N'-tetra-(p-tolyl)biphenyl-4,4'-diamine; Fg=hydroxy (—OH); 5.0 g] and the building block benzenedimethanol [segment=p-xylyl; Fg—hydroxyl (—OH); 2.32 g] and a catalyst p-toluenesulphonic acid (10 wt % solution in dowanol, 720 mg) and 1-methoxy-2-propanol (22.5 g—containing 50 ppm DC510). The mixture was mixed on a rolling wave rotator for 5 min and then heated at 40° C. for 5 min until a homogenous solution resulted. The mixture was placed on the rotator and cooled to room temperature. The solution was filtered through a 1 micron PTFE membrane. (Action B) The reaction mixture was applied to a production-coated, production web photoreceptor a Hirano web coater. Syringe pump speed: 5 mL/min. (Action C) The photoreceptor supporting the wet layer was fed at a rate of 1.5 m/min into an actively vented oven preheated to 130° C. for 2 min. These actions provided a SOF overcoat layer having a thickness of 2.2 microns on a photoreceptor.

Example 53

Type 2 SOF (Action A) The following were combined: the building block N,N,N',N'-tetrakis-[(4-hydroxymethyl)phenyl]-biphenyl-4,4'-diamine [segment=N,N,N',N'-tetra-(p-tolyl)biphenyl-4,4'-diamine; Fg=hydroxy (—OH); 5.0 g] and the building block benzenedimethanol [segment=p-xylyl; Fg—hydroxyl (—OH); 2.32 g] and a catalyst p-toluenesulphonic acid (10 wt % solution in dowanol, 720 mg) and 1-methoxy-2-propanol (22.5 g—containing 50 ppm DC510). The mixture was mixed on a rolling wave rotator for 5 min and then heated at 40° C. for 5 min until a homogenous solution resulted. The mixture was placed on the rotator and cooled to room temperature. The solution was filtered through a 1 micron PTFE membrane. (Action B) The reaction mixture was applied to a production-coated, production web photoreceptor with a Hirano web coater. Syringe pump speed: 10 mL/min. (Action C) The photoreceptor supporting the wet layer was fed at a rate of 1.5 m/min into an actively vented oven preheated to 130° C. for 2 min. These actions provided a SOF overcoat layer having a thickness of 4.3 microns on a photoreceptor.

Example 54

(Action A) The following were combined: the building 4,4',4"-nitrilotris(benzene-4,1-diyl)trimethanol [segment=(4,4',4"-nitrilotris(benzene-4,1-diyl)trimethyl); Fg—alcohol (—OH); (1.48 g, 4.4 mmol)], 0.5 g water and 7.8 g of 1,4-dioxane. The mixture was shaken and heated to 60° C. until a homogenous solution resulted. Upon cooling to room temperature, the solution was filtered through a 0.45 micron PTFE membrane. To the filtered solution was added an acid catalyst delivered as 0.15 g of a 10 wt % solution of p-toluenesulfonic acid in 1,4-dioxane to yield the liquid containing reaction mixture. (Action B) The reaction mixture was applied to the reflective side of a metalized (TiZr) MYLAR™ substrate using a constant velocity draw down coater outfitted with a bird bar having a 15 mil gap. (Action C) The metalized MYLAR™ substrate supporting the wet layer was rapidly transferred to an actively vented oven preheated to 130° C. and left to heat for 40 min. These actions provided SOF having a thickness ranging from about 4-10 microns that could be delaminated from substrate as a single free-standing film. The color of the SOF was green. Two-dimensional X-ray scattering data is provided in FIG. 15. As seen in FIG. 15, 2θ is about 17.8 and d is about 4.97 angstroms, indicating that the SOF possesses molecular order having a periodicity of about 0.5 nm.

Example 55

Type 2 SOF (Action A) The following can be combined: the building block 4-hydroxybenzyl alcohol [segment=toluene; Fg=hydroxyl (—OH); (0.0272 g, 0.22 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH3); (0.0728 g, 0.11 mmol)], and 0.88 g of 1-methoxy-2-propanol and 0.01 g of a 10 wt % solution of silclean in 1-methoxy-2-propanol. The mixture is shaken and heated to 55° C. until a homogenous solution is obtained. Upon cooling to rt, the solution is filtered through a 0.45 micron PTFE membrane. To the filtered solution is added an acid catalyst delivered as 0.01 g of a 10 wt % solution of p-toluenesulfonic acid in 1-methoxy-2-propanol to yield the liquid containing reaction mixture. (Action B) The reaction mixture was applied to the aluminum substrate using a constant velocity draw down coater outfitted with a bird bar having a 5 mil gap. (Action C) The aluminum substrate supporting the wet layer is rapidly transferred to an actively vented oven preheated to 140° C. and left to heat for 40 min.

Example 56

Type 2 SOF (Action A) The following can be combined: the building block 4-(hydroxymethyl)benzoic acid [segment=4-methylbenzaldehyde; Fg=hydroxyl (—OH); (0.0314 g, 0.206 mmol)] and a second building block N4,N4,N4',N4'-tetrakis(4-(methoxymethyl)phenyl)biphenyl-4,4'-diamine [segment=N4,N4,N4',N4'-tetra-p-tolylbiphenyl-4,4'-diamine; Fg=methoxy ether (—OCH3); (0.0686 g, 0.103 mmol)], and 0.88 g of 1-methoxy-2-propanol and 0.01 g of a 10 wt % solution of silclean in 1-methoxy-2-propanol. The mixture is shaken and heated to 55° C. until a homogenous solution is obtained. Upon cooling to rt, the solution is filtered through a 0.45 micron PTFE membrane. To the filtered solution is added an acid catalyst delivered as 0.01 g of a 10 wt % solution of p-toluenesulfonic acid in 1-methoxy-2-propanol to yield the liquid containing reaction mixture. (Action B) The reaction mixture was applied to the aluminum substrate using a constant velocity draw down coater outfitted with a bird bar having a 5 mil gap. (Action C) The aluminum substrate supporting the wet layer is rapidly transferred to an actively vented oven preheated to 140° C. and left to heat for 40 min.

Example 57

Type 2 SOF (Action A) The following were combined: the building block 1,4 diaminobenzene [segment=benzene; Fg=amine (—NH$_2$); (0.14 g, 1.3 mmol)] and a second building block 1,3,5-triformylbenzene [segment=benzene; Fg=aldehyde (—CHO); (0.144 g, 0.89 mmol)], and 2.8 g of NMP. The mixture was shaken until a homogenous solution resulted. Upon cooling to room temperature, the solution was filtered through a 0.45 micron PTFE membrane. To the filtered solution was added an acid catalyst delivered as 0.02 g of a 2.5 wt % solution of p-toluenesulfonic acid in NMP to yield the liquid containing reaction mixture, (Action B) The reaction mixture was applied quartz plate affixed to the rotating unit of a variable velocity spin coater rotating at 1000 RPM for 30 seconds. (Action C) The quartz plate supporting the wet layer was rapidly transferred to an actively vented oven preheated to 180° C. and left to heat for 120 min. These actions provide a yellow film having a thickness of 400 nm that can be delaminated from substrate upon immersion in water.

Example 58

Composite SOFs

Composite SOFs were prepared involving the process and building blocks described in Example 1. In these cases the solvent used was dioxane. All SOFs were prepared on metalized mylar substrates, by depositing a wet layer with a 20 mil bird bar and promoting a change of the wet layer at 130° C. for 40 minutes at total 30% solids loading in the reaction mixture with 10% of the solid loading being from the secondary component. Secondary components were introduced by including them in the reaction mixture before promoting the change of the wet layer to form the SOF. Six different composite SOFs were produced, each containing a different secondary component: composite SOF 1 including a hole transport molecule (N4,N4'-diphenyl-N4,N4'-di-m-tolyl-[1,1'-biphenyl]-4,4'-diamine), composite SOF 2 including a polymer (polystyrene), composite SOF 3 including nanoparticles (C60 Buckminster fullerene), composite SOF 4 including small organic molecules (biphenyl), composite SOF 5 including metal particles (copper micropowder), and composite SOF 6 including electron acceptors (quinone). Some secondary components were soluble in the reaction mixture; some were dispersed (not soluble) in the reaction mixture. The six composite SOFs produced were substantially defect free SOFs that included the composite materials incorporated into the SOF. In some cases (e.g. copper micropowder composite SOF) the dispersion of the secondary component (dopant) was visually evident. The thicknesses of these SOFs ranged from 15-25 microns.

Example 59

Photochromic SOFs (Action A) Preparation of the liquid containing reaction mixture: The following were combined: the SOF building block tris-(4-hydroxymethyl)triphenylamine [segment=triphenylamine; Fg=hydroxy (—OH); 0.200 g]; the photochromic molecules 1-5 (see below) (0.02 g), and the catalyst p-toluene sulfonic acid (0.01 g); and, 1-methoxy-2-propanol (0.760 g). The mixture was mixed on a rolling wave rotator for 10 min and then heated at 55° C. for 5 min until a homogenous solution resulted. The solution was filtered through a 1 micron PTFE membrane. (Action B) Deposition of reaction mixture as a wet film: The reaction mixture was applied to a 3 mil Mylar substrate using a constant velocity drawdown coater outfitted with a 5 mil gap bird bar. (Action C) Promotion of the change of the wet film to a dry SOF: The Mylar sheet supporting the wet layer was rapidly transferred to an actively vented oven preheated to 120° C. and left to heat for 5 min. These actions provided a film having a thickness of 3-5 microns. The following photochromic molecules were incorporated in SOFs:

(1) Spiropyran 1-OH (functional SOF capping building block)

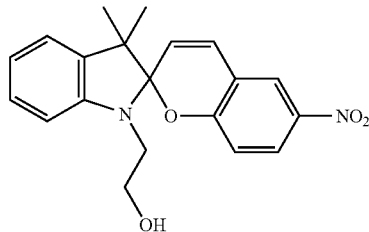 [SMILES: CC1(C)c2ccccc2N(CCO)C12C=Cc1cc([N+](=O)[O-])ccc1O2]

(2) Bisspiropyran 2-OH (functional SOF building block)

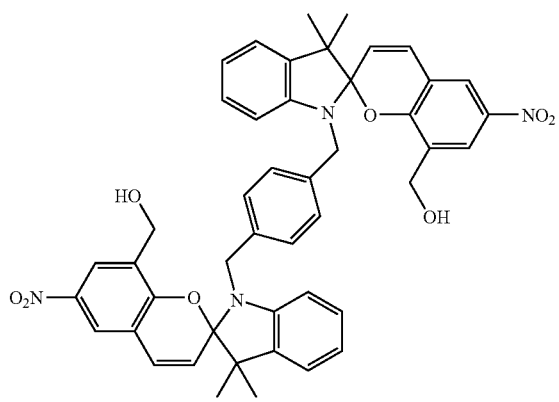 [SMILES: CC1(C)c2ccccc2N(Cc2ccc(CN3c4ccccc4C(C)(C)C34C=Cc3cc([N+](=O)[O-])cc(CO)c3O4)cc2)C12C=Cc1cc([N+](=O)[O-])cc(CO)c1O2]

(3) Spirooxazine (composite SOF)
(4) DTE (composite SOF)

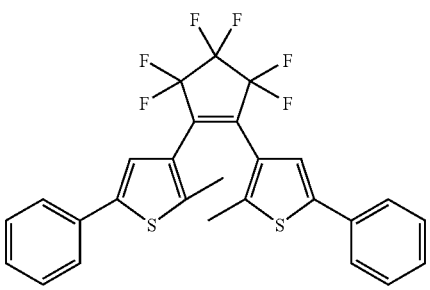 [SMILES: Cc1sc(-c2ccccc2)cc1C1=C(c2cc(-c3ccccc3)sc2C)C(F)(F)C(F)(F)C1(F)F]

(5) DTE 2-OH (functional SOF building block)

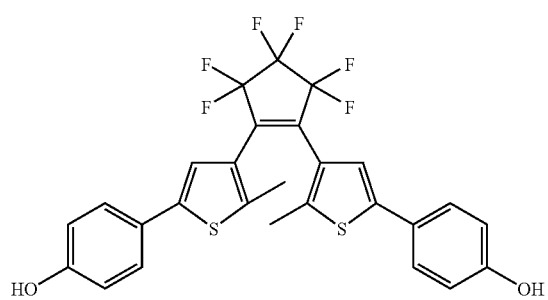 [SMILES: Cc1sc(-c2ccc(O)cc2)cc1C1=C(c2cc(-c3ccc(O)cc3)sc2C)C(F)(F)C(F)(F)C1(F)F]

All formulations formed substantially defect free films, however photochromic molecules (4) and (5) performed the best.

| Photochromic Molecule | Color as synthesized | Color After Write at 365 nm for 6 s. | Erase? |
|---|---|---|---|
| SOF only | Light yellow | n/a | n/a |
| (4) DTE (composite SOF) | Light yellow | Dark purple | YES |
| (5) DTE 2-OH (functional SOF building block) | Light green | Dark purple | YES |

UV-Visible spectra of photochromic SOF with molecules (4) and (5) clearly demonstrate the coloration (presence of broad absorbance centered ~600 nm after UVA write) and erasable capability (loss of ~600 nm absorbance following visible light erase) of the photochromic SOF films. The photochromic responses were comparable to polymer matrix systems in terms of writing/erasing speed and contrast of image. This indicates the SOF film does not affect the performance of these DTE type photochromic materials.

To test chemical/environmental/mechanical stability, the photochromic SOFs were placed in acetone for 15 minutes. Experimental observations are detailed in the table below. The photochromic SOF with molecule (5) fully preserves film integrity and photochromic behavior. The photochromic SOF with molecule (4) leaches out the photochromic component and as a result loses photochromic activity.

| Sample | Optical Density Before Acetone Stress Test | Optical Density After Acetone Stress Test | Performance After Acetone Stress Test |
|---|---|---|---|
| (4) DTE (composite SOF) | 0.69 | 0.14 | SOF largely maintains integrity (some swelling and softening was observed) Photochromic molecule leaches into acetone SOF is no longer writable |
| (5) DTE 2-OH (functional SOF building block) | 0.83 | 0.91 | SOF maintains integrity No observed leaching of photochromic molecule SOF has excellent writing properties |

The photochromic SOF with molecule (5) was placed in acetone and sonicated for 5 minutes. This is an extreme test that polymer-based photochromic systems would not survive. After removal from solvent, the photochromic SOF with molecule (5) essentially maintains the SOF integrity and writes at about the same level when exposed to UV LED device, i.e. photochromic activity is preserved. The photochromic SOF derived from the photochromic molecule (5), which chemically bonds to the SOF structure, does not leach from the SOF and can withstand harsh chemical (acetone solvent) and mechanical (ultrasonication) stresses.

It will be appreciated that several of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A process for preparing a structured organic film (SOF) comprising:
    (a) preparing a liquid-containing reaction mixture comprising:
        a plurality of molecular building blocks each comprising a segment and a number of functional groups;
    (b) forming a pre-SOF in the reaction mixture;
    (c) depositing the reaction mixture and the pre-SOF as a wet film; and
    (d) promoting change of the wet film to form a dry SOF.

2. The process of claim 1, wherein the reaction mixture further comprises a catalyst.

3. The process of claim 2, wherein the catalyst is selected from the group consisting of Brönsted acids, Lewis acids, Brönsted bases, Lewis bases, free radical initiators, and transition metal complexes.

4. The process of claim 2, wherein the weight of the catalyst divided by the total weight of the molecular building blocks is from about 0.0001 to about 0.25.

5. The process of claim 1, wherein forming the pre-SOF comprises heating the reaction mixture in the presence of a catalyst.

6. The process of claim 2, wherein the catalyst is not present in the dry SOF.

7. The process of claim 2, wherein the catalyst is present in the dry SOF.

8. The process of claim 1, wherein forming the pre-SOF comprises heating the reaction mixture at a temperature that is lower than the boiling point of the reaction mixture.

9. The process of claim 1, wherein forming the pre-SOF comprises exposing the reaction mixture to UV irradiation.

10. The process of claim 1, wherein the duration of pre-SOF formation lasts about 10 seconds to about 48 hours.

11. The process of claim 1, wherein the dry SOF is a substantially defect-free film.

12. The process of claim 1, wherein the dry SOF comprises a plurality of segments including at least a first segment type, a plurality of linkers including at least a first linker type arranged as a covalent organic framework (COF), wherein the first segment type and/or the first linker type comprises at least one atom that is not carbon.

13. A process for preparing a composite structured organic film (SOF) comprising:
    (a) preparing a liquid-containing reaction mixture comprising:

a secondary component, and
a plurality of molecular building blocks each comprising a segment and a number of functional groups;
(b) forming a pre-SOF in the reaction mixture;
(c) depositing the reaction mixture and the pre-SOF as a wet film; and
(d) promoting change of the wet film to form a dry SOF that incorporates the secondary component.

14. The process of claim 13, wherein forming the pre-SOF comprises heating the reaction mixture in the presence of a catalyst.

15. The process of claim 13, wherein the dry SOF is a substantially defect-free film.

16. The process of claim 13, wherein the dry SOF comprises a plurality of segments including at least a first segment type, a plurality of linkers including at least a first linker type arranged as a covalent organic framework (COF), wherein the first segment type and/or the first linker type comprises at least one atom that is not carbon.

17. A process for preparing a structured organic film (SOF) comprising:
(a) preparing a liquid-containing reaction mixture comprising:
a first solvent,
a second solvent, and
a plurality of molecular building blocks each comprising a segment and functional groups;
(b) forming a pre-SOF in the reaction mixture;
(c) depositing the reaction mixture and the pre-SOF as a wet film; and
(d) promoting a change of the wet film and forming a dry SOF.

18. The process of claim 17, wherein forming the pre-SOF comprises heating the reaction mixture in the presence of a catalyst.

19. The process of claim 17, wherein the dry SOF is a substantially defect-free film.

20. The process of claim 17, wherein the dry SOF comprises a plurality of segments including at least a first segment type, a plurality of linkers including at least a first linker type arranged as a covalent organic framework (COF), wherein the first segment type and/or the first linker type comprises at least one atom that is not carbon.

21. A process for preparing a structured organic film including an added functionality comprising:
(a) preparing a liquid-containing reaction mixture comprising:
a plurality of molecular building blocks each comprising a segment and functional groups, wherein the molecular building blocks are selected to provide the added functionality in the SOF;
(b) forming a pre-SOF in the reaction mixture;
(c) depositing the reaction mixture and the pre-SOF as a wet film on a substrate; and
(d) promoting a change of the wet film and forming a dry SOF possessing an added functionality.

22. The process of claim 21, wherein forming the pre-SOF comprises heating the reaction mixture in the presence of a catalyst.

23. The process of claim 21, wherein the dry SOF is a substantially defect-free film.

24. The process of claim 21, wherein the dry SOF comprises a plurality of segments including at least a first segment type, a plurality of linkers including at least a first linker type arranged as a covalent organic framework (COF), wherein the first segment type and/or the first linker type comprises at least one atom that is not carbon.

* * * * *